(12) United States Patent
Kim et al.

(10) Patent No.: US 12,733,343 B2
(45) Date of Patent: Sep. 8, 2026

(54) LIGHT EMITTING DISPLAY DEVICE

(71) Applicant: Samsung Display Co., LTD., Yongin-si (KR)

(72) Inventors: Hyeong Seok Kim, Yongin-si (KR); Min Jae Jeong, Yongin-si (KR); Jun Hyun Park, Yongin-si (KR); Heejean Park, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 529 days.

(21) Appl. No.: 18/322,765

(22) Filed: May 24, 2023

(65) Prior Publication Data

US 2024/0065031 A1 Feb. 22, 2024

(30) Foreign Application Priority Data

Aug. 16, 2022 (KR) ........................ 10-2022-0102065
Sep. 16, 2022 (KR) ........................ 10-2022-0117450

(51) Int. Cl.
*H10K 59/121* (2023.01)
*G09G 3/3233* (2016.01)
(Continued)

(52) U.S. Cl.
CPC ....... *H10K 59/1213* (2023.02); *G09G 3/3233* (2013.01); *H10K 59/1201* (2023.02);
(Continued)

(58) Field of Classification Search
CPC ........... H10K 59/1213; H10K 59/1201; H10K 59/1216; H10K 59/126; H10K 59/131;
(Continued)

(56) References Cited

U.S. PATENT DOCUMENTS

2014/0158995 A1 6/2014 Park et al.
2017/0053973 A1* 2/2017 Park .................... H10K 59/873
(Continued)

FOREIGN PATENT DOCUMENTS

CN 212365460 1/2021
KR 10-0218526 B1 9/1999
(Continued)

OTHER PUBLICATIONS

Korean Office Action dated Feb. 6, 2026 for corresponding Korean Application No. 10-2022-0102065.

*Primary Examiner* — Chad M Dicke
*Assistant Examiner* — Gary Abel
(74) *Attorney, Agent, or Firm* — Harness, Dickey & Pierce, P.L.C.

(57) ABSTRACT

A light emitting display device that includes thin film transistors. Material for electrodes of the thin film transistors are chosen to allow for dehydrogenation of the underlying semiconductor pattern while allowing for high frequency driving without delay. Molybdenum is chosen to allow for dehydrogenation, and titanium on aluminum two-layered structure is chosen for low resistance and high-speed driving. The display includes a driving transistor and a switching transistor with a polycrystalline semiconductor layer and a transistor with an oxide semiconductor layer.

8 Claims, 25 Drawing Sheets

(51) Int. Cl.

| | |
|---|---|
| ***H10K 59/12*** | (2023.01) |
| ***H10K 59/126*** | (2023.01) |
| ***H10K 59/131*** | (2023.01) |
| ***H10K 59/40*** | (2023.01) |
| ***H10K 59/80*** | (2023.01) |

(52) U.S. Cl.

CPC ....... *H10K 59/1216* (2023.02); *H10K 59/126* (2023.02); *H10K 59/131* (2023.02); *H10K 59/40* (2023.02); *H10K 59/873* (2023.02); *G09G 2300/0819* (2013.01); *G09G 2300/0852* (2013.01)

(58) Field of Classification Search

CPC ...... H10K 59/40; H10K 59/873; H10K 59/12; H10K 59/1315; H10K 50/844; H10K 59/00; H10K 59/70; H10K 59/80–88; G09G 3/3233; G09G 2300/0819; G09G 2300/0852; G09G 2310/0251; G09G 2320/0219; H10D 30/0312; H10D 30/0314; H10D 30/6729; H10D 30/673; H10D 30/6731; H10D 30/6737; H10D 30/6739; H10D 86/021–0251; H10D 86/40–60

See application file for complete search history.

(56) References Cited

U.S. PATENT DOCUMENTS

| | | | | |
|---|---|---|---|---|
| 2018/0033847 | A1* | 2/2018 | Kim .................. | H10D 86/0231 |
| 2021/0104558 | A1 | 4/2021 | Kim et al. | |
| 2021/0151542 | A1* | 5/2021 | Choe .................... | G09G 3/3266 |
| 2023/0178655 | A1* | 6/2023 | Tanaka ............... | H10D 30/6755 257/43 |

FOREIGN PATENT DOCUMENTS

| | | | |
|---|---|---|---|
| KR | 10-0560780 | | 3/2006 |
| KR | 2014-0076295 | A | 6/2014 |
| KR | 10-2019-0098315 | | 8/2019 |
| KR | 10-2020-0093100 | | 8/2020 |
| KR | 10-2021-0004794 | | 1/2021 |
| KR | 2021-0016003 | A | 2/2021 |
| KR | 2021-0041150 | A | 4/2021 |

* cited by examiner

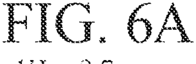
FIG. 6A
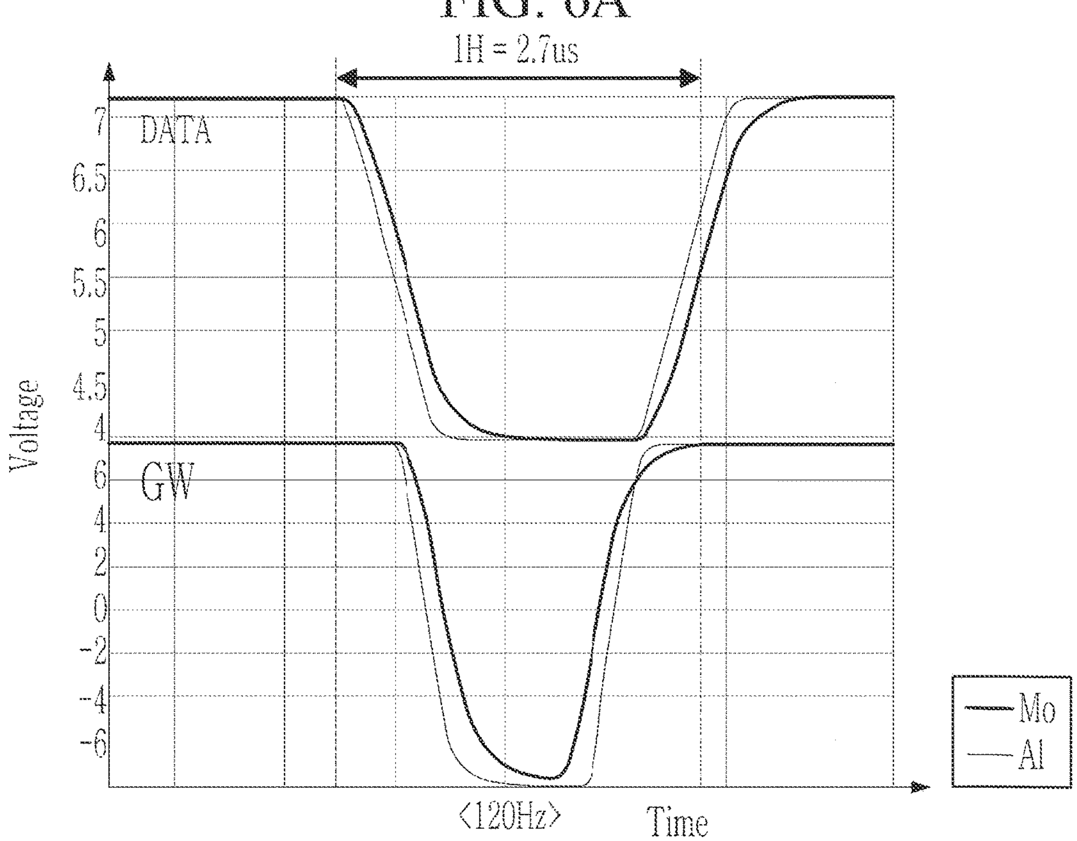
FIG. 6B
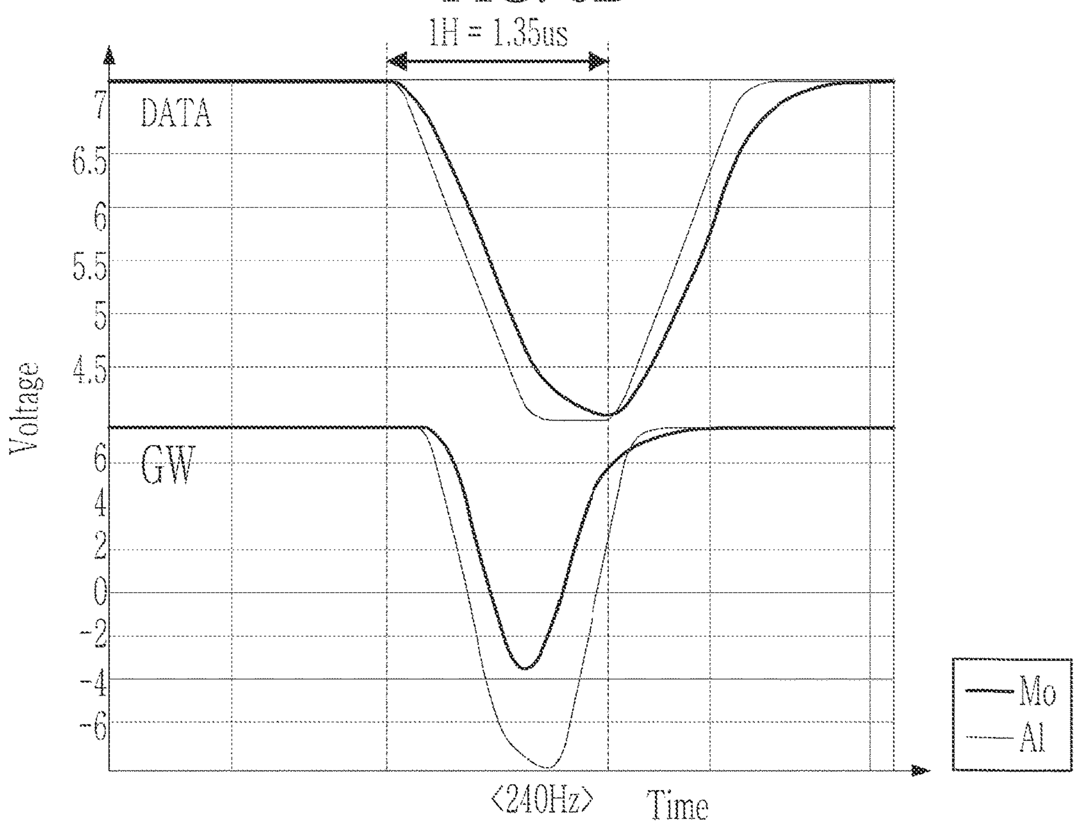

LIGHT EMITTING DISPLAY DEVICE

CROSS-REFERENCE TO RELATED APPLICATION

This application claims priority under 35 U.S.C. § 119 from Korean Patent Applications No. 10-2022-0102065 filed in the Korean Intellectual Property Office on Aug. 16, 2022 and Korean Patent Application No. 10-2022-0117450 filed in the Korean Intellectual Property Office on Sep. 16, 2022, the entire contents of which are incorporated herein by reference.

BACKGROUND

1. Technical Field

The disclosure relates to a light emitting display device.

2. Description of the Related Art

A display device may be a device that displays an image, and can be a liquid crystal display (LCD), an organic light emitting diode (OLED) display, and the like. Such a display device may be used in various electronic devices such as portable phones, navigation devices, digital cameras, electronic books, portable game machines, televisions, and various terminals.

The display device may include multiple pixels disposed in both a row direction and a column direction. In each pixel, various elements such as transistors and capacitors and various wires that can supply signals to these elements can be disposed.

Various elements such as transistors and capacitors may be controlled by signals applied at various times to display images, and a light emitting display device may be controlled to emit light of a specific luminance to display an image.

The above information disclosed in this Background section is only for enhancement of understanding of the background of the described technology, and therefore it may contain information that does not constitute prior art under 35 U.S.C. § 102 that may already be known in this country to a person of ordinary skill in the art.

SUMMARY

Embodiments are to provide a light emitting display device that enables high-speed driving.

In the embodiment, dehydrogenation may be smoothly performed during the process in a polycrystalline semiconductor, and thus the characteristics of a driving transistor can be constantly secured.

A light emitting display device according to an embodiment includes a first semiconductor layer that includes a semiconductor pattern of a driving transistor and a semiconductor pattern of a polycrystalline switching transistor; a first gate conductive layer that includes a gate electrode of the driving transistor and a gate electrode of the polycrystalline switching transistor, the gate electrode of the driving transistor being disposed on a part of the semiconductor pattern of the driving transistor, the gate electrode of the polycrystalline switching transistor being disposed on a part of the semiconductor pattern of the polycrystalline switching transistor; a second gate conductive layer disposed on a part of the gate electrode of the driving transistor, the second gate conductive layer includes an upper electrode of a storage capacitor, wherein an opening is disposed in the upper electrode of the storage capacitor; a second semiconductor layer that includes an oxide semiconductor pattern of an oxide switching transistor; and a third gate conductive layer that includes a gate electrode of the oxide switching transistor disposed on a part of the oxide semiconductor pattern, wherein the gate electrode of the driving transistor and the gate electrode of the polycrystalline switching transistor are disposed on a same layer and includes different materials.

The gate electrode of the driving transistor may include molybdenum.

The gate electrode of the polycrystalline switching transistor may include a low-resistive material.

The gate electrode of the polycrystalline switching transistor may include a first layer that includes aluminum; and a second layer disposed on the first layer, the second layer may include titanium.

The upper electrode of the storage capacitor may include a first layer that includes aluminum and a second layer disposed on the first layer, the second layer may include titanium, and the upper electrode of the storage capacitor may be disposed on the gate electrode of the driving transistor, the gate electrode of the driving transistor being a lower and opposite electrode of the storage capacitor.

The gate electrode of the oxide switching transistor may include molybdenum.

The light emitting display device may further include a first connection electrode electrically connecting the semiconductor pattern of the driving transistor to the oxide semiconductor pattern.

The light emitting display device may further include a second connection electrode electrically connected to the gate electrode of the driving transistor.

A light emitting display device according to an embodiment includes a first semiconductor layer that includes a semiconductor pattern of a driving transistor and a semiconductor pattern of a polycrystalline switching transistor; a gate electrode of the driving transistor disposed on a part of the semiconductor pattern of the driving transistor; a gate electrode of the polycrystalline switching transistor disposed on a part of the semiconductor pattern of the polycrystalline switching transistor; an upper electrode of a storage capacitor disposed on a part of the gate electrode of the driving transistor, wherein an opening is disposed in the upper electrode of the storage capacitor; an oxide semiconductor pattern of an oxide switching transistor; and a gate electrode of the oxide switching transistor disposed on a part of the oxide semiconductor pattern, wherein the gate electrode of the driving transistor and the gate electrode of the polycrystalline switching transistor are disposed on different layers.

The light emitting display device may further include a first gate insulation layer disposed on the first semiconductor layer; and a second gate insulation layer disposed on the gate electrode of the polycrystalline switching transistor, wherein the gate electrode of the driving transistor may be disposed on the second gate insulation layer.

The light emitting display device may further include: an auxiliary second gate insulation layer disposed on the gate electrode of the driving transistor; and a first interlayer insulation layer disposed on the upper electrode of the storage capacitor.

The light emitting display device may further include a first gate insulation layer disposed on the first semiconductor layer; and a second gate insulation layer disposed on the gate electrode of the driving transistor, wherein the gate electrode of the polycrystalline switching transistor may be disposed on the second gate insulation layer.

The light emitting display device may further include: an auxiliary second gate insulation layer disposed on the upper electrode of the storage capacitor; and a first interlayer insulation layer disposed on the gate electrode of the polycrystalline switching transistor.

The gate electrode of the driving transistor may include molybdenum.

The gate electrode of the polycrystalline switching transistor may include a low-resistive material.

The gate electrode of the polycrystalline switching transistor may include a first layer that includes aluminum; and a second layer disposed on the first layer and that includes titanium.

The upper electrode of the storage capacitor may include a first layer that includes aluminum and a second layer disposed on the first layer that includes titanium, and the upper electrode of the storage capacitor may be disposed on the gate electrode of the driving transistor, the gate electrode of the driving transistor being a lower and opposite electrode of the storage capacitor.

The gate electrode of the oxide switching transistor may include molybdenum.

The light emitting display device may further include a first connection electrode electrically connecting the semiconductor pattern of the driving transistor to the oxide semiconductor pattern.

The light emitting display device may further include a second connection electrode electrically connected to the gate electrode of the driving transistor.

A light emitting display device according to an embodiment includes a first semiconductor layer that includes a semiconductor pattern of a driving transistor and a semiconductor pattern of a polycrystalline switching transistor; a first gate conductive layer that includes molybdenum and includes a gate electrode of the driving transistor and a gate electrode of the polycrystalline switching transistor, the gate electrode of the driving transistor being disposed on a part of the semiconductor pattern of the driving transistor, the gate electrode of the polycrystalline switching transistor being disposed on a part of the semiconductor pattern of the polycrystalline switching transistor; a second gate conductive layer that includes an upper electrode of a storage capacitor disposed on a part of the gate electrode of the driving transistor, wherein an opening is disposed in the upper electrode of the storage capacitor; a second semiconductor layer that includes oxide semiconductor pattern of an oxide switching transistor; a third gate conductive layer that includes a gate electrode of the oxide switching transistor disposed on a part of the oxide semiconductor pattern; and an auxiliary signal line of the polycrystalline switching transistor that includes a low-resistive material and is electrically connected to the gate electrode of the polycrystalline switching transistor.

The auxiliary signal line of the polycrystalline switching transistor may include a lower layer that includes aluminum; and an upper layer disposed on the lower layer that includes titanium.

The second gate conductive layer may include molybdenum.

The gate electrode of the oxide switching transistor may include molybdenum.

The light emitting display device may further include a first gate insulation layer disposed on the first semiconductor layer; a second gate insulation layer that disposed on the gate electrode of the polycrystalline switching transistor; and an auxiliary second gate insulation disposed on the upper electrode of the storage capacitor, wherein the auxiliary signal line of the polycrystalline switching transistor may be electrically connected to the gate electrode of the polycrystalline switching transistor through an auxiliary contact hole disposed in the second gate insulation layer and the auxiliary second gate insulation layer.

The light emitting display device may further include a first interlayer insulation layer disposed on the auxiliary signal line of the polycrystalline switching transistor; a third gate insulation layer disposed on the second semiconductor layer; and a second interlayer insulation layer disposed on the third gate conductive layer.

The light emitting display device may further include a first connection electrode disposed on the second interlayer insulation layer to electrically connect the semiconductor pattern of the driving transistor to the oxide semiconductor pattern.

The light emitting display device may further include a second connection electrode disposed on the second interlayer insulation layer and electrically connected to the gate electrode of the driving transistor.

The light emitting display device may further include an auxiliary connection electrode, the auxiliary connection electrode and the auxiliary signal line of the polycrystalline switching transistor being disposed on a same layer, wherein the second connection electrode may extend through the auxiliary connection electrode.

The auxiliary signal line of the polycrystalline switching transistor may be disposed above third gate conductive layer in a plan view.

The light emitting display device may further include a first gate insulation layer disposed on the first semiconductor layer; a second gate insulation layer disposed on the gate electrode of the polycrystalline switching transistor; a first interlayer insulation layer disposed on the second gate conductive layer; a third gate insulation layer disposed on the second semiconductor layer; and an auxiliary third gate insulation layer disposed on the third gate conductive layer, wherein the auxiliary signal line of the polycrystalline switching transistor may be disposed on the auxiliary third gate insulation layer.

The auxiliary signal line of the polycrystalline switching transistor may be electrically connected to the gate electrode of the polycrystalline switching transistor through an auxiliary contact hole disposed in the second gate insulation layer, the first interlayer insulation layer, the third gate insulation layer, and the auxiliary third gate insulation layer.

The light emitting display device may further include an auxiliary signal line of the oxide transistor, the auxiliary signal line of the oxide transistor and the auxiliary signal line of the polycrystalline switching transistor being disposed on a same layer and including a same material, the auxiliary signal line of the oxide transistor is electrically connected to the gate electrode of the oxide switching transistor.

The auxiliary signal line of the oxide transistor may be electrically connected to the gate electrode of the oxide switching transistor through an auxiliary contact hole disposed in the auxiliary third gate insulation layer.

A light emitting display device according to an embodiment includes a first semiconductor layer that includes a semiconductor pattern of a driving transistor and a semiconductor pattern of a polycrystalline switching transistor disposed on a substrate; a first gate conductive layer that includes molybdenum, the first gate conductive layer includes a gate electrode of the driving transistor and a gate electrode of the polycrystalline switching transistor, the gate electrode of the driving transistor being disposed on a part of the semiconductor pattern of the driving transistor, the gate electrode of the polycrystalline switching transistor being disposed on a part of the semiconductor pattern of the polycrystalline switching transistor; a second gate conductive layer includes a low-resistive material, the second gate conductive layer includes an upper electrode of a storage capacitor, the gate electrode of the polycrystalline switching transistor and an auxiliary signal line, the upper electrode of the storage capacitor being disposed on a part of the gate electrode of the driving transistor, wherein an opening is disposed in the upper electrode of the storage capacitor; a second semiconductor layer includes an oxide semiconductor pattern of an oxide switching transistor; and a third gate conductive layer includes a gate electrode of the oxide switching transistor and being disposed on a part of the oxide semiconductor pattern.

The upper electrode of the storage capacitor and the auxiliary signal line of the second gate conductive layer may each include a first layer that includes of copper; and a second layer disposed on the first layer that includes titanium.

The gate electrode of the oxide switching transistor may include molybdenum.

The light emitting display device may further include a first gate insulation layer disposed on the first semiconductor layer; and a second gate insulation layer disposed on the gate electrode of the polycrystalline switching transistor, wherein the auxiliary signal line may be electrically connected to the gate electrode of the polycrystalline switching transistor through an auxiliary contact hole disposed in the second gate insulation layer.

The light emitting display device may further include a first connection electrode electrically connecting the semiconductor pattern of the driving transistor to the oxide semiconductor pattern.

The light emitting display device may further include a second connection electrode electrically connected to the gate electrode of the driving transistor.

According to the embodiments, a gate electrode of a switching transistor including a polycrystalline semiconductor layer may include a material different from a driving gate electrode, and may be a low-resistance material such that the light emitting display device can be driven at high speed.

According to the embodiments, a signal line connected to the gate electrode may include a material different from the gate electrode and may be a low-resistance material such that the light emitting display device can be driven at high speed.

Hydrogen can be sufficiently removed during the process of the semiconductor layer included in the polycrystalline transistor by forming a gate electrode with a material including molybdenum (Mo), and thus the characteristics of the driving transistor can be produced uniformly.

BRIEF DESCRIPTION OF THE DRAWINGS

An additional appreciation according to the embodiments of the disclosure will become more apparent by describing in detail the embodiments thereof with reference to the accompanying drawings, wherein:

FIGS. 6A and 6B show a change of a scan voltage according to frequency in a light emitting display device according to an embodiment;

DETAILED DESCRIPTION OF THE EMBODIMENTS

Figure 1:
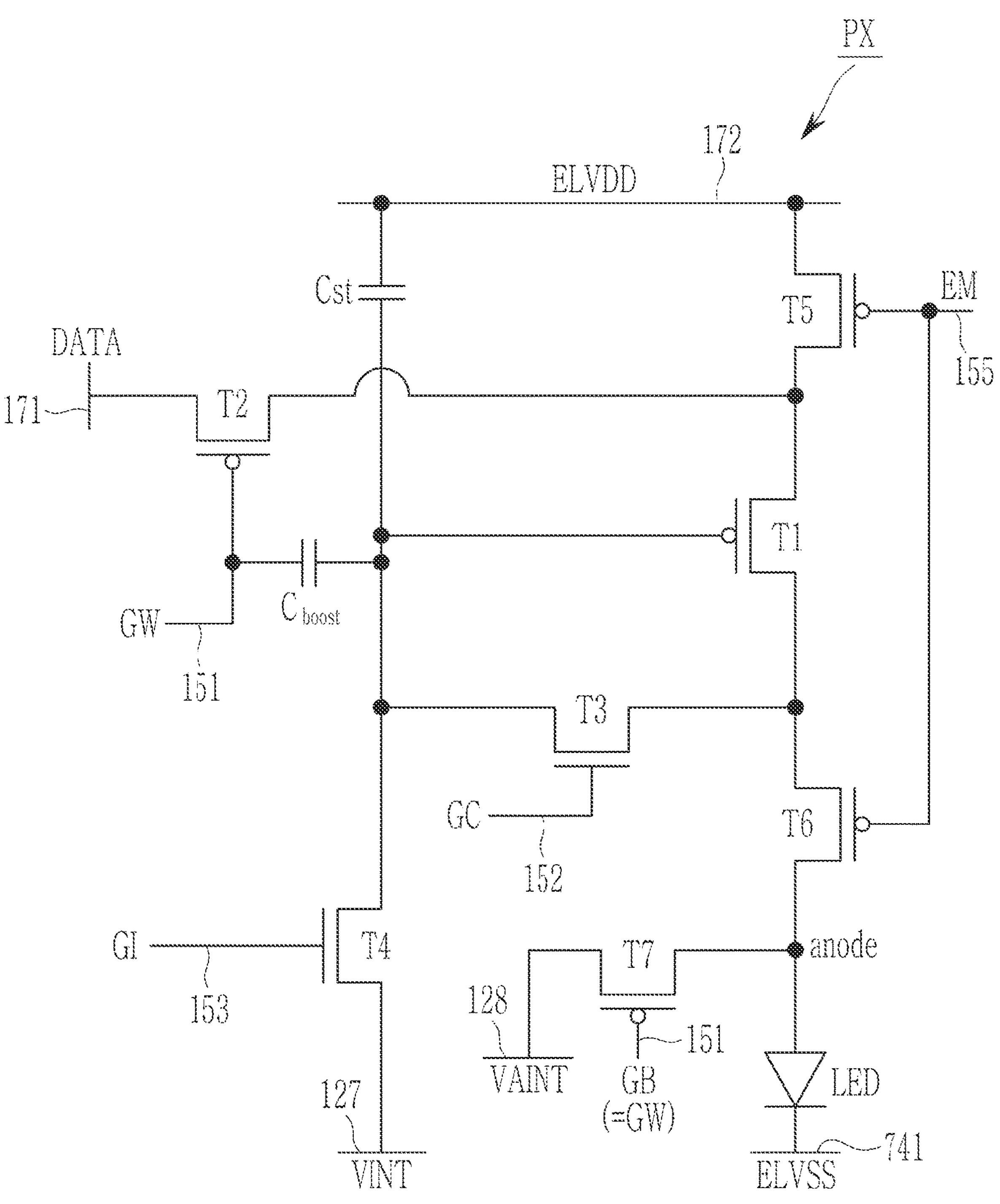
FIG. 1 is a schematic diagram of a circuit of one pixel included in a light emitting display device according to an embodiment.

Hereinafter, various embodiments will be described in detail with reference to the accompanying drawing, and thus a person of an ordinary skill can readily perform it in the technical field to which the invention belongs. The invention may be implemented in several different forms and may not be limited to the embodiments described herein.

In order to clearly explain the invention, parts irrelevant to the description are omitted, and the same reference sign is designated to the same or similar constituent elements throughout the specification.

Since the size and thickness of each component shown in the drawing are arbitrarily indicated for better understanding and ease of description, the invention is not necessarily limited to the drawings. In the drawings, the thickness of layers, films, panels, regions, etc., are exaggerated for clarity. In the drawing, the thickness of some layers and regions is exaggerated for better understanding and ease of description.

It will be understood that in case that an element such as a layer, film, region, or substrate is referred to as being "on" another element, it can be directly on the other element or intervening elements may also be present. In contrast, in case that an element is referred to as being "directly on" another element, there are no intervening elements present. Further, throughout the specification, the word "on" a target element will be understood to mean disposed above or below the target element, and will not necessarily be understood to mean disposed "at an upper side" based on an opposite to gravity direction.

Unless explicitly described to the contrary, the word "comprise", "include," "have" and variations thereof, will be understood to imply the inclusion of stated elements but not the exclusion of any other elements.

Further, throughout the specification, the phrase "on a plane" or "in a plan view" means viewing a target portion from the top, and the phrase "on a cross-section" or "in a cross-sectional view" means viewing a cross-section formed by vertically cutting a target portion from the side.

Throughout the specification, "connected" does not mean only in case that two or more constituent elements are directly connected, but also in case that two or more constituent elements are indirectly connected through another constituent element, or in case that physically connected or electrically connected, and it may include a case in which substantially integral parts are connected to each other although they are referred to by different names according to positions or functions.

In the entire specification, in case that parts such as wire, layer, film, region, plate, and constituent elements are "extended in the first direction or second direction", this does not mean only a straight line shape extending in the corresponding direction, but also means a structure that is generally extended along a first direction or a second direction, and includes a structure that is bent in one part, has a zigzag structure, or includes a structure that includes a curved line while being extended.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Electronic devices (for example, mobile phone, TV, monitor, laptop computer, etc.) including display devices and display panels described in the specification or electronic devices including display devices and display panels manufactured by the manufacturing method described in the specification are not excluded from the scope of rights of this specification.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The invention described hereinafter may be applied to various light emitting display devices, and an embodiment of one of various pixel structures will be described below with reference to FIG. 1.

FIG. 1 is a schematic diagram of a circuit of one pixel included in a light emitting display device according to an embodiment.

A pixel according to an embodiment includes transistors T1, T2, T3, T4, T5, T6, and T7 electrically connected to wires 127, 128, 151, 152, 153, 155, 171, 172, and 741, a storage capacitor Cst, a boost capacitor $C_{boost}$, and a light emitting diode LED. Here, transistors and capacitors other than the light emitting diode LED form a pixel circuit portion. Depending on embodiments, the boost capacitor $C_{boost}$ can be omitted. Depending on embodiments, auxiliary capacitors or auxiliary boost capacitors may be formed.

Wires 127, 128, 151, 152, 153, 155, 171, 172, and 741 may be electrically connected to a pixel PX. The wires include a first initialization voltage line 127, a second initialization voltage line 128, a first scan line 151, a second scan line 152, an initialization control line 153, a light emission control line 155, a data line 171, a driving voltage line 172, and a common voltage line 741.

The first scan line 151 may be electrically connected to a scan driver (not shown) to transfer a first scan signal GW to the second transistor T2 and the seventh transistor T7. A voltage of opposite polarity and at a same time as that applied to the first scan line 151 may be applied to the second scan line 152. For example, in case that a voltage of negative polarity may be applied to the first scan line 151, a voltage of positive polarity may be applied to the second scan line 152. The second scan line 152 transfers a second scan signal GC to the third transistor T3. The initialization control line 153 transfers an initialization control signal GI to the fourth transistor T4. The light emission control line 155 transfers a light emission control signal EM to the fifth transistor T5 and the sixth transistor T6.

The data line 171 may be a wire that transmits a data voltage DATA generated by the data driver (not shown), and accordingly, the magnitude of the light emitting current transmitted to the light emitting diode LED changes, and the luminance emitted by the light emitting diode LED also changes. The driving voltage line 172 applies a driving voltage ELVDD. The first initialization voltage line 127 transmits a first initialization voltage VINT, and the second initialization voltage line 128 transmits a second initialization voltage VAINT. The common voltage line 741 applies a common voltage ELVSS to a cathode of the light emitting diode LED. In the embodiment, voltages applied to the driving voltage line 172, the first and second initialization voltage lines 127 and 128, and the common voltage line 741 may be constant voltages.

The driving transistor T1 (also referred to as first transistor) may be a P-type transistor, and has a silicon semiconductor (hereinafter also referred to as polycrystalline semiconductor or semiconductor pattern ACT1-1) formed from a first semiconductor layer ACT1 as an active layer. The driving transistor T1 may be a transistor that adjusts the intensity of a light emitting current output to an anode of the light emitting diode LED depending on the magnitude of a voltage of a gate electrode (i.e., a voltage stored in the storage capacitor Cst). Since the brightness of the light emitting diode LED may be adjusted according to the magnitude of the light emitting current output from the anode of the light emitting diode LED, the light emitting luminance of the light emitting diode LED can be adjusted according to the data voltage DATA applied to the pixel. For this purpose, the first electrode of the driving transistor T1 may be disposed to receive the driving voltage ELVDD, and may be electrically connected to the driving voltage line 172 via the fifth transistor T5. A first electrode of the driving transistor T1 may also be electrically connected to a second electrode of the second transistor T2 to receive the data voltage DATA. A second electrode of the driving transistor T1 outputs a light emitting current to the light emitting diode LED, and may be electrically connected to the anode of the light emitting diode LED via the sixth transistor T6 (hereinafter referred to as an output control transistor). The second electrode of the driving transistor T1 may also be electrically connected to the third transistor T3 to transfer the data voltage DATA applied to the first electrode of the first transistor T1 to the third transistor T3. The gate electrode of the driving transistor T1 may be electrically connected to an electrode (hereinafter referred to as a second storage electrode or lower electrode) of the storage capacitor Cst. Another electrode (hereinafter referred to as a first storage electrode or upper electrode CE) of the storage capacitor Cst receives the driving voltage ELVDD. Accordingly, the voltage of the gate electrode of the driving transistor T1 may be changed according to the voltage stored in the storage capacitor Cst, and the light emitting current output from the driving transistor T1 may be changed accordingly. The storage capacitor Cst serves to keep the voltage of the gate electrode of the driving transistor T1 constant during a frame. The gate electrode of the driving transistor T1 may also be electrically connected to the third transistor T3 such that data voltage DATA applied to the first electrode of the driving transistor T1 may be transferred to the gate electrode of the driving transistor T1 via the third transistor T3. The gate electrode of the driving transistor T1 may also be electrically connected to the fourth transistor T4 and can be initialized by receiving the first initialization voltage VINT by way of the fourth transistor T4.

The second transistor T2 may be a P-type transistor that has a silicon semiconductor as a semiconductor layer. The second transistor T2 may be the transistor that brings the data voltage DATA into the pixel. A gate electrode of the second transistor T2 may electrically connected to the first scan line 151 and an electrode (hereinafter referred to as a lower boost electrode) of the boost capacitor $C_{boost}$. Another electrode of the boost capacitor $C_{boost}$ may be electrically connected to the gate electrode of the driving transistor T1 and the second storage electrode (or lower electrode) of the storage capacitor Cst. The first electrode of the second transistor T2 may be electrically connected to the data line 171, and the second electrode of the second transistor T2 may be electrically connected to the first electrode of the driving transistor T1. In case that the second transistor T2 may be turned on by a negative polarity voltage of the first scan signal GW transmitted through the first scan line 151, the data voltage DATA transmitted through the data line 171 may be transmitted to the first electrode of the driving transistor T1 so that the data voltage DATA may be transmitted to the gate electrode of the driving transistor T1 and stored in the storage capacitor Cst by way of the third transistor T3.

The third transistor T3 may be an N-type transistor and has an oxide semiconductor (hereinafter referred to as a semiconductor pattern ACT2-1) formed from second semiconductor layer ACT2. The third transistor T3 electrically connects the second electrode of driving transistor T1 to the gate electrode of the driving transistor T1. As a result, the data voltage DATA may be compensated by a threshold voltage of the driving transistor T1 and stored in the second storage electrode (i.e., lower electrode) of the storage capacitor Cst. A gate electrode of the third transistor T3 may be electrically connected to the second scan line 152, and a first electrode of the third transistor T3 may be electrically connected to the second electrode of the driving transistor T1. A second electrode of the third transistor T3 may be electrically connected to the second storage electrode of the storage capacitor Cst, the gate electrode of the driving transistor T1, and the other electrode (hereinafter referred to as an upper boost electrode) of the boost capacitor $C_{boost}$. The third transistor T3 may be turned on by the positive voltage of the second scan signal GC transmitted through the second scan line 152, and may serve to electrically connect the gate electrode of the driving transistor T1 to the second electrode of the driving transistor T1, and to transmit the voltage applied to the gate electrode of the driving transistor T1 to the second storage electrode (e.g., lower electrode) of the storage capacitor Cst for storage in the storage capacitor Cst. As a result, the voltage of the gate electrode of the driving transistor T1 in case that the driving transistor T1 is turned off, may be stored in the storage capacitor Cst in such a manner that a threshold voltage Vth of the driving transistor T1 may be compensated.

The fourth transistor T4 may be an N-type transistor and has an oxide semiconductor as a semiconductor layer. The fourth transistor T4 serves to initialize the gate electrode of the driving transistor T1 and the second storage electrode of the storage capacitor Cst. A gate electrode of the fourth transistor T4 may be electrically connected to the initialization control line 153, and a first electrode of the fourth transistor T4 may be electrically connected to the first initialization voltage line 127. A second electrode of the fourth transistor T4 may be electrically connected to the second electrode of the third transistor T3, the second storage electrode of the storage capacitor Cst, the gate electrode of the driving transistor T1, and the upper boost electrode of the boost capacitor $C_{boost}$. The fourth transistor T4 may be turned on by a positive voltage of the initialization control signal GI received through the initialization control line 153. The first initialization voltage VINT may be applied to the gate electrode of the driving transistor T1, the second storage electrode of the storage capacitor Cst, and the upper boost electrode of the boost capacitor $C_{boost}$ for initialization upon the fourth transistor T4 being turned on.

The fifth transistor T5 and the sixth transistor T6 may be P-type transistors and have a silicon semiconductor as a semiconductor layer. The fifth transistor T5 serves to transfer the driving voltage ELVDD to the driving transistor T1.

A gate electrode of the fifth transistor T5 may be electrically connected to the light emission control line 155, a first electrode of the fifth transistor T5 may be electrically connected to the driving voltage line 172, and a second electrode of the fifth transistor T5 may be electrically connected to the first electrode of the driving transistor T1.

The sixth transistor T6 serves to transfer the light emitting current output from the driving transistor T1 to the light emitting diode LED. A gate electrode of the sixth transistor T6 may be electrically connected to the light emission control line 155, a first electrode of the sixth transistor T6 may be electrically connected to the second electrode of the driving transistor T1, and a second electrode of the sixth transistor T6 may be electrically connected to the anode of the light emitting diode LED.

Figure 12:
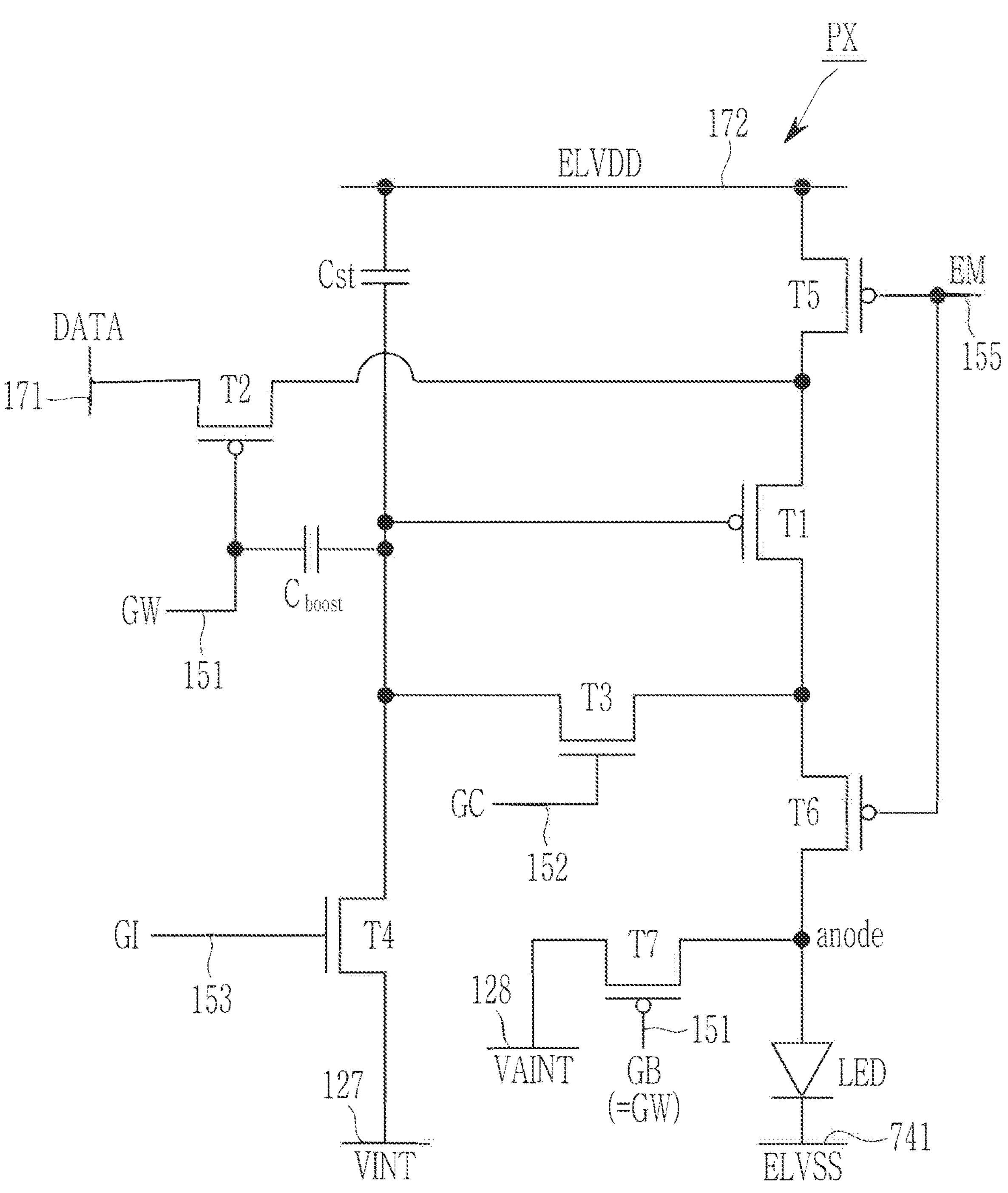
FIG. 12 shows a schematic diagram of a circuit of a pixel included in a light emitting display device according to an embodiment.

The seventh transistor T7 may be a P-type or N-type transistor, and may have a silicon semiconductor or an oxide semiconductor as a semiconductor (or active) layer. In the embodiment of FIG. 12, the seventh transistor T7 may be a P-type transistor and include a silicon semiconductor. The seventh transistor T7 serves to initialize the anode of the light emitting diode LED. A gate electrode of the seventh transistor T7 may be electrically connected to the first scan line 151, a first electrode of the seventh transistor T7 may be electrically connected to the anode of the light emitting diode LED, and a second electrode of the seventh transistor T7 may be electrically connected to the second initialization voltage line 128. Here, the gate electrode of the seventh transistor T7 may be electrically connected to the first scan line 151 of the previous pixel, and may not be electrically connected to the gate electrode of the second transistor T2 included in a same pixel PX and a same first scan line 151, but may be electrically connected to the first scan line 151 that may be a same as the gate electrode of the second transistor T2 of the previous pixel PX. In case that the seventh transistor T7 may be turned on by the negative polarity voltage of the first scan line 151, the second initialization voltage VAINT may be applied to the anode of the light emitting diode LED and initialized. The gate electrode of the seventh transistor T7 may be electrically connected to a separate bypass control line through which a bypass signal GB may be transmitted, and can be controlled with a separate wire from that of the first scan line 151. Depending on embodiments, the second initialization voltage line 128 to which the second initialization voltage VAINT may be applied may be a same as the first initialization voltage line 127 to which the first initialization voltage VINT may be applied.

It has been described that a pixel PX includes seven transistors T1 to T7, and two capacitors (storage capacitor Cst and boost capacitor $C_{boost}$), but this may not be restrictive, and the boost capacitor $C_{boost}$ can instead be omitted depending on embodiments. Depending on embodiments, an auxiliary boost capacitor may instead be formed between the gate electrode of the third transistor T3 and the gate electrode of the driving transistor T1. Although the third transistor and the fourth transistor may be formed of N-type transistors, only one of them may be formed of N-type transistors or other transistors (e.g., the seventh transistor, etc.) may be formed of N-type transistors.

As described above, the pixel of the light emitting display device includes two types of semiconductors (or active layers for thin film transistors) disposed on different layers, and the two types of semiconductors may be respectively polycrystalline semiconductors (also called first semiconductor layer ACT1) and oxide semiconductors (also called second semiconductor layer ACT2). Each of these may be included in a transistor. Hereinafter, a transistor including a polycrystalline semiconductor pattern may be referred to as a polycrystalline transistor, and a transistor including an oxide semiconductor pattern may be referred to as an oxide transistor. As such, a pixel may include a polycrystalline transistor and an oxide transistor, and the driving transistor T1 providing a driving current to the light emitting diode LED may be a polycrystalline transistor. All other transistors except for the driving transistor T1 may also be referred to as switching transistors, and switching transistors can be divided into polycrystalline switching transistors and oxide switching transistors.

Figure 2:
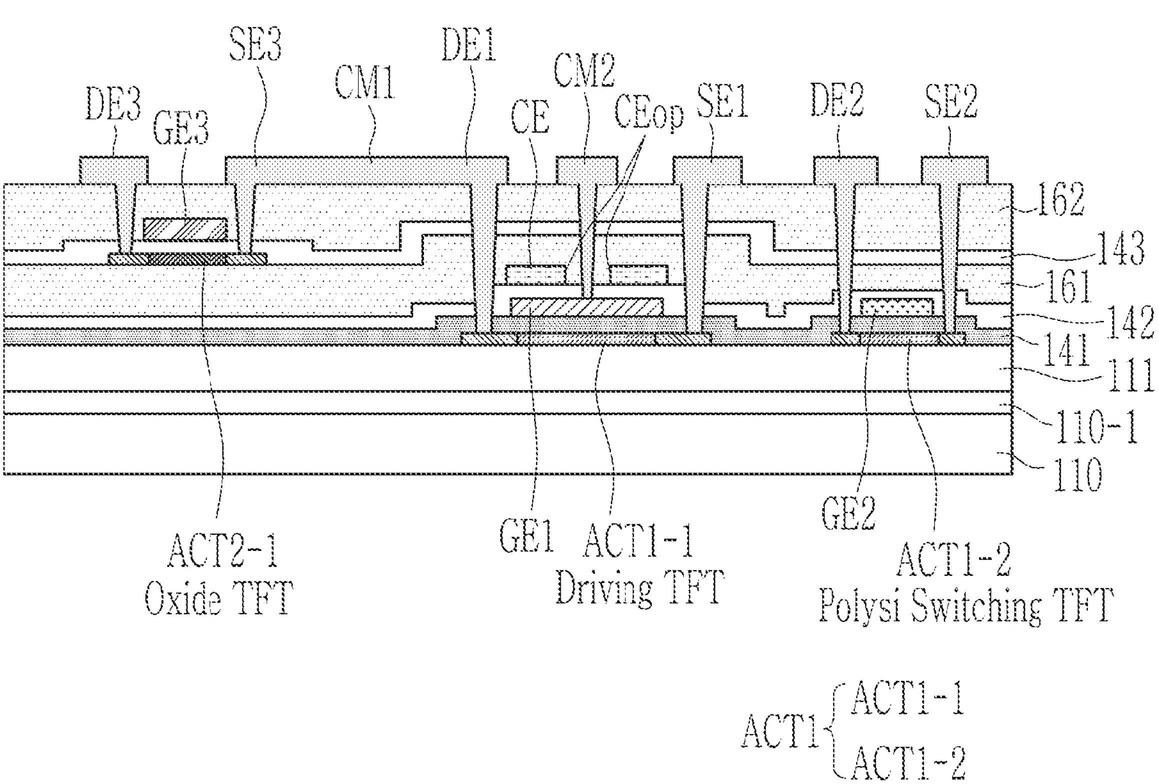
FIG. 2 is a schematic cross-sectional view of a part of the light emitting display device according to an embodiment.

Hereinafter, a schematic cross-sectional view of the light emitting display device according to an embodiment will be described with reference to FIG. 2. FIG. 2 is a schematic cross-sectional view of a part of the light emitting display device according to an embodiment. In FIG. 2, a driving transistor, a polycrystalline switching transistor, and an oxide switching transistor may be representatively shown. Here, the polycrystalline switching transistor may be one of the second transistor T2, the fifth transistor T5, the sixth transistor T6, and the seventh transistor T7 of FIG. 1, and the oxide switching transistor may be one of the third transistor T3 and the fourth transistor T4 of FIG. 1. Depending on embodiments, the seventh transistor T7 may be an oxide switching transistor.

Referring to FIG. 2, a substrate 110, a barrier layer 110-1, and a buffer layer 111 may be sequentially formed. The substrate 110 may include a material that has rigid characteristics such as glass that does not bend, or may include a flexible material that can bend such as plastic, polyimide, or a combination thereof. The barrier layer 110-1 may be disposed on the substrate 110, and the barrier layer 110-1 may be omitted depending on embodiments.

The buffer layer 111 covering the barrier layer 110-1 may be disposed on the barrier layer 110-1. The buffer layer 111 serves to block penetration of impurity elements into the first semiconductor layer ACT1 from substrate 110, and may be an inorganic insulation layer including a silicon oxide (SiOx), a silicon nitride (SiNx), a silicon oxynitride ($SiO_xN_y$), or a combination thereof. Depending on embodiments, a metal layer BML (refer to FIG. 11) may be formed between the barrier layer 110-1 and the buffer layer 111.

A first semiconductor layer ACT1 formed of a polycrystalline semiconductor (P-Si) material may be disposed on the buffer layer 111. In FIG. 2, the first semiconductor layer ACT1 may be divided into a semiconductor pattern ACT1-1 of the driving transistor (hereinafter also referred to as a semiconductor pattern of the driving transistor) and a semiconductor pattern of the polycrystalline transistor ACT1-2 (hereinafter also referred to as a semiconductor pattern of the polycrystalline switching transistor). Here, the polycrystalline switching transistor may be one of the second transistor T2, the fifth transistor T5, the sixth transistor T6, and the seventh transistor T7 of FIG. 1. Each semiconductor pattern formed from first semiconductor layer ACT1 includes a channel, and a first area and a second area that are disposed at opposite sides of the channel. The first area and the second each have conductive electrical properties due to a plasma treatment or a doping process, and thus may serve as a first electrode and a second electrode of the polycrystalline transistor.

A first gate insulation layer 141 may be disposed on the first semiconductor layer ACT1. The first gate insulation layer 141 may be an inorganic insulation layer including a silicon oxide ($SiO_x$) or a silicon nitride ($SiN_x$), a silicon oxynitride ($SiO_xN_y$), or a combination thereof.

A first gate conductive layer GAT1 including gate electrodes GE1 and GE2 of the polycrystalline transistors may be disposed on the first gate insulation layer 141. It is illustrated that the first gate conductive layer GAT1 may be divided into a gate electrode GE1 of the driving transistor T1 and a gate electrode GE2 of the polycrystalline switching transistor.

Figure 4:
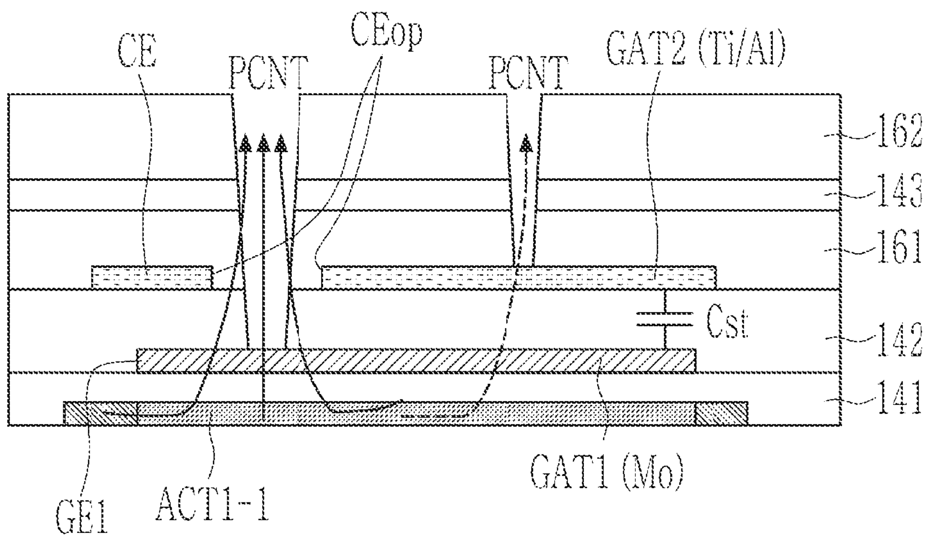
FIGS. 4 and 5 show a difference between a comparative example with an embodiment.

The gate electrode GE1 of the driving transistor and the gate electrode GE2 of the polycrystalline switching transistor may be disposed on a same layer (i.e., the first gate insulation layer 141), but they may be comprised of different materials according to the embodiment of FIGS. 1-2. For example, the gate electrode GE1 of the driving transistor may be comprised of molybdenum (Mo) while the gate electrode GE2 of the polycrystalline switching transistor may be comprised of aluminum (Al), and each may be formed as a single layer or multiple layers. In an embodiment, the gate electrode GE1 of the driving transistor may be a single layer comprised of molybdenum (Mo), the gate electrode GE2 of the polycrystalline switching transistor may be a two-layered structure of which a lower layer may be comprised of aluminum (Al) and an upper layer may be comprised of titanium (Ti). Here, the molybdenum (Mo) gate electrode GE1 of the driving transistor has properties that allow dehydrogenation of the underlying semiconductor pattern ACT1-1 to occur readily such that the properties of the driving transistor may be constant as shown in FIG. 4. The gate electrode GE2 of the polycrystalline switching transistor comprising aluminum (Al) has low resistance electrical properties and can receive a scan signal having a sufficient voltage value even during high-speed driving of about 240 Hz as shown in FIG. 6B, and thus a problem of delay due to resistance does not occur.

After forming the first gate conductive layer GAT1, an exposed area of the first semiconductor layer ACT1 may be made conductive by performing a plasma treatment or a doping process. For example, portions of the first semiconductor layer ACT1 covered by the first gate conductive layer GATT may remain non-conductive, while portions of the first semiconductor layer ACTT not covered by the first gate conductive layer GATT may have same electrical characteristics as a conductive material.

A second gate insulation layer 142 may be disposed on the first gate conductive layer GATT and the first gate insulation layer 141. The second gate insulation layer 142 may be an inorganic insulation layer including a silicon oxide ($SiO_x$) or a silicon nitride ($SiN_x$), a silicon oxynitride ($SiO_xN_y$), or a combination thereof.

A second gate conductive layer GAT2 including an upper (or second storage) electrode CE of the storage capacitor Cst may be disposed on the second gate insulation layer 142. Upper electrode CE of the storage capacitor Cst may overlap the gate electrode GE1 of the driving transistor T1 to form the storage capacitor Cst, and an opening or through hole CEop may be disposed in upper electrode CE at a location that overlaps or corresponds to a portion of the gate electrode GE1 of the driving transistor T1. Depending on embodiments, the second gate conductive layer GAT2 may further include a scan line, a control line, a voltage line, or a combination thereof. The second gate conductive layer GAT2 may include a metal such as copper (Cu), molybdenum (Mo), aluminum (Al), or titanium (Ti), a metal alloy thereof, or a combination thereof, and may be embodied as a single layer or as multiple layers. The second gate conductive layer GAT2 according to an embodiment may be a two-layered structure that includes a lower layer comprised of aluminum (Al) and an upper layer comprised of titanium (Ti).

A first interlayer insulation layer 161 may be disposed on the second gate conductive layer GAT2. The first interlayer insulation layer 161 may include an inorganic insulation layer including a silicon oxide ($SiO_x$), a silicon nitride ($SiN_x$), a silicon oxynitride ($SiO_xN_y$), or a combination thereof, and depending on embodiments, the inorganic insulation material may be thick.

A second semiconductor layer ACT2 for an oxide transistor may be disposed on first interlayer insulating layer 161 and may include an oxide semiconductor pattern ACT2-1 that includes a first area disposed on an opposing side of a channel area from a second area.

A third gate insulation layer 143 may be disposed on the second semiconductor layer ACT2. The third gate insulation layer 143 may be disposed on the entire surface of the second semiconductor layer ACT2 and on the first interlayer insulation layer 161. The third gate insulation layer 143 may include an inorganic insulation layer including a silicon oxide (SiOx), a silicon nitride (SiNx), a silicon oxynitride ($SiO_xN_y$), the like, or a combination thereof.

A third gate conductive layer GAT3 including a gate electrode GE3 of an oxide transistor (or oxide switching transistor) may be disposed on the third gate insulation layer 143. The gate electrode GE3 of the oxide transistor may overlap the channel of oxide semiconductor pattern ACT2-1. The third gate conductive layer may further include a scan line, a control line, or a combination thereof. The third gate conductive layer GAT3 may include a metal such as copper (Cu), molybdenum (Mo), aluminum (Al), or titanium (Ti), a metal alloy thereof, or a combination thereof, and may be embodied as a single layer or as multiple layers. The third gate conductive layer GAT3 according to an embodiment may be a single layer comprised of molybdenum (Mo).

After forming the third gate conductive layer GAT3, an exposed portion of the second semiconductor pattern ACT2-1 may be made conductive by performing a plasma treatment or a doping process. For example, the portions of the semiconductor pattern ACT2-1 covered by the third gate conductive layer GAT3 may remain non-conductive, while portions of the semiconductor pattern ACT2-1 not covered by the third gate conductive layer GAT3 may have electrical properties similar to that of a conductive material.

A second interlayer insulation layer 162 may be disposed on the third gate conductive layer GAT3. The second interlayer insulation layer 162 may be either a single layer or a multi-layer structure. The second interlayer insulation layer 162 may include an inorganic insulation material including a silicon oxide (SiOx), a silicon nitride (SiNx), a silicon oxynitride ($SiO_xN_y$), the like, or a combination thereof, and depending on embodiments, an organic material may be included.

A first data conductive layer SD1, including a connection electrode that can be electrically connected to a first area and a second area of each of the polycrystalline transistor and the oxide transistor, may be disposed on the second interlayer insulation layer 162. In FIG. 2, the first data conductive layer SD1 includes a connection electrode SE1 electrically connected to the first area of the driving transistor T1, a connection electrode DE1 electrically connected to the second area of the driving transistor T1, a connection electrode (or second connection electrode) CM2 electrically connected to the gate electrode GE1 of the driving transistor T1, connection electrodes SE2 and DE2 respectively electrically connected to the first area and the second area of the polycrystalline switching transistor, and connection electrodes SE3 and DE3 respectively electrically connected to the first area and the second area of the oxide switching transistor, the connection electrode SE3 electrically connected to the first area of the oxide switching transistor and the connection electrode DE1 electrically connected to the second area of the driving transistor may be integral with each other to form the connection electrode (or first connection electrode) CM1. As a result, the semiconductor pattern ACT1-1 of the driving transistor T1 and the semiconductor pattern ACT2-1 of the oxide switching transistor may be electrically connected to each other by the connection electrode CM1.

The first data conductive layer SD1 may include a metal such as aluminum (Al), copper (Cu), molybdenum (Mo), or titanium (Ti), a metal alloy thereof, or a combination thereof, and may be formed of a single layer or multiple layers.

An organic layer may be disposed on the first data conductive layer SD1, and an anode can be disposed on the organic layer. The above-stated structure of the first data conductive layer SD1 will be described later with reference to FIG. 11.

Figure 3:
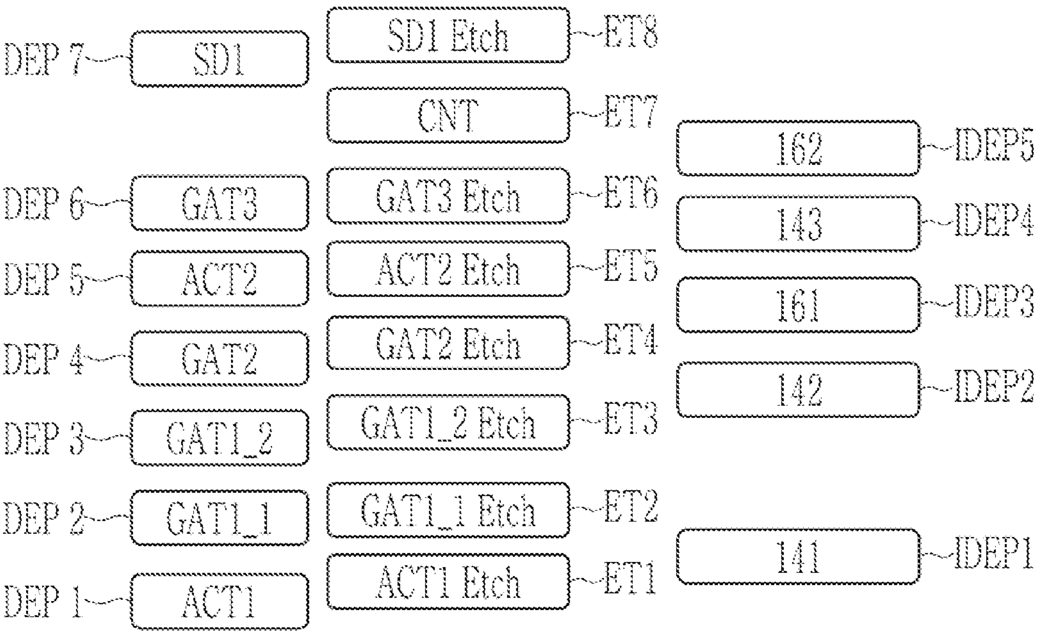
FIG. 3 schematically shows a manufacturing method of the light emitting display device according to the embodiment of FIG. 2.

FIG. 3 schematically shows a manufacturing method of the light emitting display device according to the embodiment of FIG. 2. In FIG. 3, a manufacturing method may be divided into lamination of the semiconductor or the conductor (DEP1 to DEPT) steps, etching (or patterning) (ET1 to ET8) steps, and lamination (or deposition) of the insulation layer (IDEP1 to IDEP5) steps, where lower layers are processed prior to upper layers.

Specifically, in the manufacturing method of FIG. 3, the first semiconductor layer ACT1 may be laminated (DEP1), the semiconductor patterns ACT1-1 and ACT1-2 may be produced by etching (ET1), and the first gate insulation layer 141 may be laminated (IDEP1).

After that, a 1-1 gate conductive layer GAT1_1 may be laminated (DEP2), a 1-1 gate conductive layer GAT1_1 may be etched (ET2), a 1-2 gate conductive layer GAT1_2 may be laminated (DEP3), and a 1-2 gate conductive layer GAT1_2 may be etched (ET3). Here, the 1-1 gate conductive layer GAT1_1 and the 1-2 gate conductive layer GAT1_2 indicate that the first gate conductive layers formed of different materials may be formed by separate processes respectively, and depending on embodiments, the 1-1 gate conductive layer GAT1_1 may correspond to the gate electrode GE1 of the driving transistor and the 1-2 gate conductive layer GAT1_2 may correspond to the gate electrode GE2 of the polycrystalline switching transistor. Depending on embodiments, the 1-1 gate conductive layer GAT1_1 may be comprised of molybdenum (Mo), and the 1-2 gate conductive layer GAT1_2 may be a two-layered structure that includes a lower layer comprised of aluminum (Al) and an upper layer comprised of titanium (Ti).

After that, the second gate insulation layer 142 may be laminated (IDEP2). The second gate conductive layer GAT2 may be laminated (DEP4), the second gate conductive layer GAT2 may be etched (ET4), and the first interlayer insulation layer 161 may be laminated (IDEP3). The second semiconductor layer ACT2 may be laminated (DEP5), the second semiconductor layer ACT2 may be etched (ET5), and the third gate insulation layer 143 may be laminated (IDEP4). The third gate conductive layer GAT3 may be laminated (DEP6), the third gate conductive layer GAT3 may be etched (ET6), and the second interlayer insulation layer 162 may be laminated (IDEP5). Here, the second gate conductive layer GAT2 may be comprised of a two-layered structure that includes a lower layer comprised of aluminum (Al) and an upper layer comprised of titanium (Ti), and the third gate conductive layer GAT3 may be a single layer comprised of molybdenum (Mo).

A contact hole CNT may be formed in at least one of the first gate insulation layer 141, the second gate insulation layer 142, the first interlayer insulation layer 161, the third gate insulation layer 143, and the second interlayer insulation layer 162 (ET7). Here, the contact hole CNT may be divided into first and second types of contact holes. The first type of contact hole may expose the first semiconductor layer ACT1, the 1-1 gate conductive layer GAT1_1, the 1-2 gate conductive layer GAT1_2, and the second gate conductive layer GAT2. The second type of contact hole may expose the second semiconductor layer ACT2 and the third gate conductive layer GAT3. Depending on embodiments, the first type of contact hole and the second type of contact hole may be formed in different processes.

The first data conductive layer SD1 may be laminated (DEPT) and the first data conductive layer SD1 may be etched (ET8). A structure of an upper portion of the first data conductive layer SD1 will later be described with reference to FIG. 11.

Figure 5:
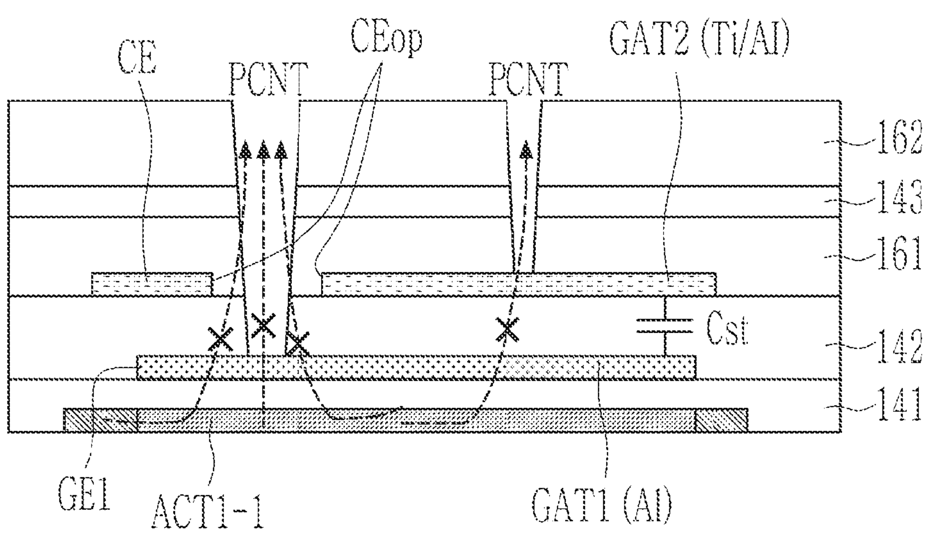

Hereafter, an embodiment of forming the gate electrode GE1 of the driving transistor T1 with molybdenum (Mo) will be described in comparison with a comparative example through FIGS. 4 and 5 respectively. FIG. 4 and FIG. 5 show a difference between an embodiment and a comparative example respectively.

FIG. 4 is an embodiment in which the gate electrode GE1 of the driving transistor T1 is comprised of molybdenum (Mo), and FIG. 5 is a comparative example in which the gate electrode of the driving transistor is comprised of aluminum (Al) which, unlike molybdenum, is a low-resistance metal.

Referring to the comparative example of FIG. 5, hydrogen existing inside the semiconductor pattern ACT1-1 may not be removed to the outside through the opening PCNT formed in the insulation layer due to the gate electrode being comprised of aluminum (Al). On the contrary, referring to FIG. 4 which is an embodiment, the gate electrode GE1 of the driving transistor T1 comprised of molybdenum (Mo) does not prevent the hydrogen existing inside the first semiconductor pattern ACT1-1 from being discharged to the outside through the opening PCNT. As a result, the dehydrogenation phenomenon of the semiconductor pattern ACT1-1 can occur, resulting in a driving range of the driving transistor T1 being secured to be constant and the electrical characteristics of the driving transistor being constant.

On the other hand, in case that the gate electrode GE1 is comprised of low-resistance aluminum (Al), there may be a feature that high-speed driving may be possible. This will be described with reference to FIGS. 6A and 6B.

FIGS. 6A and 6B show a change of a scan voltage according to frequency in a light emitting display device according to an embodiment. FIGS. 6A and 6B show the characteristics of the scan signal GW according to the driving frequency for an embodiment in which a signal line may be comprised of molybdenum (Mo) and an embodiment in which a signal line may be comprised of aluminum (Al). FIG. 6A shows a case of operating at a drive frequency of about 120 Hz, and FIG. 6B shows a case of operating at a drive frequency of about 240 Hz.

Referring to FIG. 6A, it can be confirmed that there may be no problem driving at about 120 Hz because the scan signal GW has a voltage below a certain level for a certain period or more regardless of whether the signal line is comprised of molybdenum (Mo) or aluminum (Al).

However, referring to FIG. 6B, at the driving frequency of about 240 Hz, the scan signal GW transmitted to the signal line comprised of aluminum (Al) has a voltage below a certain level for a certain period of time and thus there may be no problem in driving at about 240 Hz, but the voltage of the scan signal GW transmitted to the signal line comprised of molybdenum (Mo) may not be sufficiently low, and thus it may be difficult to operate as a scan signal, and when driven at about 240 Hz, a problem occurs in that the data voltage DATA may not be sufficiently charged. Therefore, for about 240 Hz and equivalent high-speed driving, it may be necessary to form the gate electrode and/or signal line electrically connected to the gate electrode of the transistor not with molybdenum (Mo) but with a low-resistance material such as aluminum (Al).

Referring to the features of FIGS. 4, 6A and 6B in the embodiment, the gate electrode GE1 of the driving transistor T1, which may be one of the polycrystalline transistors, may be comprised of molybdenum (Mo) to facilitate dehydrogenation, and the gate electrode of at least one of the polycrystalline switching transistors may be comprised of a material with low resistance such that the problem of signal delay and charge rate degradation does not occur even at high speed of about 240 Hz. In the embodiment, aluminum (Al) can be used as a material having low resistance.

Hereafter, another modified embodiment that may be different from FIGS. 2-3 will be described with reference to FIGS. 7-10, and embodiments of FIGS. 7 and 8 will be described first.

Figure 7:
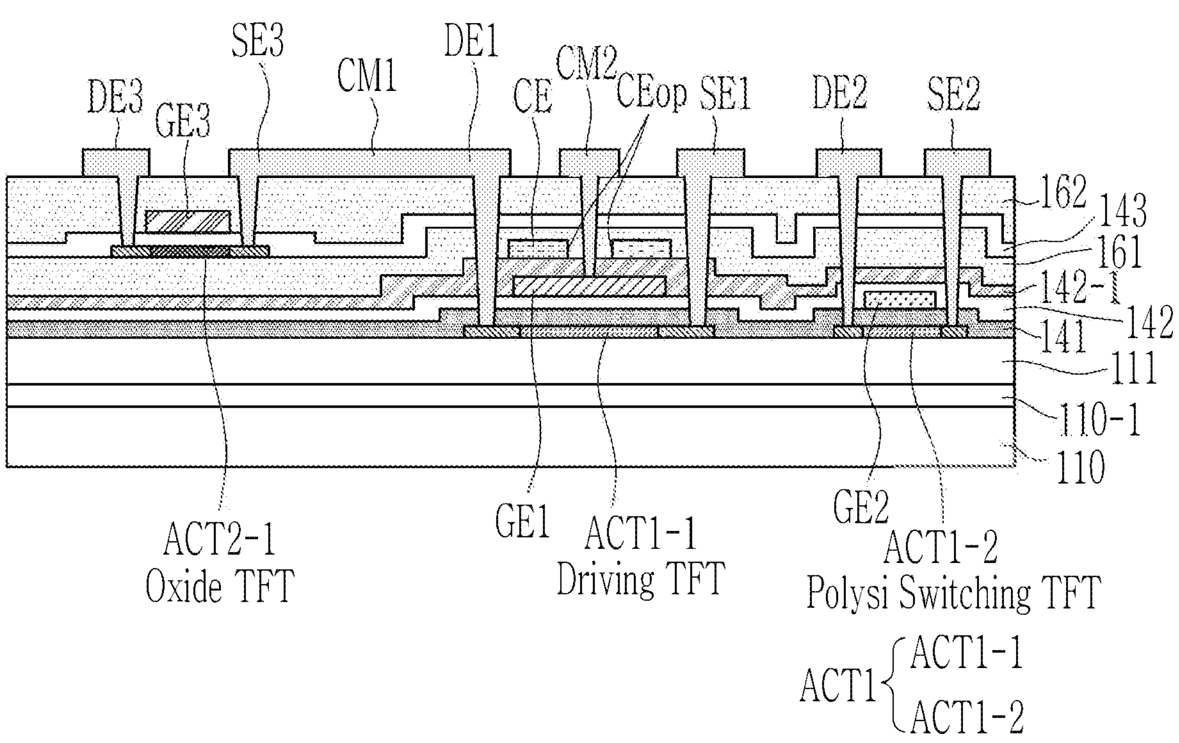
FIG. 7 is a schematic cross-sectional view of a part of a light emitting display device according to an embodiment.
Figure 8:
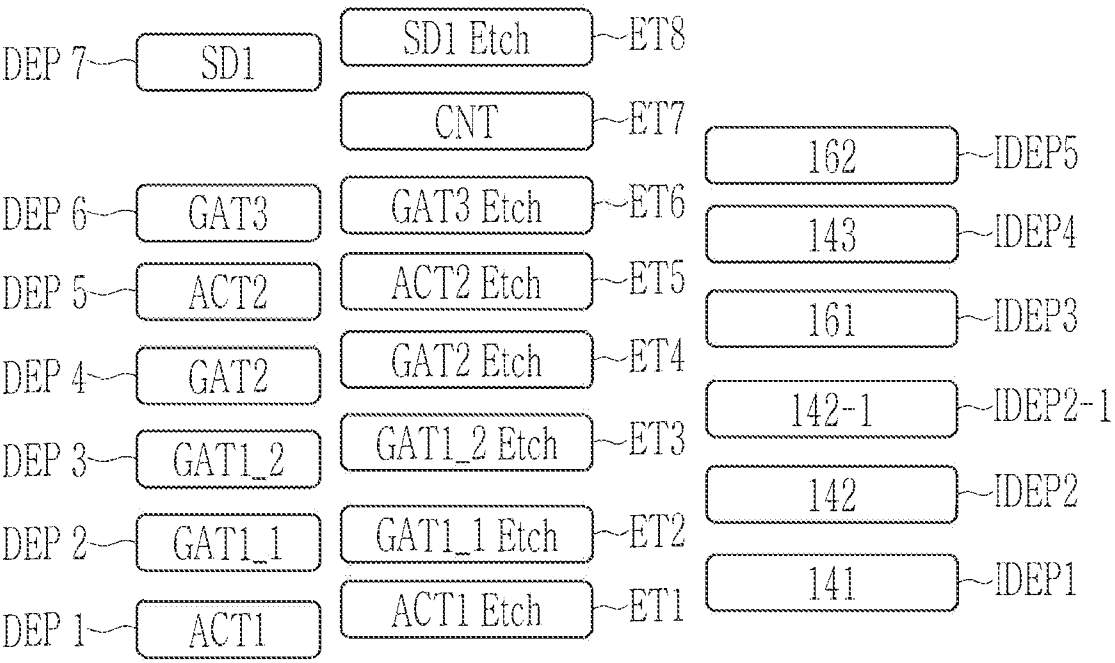
FIG. 8 schematically shows a manufacturing method of the light emitting display device according to the embodiment of FIG. 7.

FIG. 7 is a schematic cross-sectional view of a part of a light emitting display device according to an embodiment, and FIG. 8 schematically shows a manufacturing method of the light emitting display device according to the embodiment of FIG. 7.

Unlike the embodiment of FIGS. 2 and 3, in the embodiment of FIGS. 7 and 8, a gate electrode GE1 of a driving transistor T1 may be disposed on a second gate insulation layer 142, and an auxiliary second gate insulation layer 142-1 may be further included. As a result, the gate electrode GE1 of the driving transistor and a gate electrode GE2 of a polycrystalline switching transistor that may be comprised of different materials may be disposed on different layers.

A structure shown in FIGS. 7 and 8 will be described in detail hereinafter, and some contents overlapping the contents described with reference to FIGS. 2 and 3 will be omitted.

Referring to FIG. 7, a substrate 110, a barrier layer 110-1, and a buffer layer 111 may be sequentially formed. The barrier layer 110-1 may be disposed on the substrate 110, and depending on embodiments, the barrier layer 110-1 may be omitted.

The buffer layer 111 covering the barrier layer 110-1 may be disposed on the barrier layer 110-1. Depending on embodiments, a metal layer BML (refer to FIG. 11) may be disposed between the barrier layer 110-1 and the buffer layer 111.

A first semiconductor layer ACT1 comprised of a polycrystalline semiconductor (P-Si) may be disposed on the buffer layer 111. In FIG. 7, the first semiconductor layer ACT1 may be divided into semiconductor pattern ACT1-1 of the driving transistor T1 and the semiconductor pattern ACT1-2 of the polycrystalline switching transistor. Here, the polycrystalline switching transistor may be one of the second transistor T2, the fifth transistor T5, the sixth transistor T6, and the seventh transistor T7 of FIG. 1. Each of the semiconductor patterns ACT1-1 and ACT1-2 include a channel, and a first area and a second area that may be disposed at opposite sides of the channel. The first area and the second area have conductive electrical properties brought about by plasma treatment or doping and thus may serve as a first electrode and a second electrode of the polycrystalline transistor.

A first gate insulation layer 141 may be disposed on the first semiconductor layer ACT1. A 1_1 gate conductive layer GAT1_1 that includes a gate electrode GE2 of the polycrystalline switching transistor may be disposed on the first gate insulation layer 141.

The gate electrode GE2 of the polycrystalline switching transistor may be comprised of aluminum (Al) having low resistance, and may be embodied as a single layer or as multiple layers, respectively. In an embodiment, the gate electrode GE2 of the polycrystalline switching transistor may be a two-layered structure that includes a lower layer comprised of aluminum (Al) and an upper layer comprised of titanium (Ti). Here, the gate electrode GE2 comprised of aluminum (Al) that has a low resistance receives a scan signal having a sufficient voltage value even during high-speed driving at about 240 Hz as shown in FIG. 6B, and thus a problem of delay due to resistance does not occur.

A second gate insulation layer 142 may be disposed on the 1_1 gate conductive layer GAT1_1 and the first gate insulation layer 141. A 1_2 gate conductive layer GAT1_2 that includes the gate electrode GE1 of the driving transistor T1 may be disposed on the second gate insulation layer 142.

The gate electrode GE1 of the driving transistor T1 may be comprised of molybdenum (Mo), and the molybdenum (Mo) gate electrode GE1 of the driving transistor T1 has a property that dehydrogenation occurs readily during a manufacturing process such that the characteristics of the driving transistor may be constant as shown in FIG. 4.

After forming the 1_2 gate conductive layer GAT1_2, an exposed area of the semiconductor pattern ACT1-1 may be made conductive by performing plasma treatment or a doping process. For example, a portion of the semiconductor pattern ACT1-1 covered by the 1_1 gate conductive layer GAT1_1 and the 1_2 gate conductive layer GAT1_2 may remain non-conductive, and a portion of the semiconductor pattern ACT1-1 not covered by the 1_1 gate conductive layer GAT1_1 and the 1_2 gate conductive layer GAT1_2 may have electrical properties similar to that of a conductor.

An auxiliary second gate insulation layer 142-1 may be disposed on the 1_2 gate conductive layer GAT1_2 and the second gate insulation layer 142. The auxiliary second gate insulation layer 142-1 may be an inorganic insulation layer including a silicon oxide (SiOx), a silicon nitride (SiNx), a silicon oxynitride ($SiO_xN_y$), or a combination thereof.

A second gate conductive layer GAT2 including an upper (or first storage) electrode CE of the storage capacitor Cst may be disposed on the auxiliary second gate insulation layer 142-1. Upper electrode CE of the storage capacitor Cst may overlap the gate electrode GE1 of the driving transistor T1 to form the storage capacitor Cst, and upper electrode CE may have an opening CEop overlapping a portion of the gate electrode GE1 of the driving transistor T1. The second gate conductive layer GAT2 according to an embodiment may be a two-layered structure that includes a lower layer comprised of aluminum (Al) and an upper layer comprised of titanium (Ti).

A first interlayer insulation layer 161 may be disposed on the second gate conductive layer GAT2. A second semiconductor layer (i.e., oxide semiconductor layer) ACT2 including an oxide semiconductor pattern ACT2-1 includes a channel, a first area, and a second area may be disposed on the first interlayer insulation layer 161.

A third gate insulation layer 143 may be disposed on the second semiconductor layer ACT2. The third gate insulation layer 143 may be disposed on the entire surface of the second semiconductor layer ACT2 and the first interlayer insulation layer 161.

A third gate conductive layer GAT3 including a gate electrode GE3 of the oxide transistor may be disposed on the third gate insulation layer 143. The gate electrode GE3 of the oxide transistor may overlap the channel of oxide semiconductor pattern ACT2-1. The third gate conductive layer GAT3 may further include a scan line, a control line, or a combination thereof. The third gate conductive layer GAT3 according to an embodiment may be a single layer comprised of molybdenum (Mo).

After forming the third gate conductive layer GAT3 and patterning the same to form gate electrode GE3 of oxide transistor, an exposed portions of the semiconductor pattern ACT2 of oxide transistor may be made conductive by performing a plasma treatment or a doping process. For example, portions of the semiconductor pattern ACT2 covered by the gate electrode GE3 may remain non-conductive, while portions of the semiconductor pattern ACT2 not covered by the gate electrode GE3 may have electrical properties similar to that of a conductor.

A second interlayer insulation layer 162 may be disposed on the gate electrode GE3. A first data conductive layer SD1 including a connection electrode that can be electrically connected to the first area and the second area of each polycrystalline transistor and the oxide transistor may be disposed on the second interlayer insulation layer 162. An organic layer may be disposed on the first data conductive layer SD1, and an anode may be disposed on the organic layer. The above-stated structure of the first data conductive layer SD1 will later be described with reference to FIG. 11.

Such a structure of FIG. 7 may be formed using a manufacturing method of FIG. 8. In FIG. 8, a manufacturing method may be divided into lamination of the semiconductor or the conductors (DEP1 to DEPT), etching (ET1 to ET8), and lamination of the insulation layers (IDEP1 to IDEP5), and a step located at a lower position of FIG. 8 occurs first.

Specifically, in the manufacturing method of FIG. 8, the first semiconductor layer ACT1 may be laminated (DEP1), the first semiconductor ACT1 may be etched (ET1), and the first gate insulation layer 141 may be laminated (IDEP1). Thereafter, a 1-1 gate conductive layer GAT1_1 may be laminated (DEP2), a 1-1 gate conductive layer GAT1_1 may be etched (ET2), and a second gate insulation layer 142 may be laminated (IDEP2). The 1-2 gate conductive layer GAT1_2 may be laminated (DEP3), the 1-2 gate conductive layer GAT1_2 may be etched (ET3), and an auxiliary second gate insulation layer 142-1 may be laminated (IDEP2-1).

Here, the 1-1 gate conductive layer GAT1_1 may include the gate electrode GE2 of the polycrystalline switching transistor, and the 1-2 gate conductive layer GAT1_2 may include the gate electrode GE1 of the driving transistor. Depending on embodiments, the 1-1 gate conductive layer GAT1_1 may be a two-layered structure that includes a lower layer comprised of aluminum (Al) and an upper layer comprised of titanium (Ti), and the 1-2 gate conductive layer GAT1_2 may be comprised of molybdenum (Mo).

The second gate conductive layer GAT2 may be laminated (DEP4), the second gate conductive layer GAT2 may be etched (ET4), and the first interlayer insulation layer 161 may be laminated (IDEP3). The second semiconductor layer ACT2 may be laminated (DEP5), the second semiconductor layer ACT2 may be etched (ET5), and the third gate insulation layer 143 may be laminated (IDEP4). The third gate conductive layer GAT3 may be laminated (DEP6), the third gate conductive layer GAT3 may be etched (ET6), and the second interlayer insulation layer 162 may be laminated (IDEP5). Here, the second gate conductive layer GAT2 may be a two-layered structure that includes a lower layer comprised of aluminum (Al) and an upper layer comprised of titanium (Ti), and the third gate conductive layer GAT3 may be a single layer comprised of molybdenum (Mo).

A contact hole CNT may be formed in at least one of the first gate insulation layer 141, the second gate insulation layer 142, the auxiliary second gate insulation layer 142-1, the first interlayer insulation layer 161, the third gate insulation layer 143, and the second interlayer insulation layer 162. Here, the contact hole CNT may be divided into a first type and a second type of contact holes. The first type of contact hole may expose a portion of semiconductor pattern ACT1, the 1-1 gate conductive layer GAT1_1, the 1-2 gate conductive layer GAT1_2, and the second gate conductive layer GAT2. The second type of contact hole may expose a portion of semiconductor layer ACT2 and the third gate conductive layer GAT3. Depending on embodiments, the first type of contact holes and the second type of contact holes may be produced in different processes.

The first data conductive layerSD1 may be laminated (DEPT) and the first data conductive layerSD1 may be etched (ET8). A structure of an upper portion of the first data conductive layer SD1 will be described with reference to FIG. 11.

Figure 9:
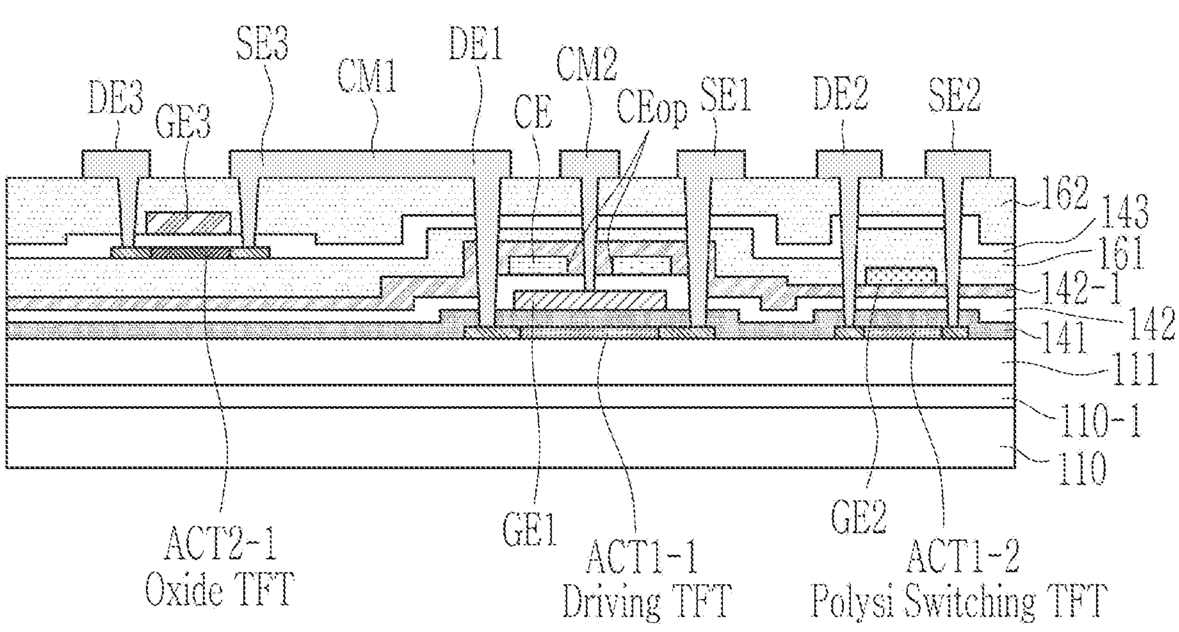
FIG. 9 is a schematic cross-sectional view of a part of a light emitting display device according to an embodiment.

Hereinafter, an embodiment will be described with reference to FIGS. 9 and 10. FIG. 9 is a schematic cross-sectional view illustrating a part of a light emitting display device according to an embodiment, and FIG. 10 schematically illustrates a method of manufacturing the light emitting display device according to the embodiment of FIG. 9.

Figure 10:
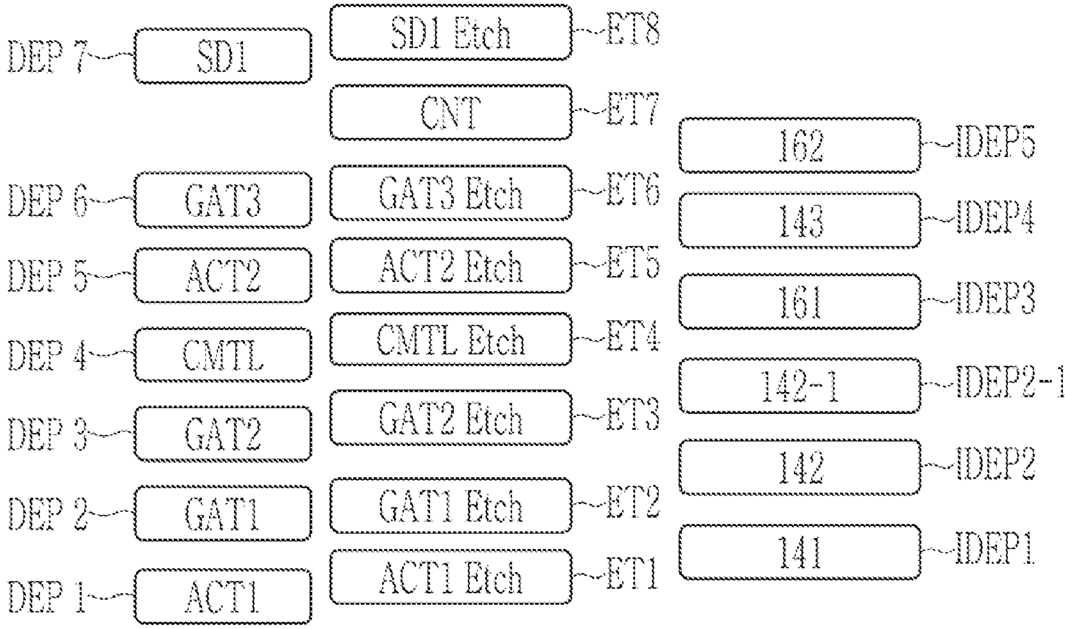
FIG. 10 schematically shows a manufacturing method of the light emitting display device according to the embodiment of FIG. 9.

Unlike the embodiment of FIGS. 2 and 3, in the embodiment of FIGS. 9 and 10, an auxiliary second gate insulation layer 142-1 may be further included, and the gate electrode GE2 of the polycrystalline switching transistor may be formed from an auxiliary conductive layer CMTL on the auxiliary second gate insulation layer 142-1. As a result, the gate electrode GE1 of the driving transistor and a gate electrode GE2 of a polycrystalline switching transistor that may be comprised of different materials may be disposed on different layers. Unlike the embodiment of FIGS. 7 and 8, in the embodiment of FIGS. 9 and 10, there may be a difference in that the gate electrode GE1 of the driving transistor may be disposed below the second gate insulation layer 142 and the gate electrode GE2 of the polycrystalline switching transistor may be disposed above the auxiliary second gate insulation layer 142-1 in a plan view.

A structure shown in FIGS. 9 and 10 will now be described in detail hereinafter, and some contents overlapping the contents described with reference to FIGS. 2 and 3 will be omitted. Referring to FIG. 9, a substrate 110, a barrier layer 110-1, and a buffer layer 111 may be sequentially formed. The barrier layer 110-1 may be disposed on the substrate 110, and depending on embodiments, the barrier layer 110-1 can be omitted.

The buffer layer 111 covering the barrier layer 110-1 may be disposed on the barrier layer 110-1. Depending on embodiments, a metal layer BML (refer to FIG. 11) may be disposed between the barrier layer 110-1 and the buffer layer 111.

A first semiconductor layer ACT1 comprised of a polycrystalline semiconductor (P-Si) may be disposed on the buffer layer 111. In FIG. 9, the first semiconductor layer ACT1 may be divided into semiconductor pattern ACT1-1 of the driving transistor T1 and the semiconductor pattern ACT1-2 of the polycrystalline switching transistor. Here, the polycrystalline switching transistor may be one of second transistor T2, the fifth transistor T5, the sixth transistor T6, and the seventh transistor T7 of FIG. 1. Each of the semiconductor patterns ACT1-1 and ACT1-2 includes a channel, and a first area and a second area that may be disposed at opposite sides of the channel. The first area and the second area may have conductive electrical characteristics due to plasma treatment or doping processes, and thus may serve as a first electrode and a second electrode of the polycrystalline transistor.

A first gate insulation layer 141 may be disposed on the first semiconductor layer ACT1. A first gate conductive layer GATT including a gate electrode GE1 of a driving transistor T1 may be disposed on the first gate insulation layer 141. The gate electrode GE1 of the driving transistor T1 may be comprised of molybdenum (Mo), and the molybdenum (Mo) gate electrode GE1 of the driving transistor T1 has a feature that dehydrogenation occurs readily during the manufacturing process such that the properties of the driving transistor may be constant as shown in FIG. 4.

A second gate insulation layer 142 may be disposed on the first gate conductive layer GAT1 and first gate insulation layer 141. A second gate conductive layer GAT2 including an upper or first storage electrode CE of the storage capacitor Cst may be disposed on the second gate insulation layer 142. Upper electrode CE of the storage capacitor Cst may overlap the gate electrode GE1 of the driving transistor to form the storage capacitor Cst, and upper electrode CE may have an opening CEop overlapping a portion of the gate electrode GE1 of the driving transistor T1. The second gate conductive layer GAT2 according to an embodiment may be a two-layered structure that includes a lower layer comprised of aluminum (Al) and an upper layer comprised of titanium (Ti).

An auxiliary second gate insulation layer 142-1 may be disposed on the second gate conductive layer GAT2 and the second gate insulation layer 142. The auxiliary second gate insulation layer 142-1 may be an inorganic insulation layer including a silicon oxide (SiOx), a silicon nitride (SiNx), a silicon oxynitride ($SiO_xN_y$), or a combination thereof.

An auxiliary conductive layer CMTL including a gate electrode GE2 of a polycrystalline switching transistor may be disposed on the auxiliary second gate insulation layer 142-1.

The gate electrode GE2 of the polycrystalline switching transistor may be comprised of aluminum (Al) that has a low resistance, and the gate electrode GE2 may be a single layer or multiple layers. In an embodiment, the gate electrode GE2 of the polycrystalline switching transistor may be a two-layered structure that includes a lower layer comprised of aluminum (Al) and an upper layer comprised of titanium (Ti). Here, the gate electrode GE2 of the polycrystalline switching transistor comprising aluminum (Al) having a low resistance property receives a scan signal having a sufficient voltage value even during high-speed driving of about 240 Hz as shown in FIG. 6B, and thus a problem of delay due to resistance does not occur.

After forming the auxiliary conductive layer CMTL, an exposed portion of the first semiconductor layer ACT1 may be made conductive by performing a plasma treatment or a doping process. For example, portions of first semiconductor layer ACT1 covered by the first gate conductive layer GAT1 and the auxiliary conductive layer CMTL may remain non-conductive, and portions of the first semiconductor layer ACT1 not covered by either the first gate conductive layer GAT1 or the auxiliary conductive layer CMTL may have properties similar to that of a conductor.

On the other hand, the auxiliary conductive layer CMTL may include a lower shielding layer BML (refer to FIG. 11) that may be disposed under the second semiconductor layer formed subsequently to maintain the characteristics of the oxide transistor.

A first interlayer insulation layer 161 may be disposed on the auxiliary conductive layer CMTL. A second semiconductor layer (oxide semiconductor layer) ACT2 including oxide semiconductor pattern ACT2-1 may be disposed on the first interlayer insulation layer 161, where oxide semiconductor pattern ACT2-1 includes a first area and a second area disposed on opposing sides of a channel.

A third gate insulation layer 143 may be disposed on the second semiconductor layer ACT2. The third gate insulation layer 143 may be disposed on the entire surface of the second semiconductor layer ACT2 and on the first interlayer insulation layer 161.

A third gate conductive layer GAT3 including a gate electrode GE3 of the oxide transistor may be disposed on the third gate insulation layer 143. The gate electrode GE3 of the oxide transistor may overlap the channel of oxide semiconductor pattern ACT2-1. The third gate conductive layer GAT3 may further include a scan line, a control line or both. The third gate conductive layer GAT3 according to an embodiment may be a single layer comprised of molybdenum (Mo).

After forming the third gate conductive layer GAT3, exposed portions of oxide semiconductor pattern ACT2-1 may be made conductive by performing a plasma treatment or a doping process. Portions of the oxide semiconductor pattern ACT2-1 covered by the third gate conductive layer GAT3 may remain non-conductive, and portions of semiconductor pattern ACT2 not covered by gate electrode GE3 may have electrical properties resembling a conductor.

A second interlayer insulation layer 162 may be disposed on the third gate conductive layer GAT3. A first data conductive layer SD1 including a connection electrode CM1 may be disposed on the second interlayer insulation layer 162 and be electrically connected to the first area and the second area of each polycrystalline transistor and the oxide transistor.

An organic layer may be disposed on the first data conductive layer SD1, and an anode may be disposed on the organic layer. The above-stated structure of the first data conductive layer SD1 will be described with reference to FIG. 11.

Such a structure of FIG. 9 may be formed using a manufacturing method of FIG. 10. In FIG. 10, a manufacturing method may be divided into lamination of the semiconductor or the conductor layers (DEP1 to DEPT), etching or patterning of the layers (ET1 to ET8), and lamination of the insulation layers (IDEP1 to IDEP5), and a step located in a lower position of FIG. 10 occurs first.

Specifically, in the manufacturing method of FIG. 10, the first semiconductor layer ACT1 may be laminated (DEP1), the first semiconductor layer ACT1 may be etched (ET1), and the first gate insulation layer 141 may be laminated (IDEP1).

The first gate conductive layer GAT1 may be laminated (DEP2), the first gate conductive layer GAT1 may be etched (ET2), and the second gate insulation layer 142 may be laminated (IDEP2). Thereafter, the second gate conductive layer GAT2 may be laminated (DEP5), the second gate conductive layer GAT2 may be etched (ET3), and an auxiliary second gate insulation layer 142-1 may be laminated (IDEP2-1). The auxiliary conductive layer CMTL may be laminated (DEP4), the auxiliary conductive layer CMTL may be etched (ET4), and the first interlayer insulation layer 161 may be laminated (IDEP3).

Here, the first gate conductive layer GAT1 includes a gate electrode GE1 of the driving transistor T1, the second gate conductive layer GAT2 includes an upper or first storage electrode CE of the storage capacitor Cst, and the auxiliary conductive layer CMTL may include a gate electrode GE2 of the polycrystalline switching transistor. Depending on embodiments, the first gate conductive layer GAT1 may be comprised of molybdenum (Mo), and the second gate conductive layer GAT2 and the auxiliary conductive layer CMTL may each be two-layered structures that each include a lower layer comprised of aluminum (Al) and an upper layer comprised of titanium (Ti). Depending on embodiments, the auxiliary conductive layer CMTL and the auxiliary second gate insulation layer 142-1 may instead be omitted, and the gate electrode GE2 of the polycrystalline switching transistor may instead be formed from the second gate conductive layer GAT2.

The second semiconductor layer ACT2 may be laminated (DEP5), the second semiconductor layer ACT2 may be etched (ET5), and the third gate insulation layer 143 may be laminated (IDEP4). The third gate conductive layer GAT3 may be laminated (DEP6), the third gate conductive layer GAT3 may be etched (ET6), and the second interlayer insulation layer 162 may be laminated (IDEP5). Here, the second gate conductive layer GAT2 may be a two-layered structure that includes a lower layer comprised of aluminum (Al) and an upper layer comprised of titanium (Ti), and the third gate conductive layer GAT3 may be a single layer comprised of molybdenum (Mo).

Next, a contact hole CNT may be formed in at least one of the first gate insulation layer 141, the second gate insulation layer 142, the auxiliary second gate insulation layer 142-1, the first interlayer insulation layer 161, the third gate insulation layer 143, and the second interlayer insulation layer 162 (ET7). Here, the contact hole CNT may be divided into a first type of contact hole and a second type of contact hole. The first type of contact hole may expose the first semiconductor layer ACT1, the second gate conductive layer GAT2, and an auxiliary conductive layer CMTL, and second type of contact hole may expose the second semiconductor layer ACT2 and the third gate conductive layer GAT3. Depending on embodiments, the first type of contact hole and the second type of contact hole may be produced in different processes.

The first data conductive layer SD1 may be laminated (DEPT) and the first data conductive layer SD1 may be etched (ET8).

Various variations have been described. The entire cross-sectional structure of a light emitting display device according to an embodiment will now be described with reference to FIG. 11.

Figure 11:
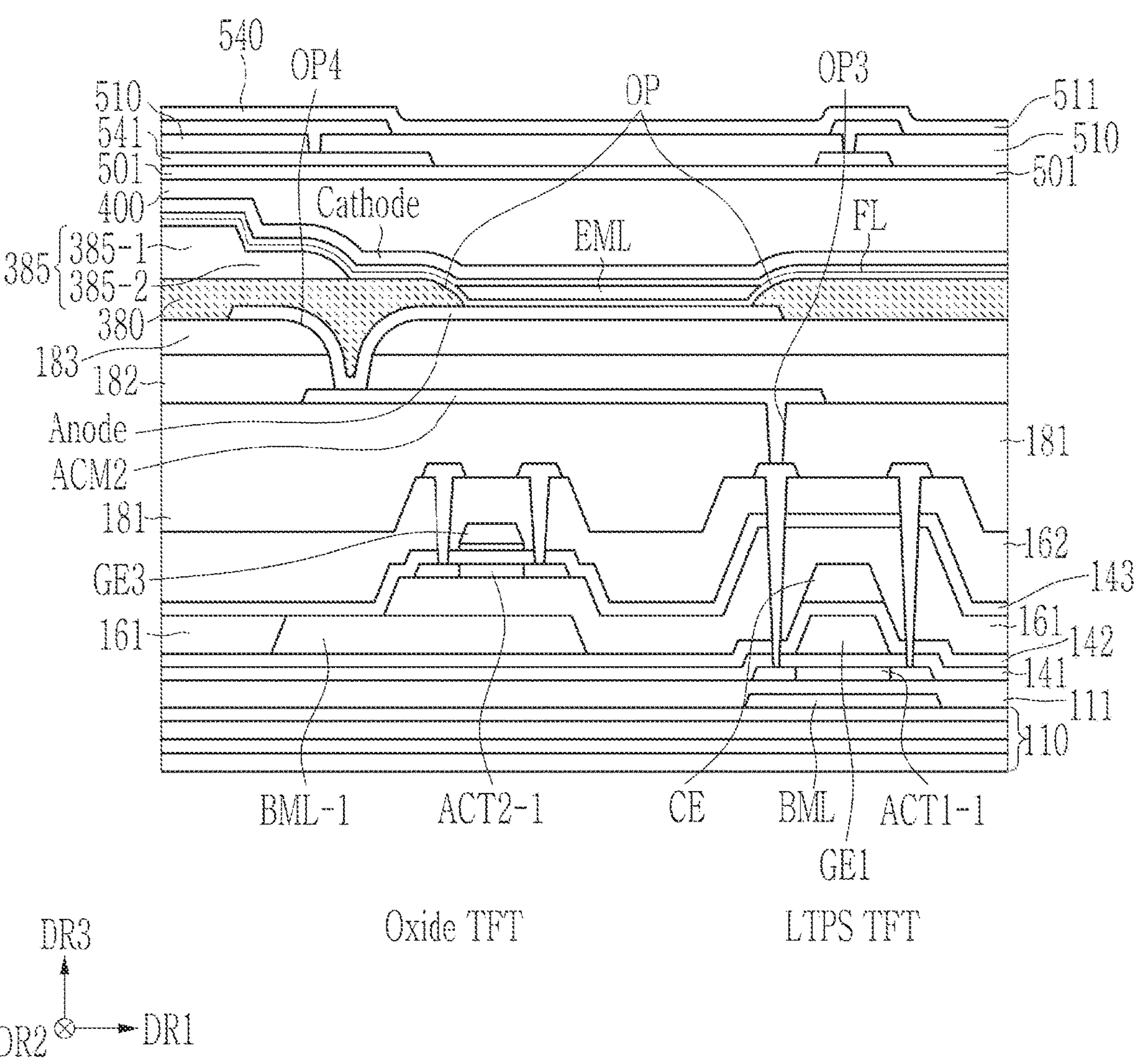
FIG. 11 shows a schematic cross-sectional structure of a light emitting display device according to an embodiment.

FIG. 11 shows a schematic cross-sectional structure of a light emitting display device according to an embodiment. In FIG. 11, an embodiment in which only a driving transistor T1 may be formed as a polycrystalline transistor, and a gate electrode GE1 of the driving transistor T1 may be disposed on a first gate insulation layer 141 as shown in FIG. 2, and an auxiliary second gate insulation layer 142-1 is omitted is illustrated. However, the embodiments of FIGS. 7 and 9 and variations can also be applied in a same way.

The entire structure of a light emitting display device will now be described hereinafter. A light emitting display device can be largely divided into a lower panel layer and an upper panel layer on opposing sides of encapsulation layer 400. The lower panel layer may be divided into a light emitting diode and a pixel circuit portion. The pixel circuit portion includes everything between substrate 110 and the combination of a second organic layer 182 and a third organic layer 183, and the light emitting diode portion may be disposed between encapsulation layer 400 and the combination of organic layers 182 and 183. A structure disposed above the encapsulation layer 400 may correspond to the upper panel layer, and may further include a color filter or color conversion layer depending on embodiments. Depending on embodiments, the third organic layer 183 may be omitted.

Referring to FIG. 11, a metal layer BML may be disposed on the substrate 110. The substrate 110 may include a material that has a rigid characteristic such as glass that does not bend, or may include a flexible material that can bend, such as plastic, polyimide, or both. In the case of a flexible substrate, a two-layered structure of a polyimide layer and a barrier layer comprised of an inorganic insulation material thereon may be implemented.

The metal layer BML may be disposed at a location overlapped by the channel of the semiconductor pattern ACT1-1 of driving transistor T1 in a plan view, and may also be referred to as a lower shielding layer. The metal layer BML may include a metal such as copper (Cu), molybdenum (Mo), aluminum (Al), or titanium (Ti), a metal alloy thereof, or a combination thereof. Here, the driving transistor T1 may refer to a transistor that generates a current that is transmitted to the light emitting diode LED.

A buffer layer 111 may be disposed on the substrate 110 and on the metal layer BML to cover them. The buffer layer 111 serves to prevent permeation of an impurity element into the semiconductor pattern ACT1-1, and may be an inorganic insulation layer comprising silicon oxide (SiOx), a silicon nitride (SiNx), a silicon oxynitride ($SiO_xN_y$), the like, or a combination thereof.

The semiconductor pattern ACT1-1 comprised of a silicon semiconductor (e.g., polycrystalline semiconductor (P-Si) may be disposed on the buffer layer 111. The semiconductor pattern ACT1-1 includes a first area and a second area disposed on both sides of a channel. Here, the polycrystalline transistor may be one of multiple polycrystalline switching transistors as well as a driving transistor T1. Portions having a conductive electrical properties due to a plasma treatment or a doping process may be provided at both sides of the channel of the semiconductor pattern ACT1-1 such that they may serve as a first electrode and a second electrode of the transistor.

A first gate insulation layer 141 may be disposed on the semiconductor pattern ACT1-1. The first gate insulation layer 141 may be an inorganic insulation layer including a silicon oxide (SiOx), a silicon nitride (SiNx), a silicon oxynitride ($SiO_xN_y$), or a combination thereof.

A first gate conductive layer GAT1 including a gate electrode GE1 of the polycrystalline transistor may be disposed on the first gate insulation layer 141. The first gate conductive layer GAT1 may form a scan line or a light emission control line in addition to the gate electrode GE1 of the polycrystalline transistor. Depending on embodiments, the first gate conductive layer GAT1 may actually be two layers comprised of different materials and may be divided into a 1_1 gate conductive layer and a 1_2 gate conductive layer.

After forming the first gate conductive layer GAT1, an exposed portions of the semiconductor pattern ACT1-1 can be made conductive by performing a plasma treatment or a doping process. Also, portions of the semiconductor pattern ACT1-1 covered by the gate electrode GE1 may remain non-conductive while portions of the semiconductor pattern ACT1-1 not covered by the gate electrode GE1 may have properties similar to that of a conductor.

A second gate insulation layer 142 may be disposed on the first gate conductive layer GAT1 and the first gate insulation layer 141. The second gate insulation layer 142 may be an inorganic insulation layer including a silicon oxide (SiOx), a silicon nitride (SiNx), a silicon oxynitride ($SiO_xN_y$), or a combination thereof.

A second gate conductive layer GAT2 including an upper (or first storage) electrode CE of the storage capacitor Cst may be disposed on the second gate insulation layer 142. Upper electrode CE of the storage capacitor Cst may overlap the gate electrode GE1 of the driving transistor T1 to form the storage capacitor Cst. Depending on embodiments, the second gate conductive layer GAT2 may further include a lower shielding layer BML-1 at a location corresponding to the oxide transistor. As in the embodiment of FIGS. 9-10, in case that the auxiliary conductive layer CMTL may be formed, the lower shielding layer BML-1 of the oxide transistor may be comprised of the auxiliary conductive layer CMTL. The lower shielding layer BML-1 of the oxide transistor may be disposed below the channel of the oxide transistor and may serve to shield the channel of semiconductor pattern ACT2-1 from light or electromagnetic interference (EMI) approaching from the lower side.

Depending on embodiments, the second gate conductive layer GAT2 may further include a scan line, a control line, a voltage line, or a combination thereof. The second gate conductive layer GAT2 may include a metal such as copper (Cu), molybdenum (Mo), aluminum (Al), titanium (Ti), a metal alloy thereof, or a combination thereof, and may be a single layer or multiple layers.

A first interlayer insulation layer 161 may be disposed on the second gate conductive layer GAT2. The first interlayer insulation layer 161 may include an inorganic insulation layer including a silicon oxide (SiOx), a silicon nitride (SiNx), a silicon oxynitride ($SiO_xN_y$), the like, or a combination thereof, and depending on embodiments, the inorganic insulation material may be formed to be thick. A second semiconductor layer (oxide semiconductor layer) ACT2 including an oxide semiconductor pattern ACT2-1 including a channel, a first area, and a second area may be disposed on the first interlayer insulation layer 161.

A third gate insulation layer 143 may be disposed on the semiconductor pattern ACT2-1. The third gate insulation layer 143 may be disposed on the entire surface of the second semiconductor layer ACT2 and the first interlayer insulation layer 161. The third gate insulation layer 143 may include an inorganic insulation layer including a silicon oxide (SiOx), a silicon nitride (SiNx), a silicon oxynitride ($SiO_xN_y$), the like, or a combination thereof.

A third gate conductive layer GAT3 including a gate electrode GE3 of an oxide transistor may be disposed on the third gate insulation layer 143. The gate electrode GE3 of the oxide transistor may overlap the channel of oxide semiconductor pattern ACT2-1. The third gate conductive layer GAT3 may further include scan lines, control lines, or both. The third gate conductive layer GAT3 may include a metal such as copper (Cu), molybdenum (Mo), aluminum (Al), titanium (Ti), a metal alloy thereof, or a combination thereof, and may be a single layer or multiple layers.

A second interlayer insulation layer 162 may be disposed on the third gate conductive layer GAT3. The second interlayer insulation layer 162 may have a single layer or multi-layer structure. The second interlayer insulation layer 162 may include an inorganic insulation material including a silicon oxide (SiOx), a silicon nitride (SiNx), a silicon oxynitride ($SiO_xN_y$), the like, or a combination thereof, and may include an organic material depending on embodiments.

A first data conductive layer SD1 including a connection electrode that can be electrically connected to a first area and a second area of each polycrystalline transistor and the oxide transistor may be disposed on the second interlayer insulation layer 162. The first data conductive layer SD1 may include a metal such as aluminum (Al), copper (Cu), molybdenum (Mo), titanium (Ti), a metal alloy thereof, or a combination thereof, and may be a single layer or multiple layers.

The first organic layer 181 may be disposed on the first data conductive layer SD1 that includes the connection electrode. The first organic layer 181 may be an organic insulator including an organic material, and the organic material may include at least one material selected from a group consisting of polyimide, polyamide, acryl resin, benzocyclobutene, phenol resin, and a combination thereof.

A second data conductive layer including an anode connection electrode ACM2 may be disposed on the first organic layer 181. The second data conductive layer may include a data line, a driving voltage line, or both. The second data conductive layer may include a metal such as aluminum (Al), copper (Cu), molybdenum (Mo), titanium (Ti), a metal alloy thereof, or a combination thereof, and may be a single layer or multiple layers. The anode connection electrode ACM2 may be electrically connected to the first data conductive layer SD1 through an opening OP3 disposed on the first organic layer 181.

The second organic layer 182 and the third organic layer 183 may be disposed on the second data conductive layer, and an opening OP4 for anode connection may be formed in the second organic layer 182 and in the third organic layer 183 on the second data conductive layer. The anode connection electrode ACM2 may be electrically connected to an anode Anode through the opening OP4 for anode connection. The second organic layer 182 and the third organic layer 183 may be organic insulators and may include a material selected from a group consisting of polyimide, polyamide, acryl resin, benzocyclobutene, phenol resin, and a combination thereof. Depending on embodiments, the third organic layer 183 may be omitted.

A pixel definition layer 380 covering at least a part of the anode Anode while having an opening OP exposing the anode Anode may be disposed on the anode Anode. The pixel definition layer 380 may be comprised of a black organic material to prevent externally applied light from being reflected back to the outside, or may be comprised of a transparent organic material, depending on embodiments.

A spacer 385 may be disposed on the pixel definition layer 380. The spacer 385 may be comprised of a transparent organic insulation material. Depending on embodiments, the spacer 385 may be comprised of a transparent organic material of a positive type. The spacer 385 may include two portions 385-1 and 385-2 with different heights, a portion with a higher height 385-1 serves as a spacer, and a portion with a lower height 385-2 may improve the adhesion characteristics between the spacer and the pixel definition layer 380.

A functional layer FL and a cathode Cathode may be sequentially formed on the anode Anode, the spacer 385, and the pixel definition layer 380, and the functional layer FL and the cathode Cathode may be disposed in the entire region. An emission layer EML may be disposed between the functional layers FL, and the emission layer EML may only be disposed within an opening OP of the pixel definition layer 380. Hereinafter, the functional layer FL and the emission layer EML together may be referred to as an intermediate layer. The functional layer FL may include at least one of an electron injection layer, an electron transport layer, a hole transport layer, and a hole injection layer, and the hole injection layer and the hole transport layer may be disposed below the emission layer EML and the electron transport layer and the electron injection layer may be disposed on the emission layer EML.

An encapsulation layer 400 may be disposed on the cathode Cathode. The encapsulation layer 400 includes at least one inorganic layer and at least one organic layer, and may have a three-layer structure including a first inorganic encapsulation layer, an organic encapsulation layer, and a second inorganic encapsulation layer. The encapsulation layer 400 may be provided for protecting the emission layer EML from moisture or oxygen that may inflow from the outside. Depending on embodiments, the encapsulation layer 400 may include a structure in which an inorganic layer and an organic layer may be sequentially stacked on each other.

Sensing insulation layers 501, 510, and 511 and sensing electrodes 540 and 541 may be disposed for touch sensing on the encapsulation layer 400. In the embodiment of FIG. 11, a touch can be sensed in a capacitance type sensor using two sensing electrodes 540 and 541.

Specifically, a first sensing insulation layer 501 may be formed on the encapsulation layer 400, and the sensing electrodes 540 and 541 may be formed thereon. The sensing electrodes 540 and 541 may be insulated from each other by including a second sensing insulation layer 510 interposed therebetween, and some sensing electrodes may be electrically connected through openings disposed in the sensing insulation layer 510. Here, the sensing electrodes 540 and 541 include metals such as aluminum (Al), copper (Cu), silver (Ag), gold (Au), molybdenum (Mo), titanium (Ti), tantalum (Ta), metal alloys thereof, or a combination thereof, and may be a single layer or multiple layers. A third sensing insulation layer 511 may be formed on the sensing electrode 540.

Although no configuration may be illustrated on the third sensing insulation layer 511 in FIG. 11, a film containing a polarizer may be attached to reduce reflection of external light, or a color filter or color conversion layer may be further formed to improve color quality. A light blocking layer may be disposed between the color filter or the color conversion layer. Depending on embodiments, a layer in which a material that can absorb some wavelength of external light (hereinafter referred to as a reflection control material) may also be further included. Depending on embodiments, the entire surface of the light emitting display device may be flattened by covering with an auxiliary organic layer (also referred to as a planarization layer).

In FIG. 11, organic layers 181, 182, and 183 may be formed as a total of three, and the embodiment in which the opening OP4 for electrically connecting the anode may be formed in the second organic layer and the third organic layer has been described. However, the organic layer may be formed as at least two, and the opening for connecting the anode may be disposed in the upper organic layer disposed furthest away from the substrate, and the lower organic layer opening may be disposed on the lower organic layer.

Such a structure of FIG. 11 corresponds to the embodiment of FIGS. 2 and 3, but it may be equally applied to FIGS. 7-10, which may be a variation example, except for a modified portion. Hereinabove, aluminum (Al) has been described as a low-resistance material, but it may not be limited thereto, and copper (Cu) may be used depending on embodiments.

The invention described below may be applied to various light emitting display devices, and in the following, an embodiment of one of various pixel structures will be described with reference to FIG. 12. FIG. 12 shows a schematic diagram of an equivalent circuit of a pixel included in a light emitting display device according to an embodiment.

A pixel according to an embodiment includes transistors T1, T2, T3, T4, T5, T6, and T7 electrically connected to wires 127, 128, 151, 152, 153, 155, 171, 172, and 741, a storage capacitor Cst, a boost capacitor $C_{boost}$, and a light emitting diode LED. Here, the transistor and the capacitor except for the light emitting diode LED form a pixel circuit portion. Depending on embodiments, the boost capacitor $C_{boost}$ may be omitted. Depending on embodiments, an auxiliary capacitor or an auxiliary boost capacitor may be formed.

Wires 127, 128, 151, 152, 153, 155, 171, 172, and 741 may be electrically connected to the pixel PX. The wires include a first initialization voltage line 127, a second initialization voltage line 128, a first scan line 151, a second scan line 152, an initialization control line 153, a light emission control line 155, a data line 171, a driving voltage line 172, and a common voltage line 741.

The first scan line 151 may be electrically connected to a scan driver (not shown) and transmits a first scan signal GW to the second transistor T2 and the seventh transistor T7. A voltage of opposite polarity and at a same time as a voltage applied to the first scan line 151 may be applied to the second scan line 152. For example, in case that a voltage of negative polarity may be applied to the first scan line 151, a voltage of positive polarity may be applied to the second scan line 152. The second scan line 152 transmits the second scan signal GC to the third transistor T3. The initialization control line 153 transmits the initialization control signal GI to the fourth transistor T4. The light emission control line 155 transmits a light emission control signal EM to the fifth transistor T5 and the sixth transistor T6.

The data line 171 may be a wire that transmits a data voltage DATA generated by a data driver (not shown), and accordingly, the magnitude of the light emitting current transmitted to the light emitting diode LED changes, and thus the luminance emitted by the light emitting diode LED also changes. The driving voltage line 172 applies a driving voltage ELVDD. The first initialization voltage line 127 transmits a first initialization voltage VINT, and the second initialization voltage line 128 transmits a second initialization voltage VAINT. The common voltage line 741 applies a common voltage ELVSS to a cathode of the light emitting diode LED. In the embodiment, voltages applied to the driving voltage line 172, the first and second initialization voltage lines 127 and 128, and the common voltage line 741 may be constant voltages.

The driving transistor T1 (also referred to as a first transistor) may be a P-type transistor, and has a silicon semiconductor (hereinafter also referred to as a polycrystalline semiconductor or semiconductor pattern ACT1-1) formed from a first semiconductor layer ACT1 as an active layer. The driving transistor T1 controls the intensity of the light emitting current output to the anode of the light emitting diode LED according to the magnitude of the voltage (i.e., a voltage stored in the storage capacitor Cst) of the gate electrode of the driving transistor T1. Since the brightness of the light emitting diode LED may be adjusted according to the magnitude of the light emitting current output from the anode of the light emitting diode LED, the light emitting luminance of the light emitting diode LED can be adjusted according to the data voltage DATA applied to the pixel. For this purpose, the first electrode of the driving transistor T1 may be disposed to receive the driving voltage ELVDD, and may be electrically connected to the driving voltage line 172 via the fifth transistor T5. The first electrode of the driving transistor T1 may also be electrically connected to the second electrode of the second transistor T2 to receive the data voltage DATA. A second electrode of the driving transistor T1 outputs the light emitting current to the light emitting diode LED, and may be electrically connected to the anode of the light emitting diode LED via the sixth transistor T6 (hereinafter referred to as an output control transistor). The second electrode of the driving transistor T1 may also be electrically connected to the third transistor T3 to transfer the data voltage DATA applied to the first electrode of the first transistor T1 to the third transistor T3. The gate electrode of the driving transistor T1 may be electrically connected to an electrode (hereinafter referred to as a second storage electrode or lower electrode) of the storage capacitor Cst. Another electrode (hereinafter referred to as a first storage electrode or upper electrode CE) of the storage capacitor Cst receives the driving voltage ELVDD. Accordingly, the voltage of the gate electrode of the driving transistor T1 changes according to the voltage stored in the storage capacitor Cst, and the light emitting current output by the driving transistor T1 changes accordingly. The storage capacitor Cst serves to keep the voltage of the gate electrode of the driving transistor T1 constant during a frame. The gate electrode of the driving transistor T1 may also be electrically connected to the third transistor T3 such that the data voltage DATA applied to the first electrode of the driving transistor T1 may be transmitted to the gate electrode of the driving transistor T1 via the third transistor T3. The gate electrode of the driving transistor T1 may also be electrically connected to the fourth transistor T4 and can be initialized by receiving the first initialization voltage VINT by way of the fourth transistor T4.

The second transistor T2 may be a P-type transistor that has a silicon semiconductor as a semiconductor layer. The second transistor T2 may be the transistor that brings the data voltage DATA into the pixel. The gate electrode of the second transistor T2 may be electrically connected to an electrode (hereinafter referred to as a lower boost electrode) of the first scan line 151 and the boost capacitor $C_{boost}$. Another electrode of the boost capacitor $C_{boost}$ may be electrically connected to the gate electrode of the driving transistor T1 and the second storage electrode (or lower electrode) of the storage capacitor Cst. The first electrode of the second transistor T2 may be electrically connected to the data line 171, and the second electrode of the second transistor T2 is connected to the first electrode of the driving transistor T1. In case that the second transistor T2 is turned on by a negative polarity voltage of the first scan signal GW transmitted through the first scan line 151, the data voltage DATA transmitted through the data line 171 may be transmitted to the first electrode of the driving transistor T1 so that the data voltage DATA may be transmitted to the gate electrode of the driving transistor T1 and stored in the storage capacitor Cst by way of the third transistor T3.

The third transistor T3 may be an N-type transistor and has an oxide semiconductor (hereinafter referred to as a semiconductor pattern ACT2-1) formed from a semiconductor layer ACT2. The third transistor T3 electrically connects the second electrode of driving transistor T1 to the gate electrode of driving transistor T1. The third transistor T3 may be a transistor that stores the data voltage DATA in the second storage electrode (i.e., lower electrode) of the storage capacitor Cst after being compensated by a threshold voltage of the driving transistor T1. The gate electrode of the third transistor T3 may be electrically connected to the second scan line 152, and the first electrode of the third transistor T3 may be electrically connected to the second electrode of the driving transistor T1. The second electrode of the third transistor T3 may be electrically connected with the second storage electrode of the storage capacitor Cst, the gate electrode of the driving transistor T1, the other electrode of the boost capacitor $C_{boost}$ (hereinafter referred to as an upper boost electrode). The third transistor T3 may be turned on by the positive voltage of the second scan signal GC transmitted through the second scan line 152 to electrically connect the gate electrode of the driving transistor T1 and the second electrode of the driving transistor T1, and to electrically connect the gate electrode of the driving transistor T1 to the gate electrode of the driving transistor T1, and the voltage applied to the gate electrode of the driving transistor T1 may be transmitted to the second storage electrode of the storage capacitor Cst and stored in the storage capacitor Cst. As a result, the voltage of the gate electrode of the driving transistor T1 in case that the driving transistor T1 may be turned off may be stored in the storage capacitor Cst in such a manner that a threshold voltage Vth of the driving transistor T1 may be compensated.

The fourth transistor T4 may be an N-type transistor and has an oxide semiconductor as a semiconductor layer. The fourth transistor T4 serves to initialize the gate electrode of the driving transistor T1 and the second storage electrode of the storage capacitor Cst. The gate electrode of the fourth transistor T4 may be electrically connected to the initialization control line 153, and the first electrode of the fourth transistor T4 may be electrically connected to the first initialization voltage line 127. The second electrode of the fourth transistor T4 may be electrically connected to the second electrode of the third transistor T3, the second storage electrode of the storage capacitor Cst, the gate electrode of the driving transistor T1, and the upper boost electrode of the boost capacitor $C_{boost}$. The fourth transistor T4 may be turned on by the voltage of the positive polarity among the initialization control signal GI received through the initialization control line 153. The first initialization voltage VINT may be applied to the gate electrode of the driving transistor T1, the second storage electrode of the storage capacitor Cst, and the upper boost electrode of the boost capacitor $C_{boost}$ for initialization upon the fourth transistor T4 being turned on.

The fifth transistor T5 and the sixth transistor T6 may be P-type transistors and have a silicon semiconductor as a semiconductor layer.

The fifth transistor T5 serves to transmit the driving voltage ELVDD to the driving transistor T1. A gate electrode of the fifth transistor T5 may be electrically connected to the light emission control line 155, a first electrode of the fifth transistor T5 may be electrically connected to the driving voltage line 172, and a second electrode of the fifth transistor T5 may be electrically connected to the first electrode of the driving transistor T1.

The sixth transistor T6 serves to transmit the light emitting current output from the driving transistor T1 to the light emitting diode LED. A gate electrode of the sixth transistor T6 may be electrically connected to the light emission control line 155, a first electrode of the sixth transistor T6 may be electrically connected to the second electrode of the driving transistor T1, and a second electrode of the sixth transistor T6 may be electrically connected to the anode of the light emitting diode LED.

Figure 13:
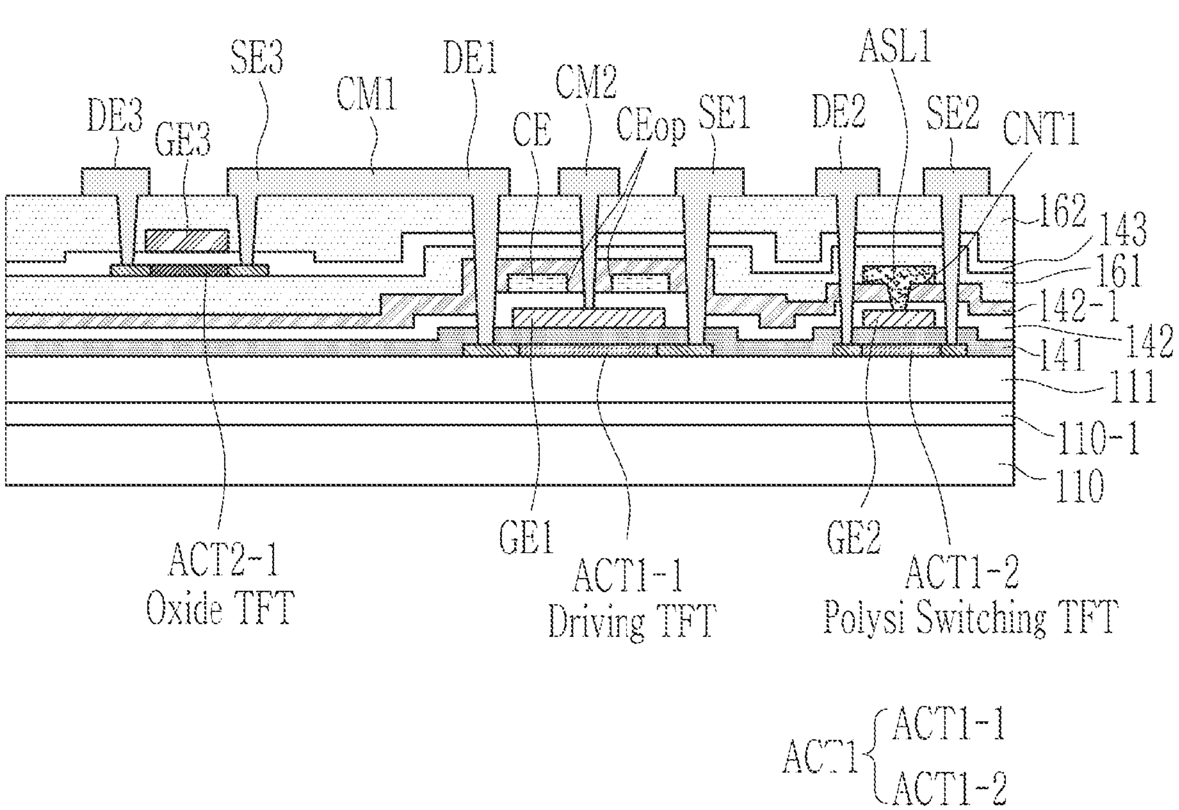
FIG. 13 is a schematic cross-sectional view of a part of a light emitting display device according to the embodiment.

The seventh transistor T7 may be a P-type or N-type transistor, and may have a silicon semiconductor or oxide semiconductor as a semiconductor layer, and in an embodiment of FIG. 13, the seventh transistor T7 may be a P-type transistor and includes a silicon semiconductor. The seventh transistor T7 serves to initialize the anode of the light emitting diode LED. A gate electrode of the seventh transistor T7 may be electrically connected to the first scan line 151, a first electrode of the seventh transistor T7 may be electrically connected to the anode of the light emitting diode LED, and a second electrode of the seventh transistor T7 may be electrically connected to the second initialization voltage line 128. Here, the gate electrode of the seventh transistor T7 may be electrically connected to the first scan line 151 of the previous pixel, and may not be electrically connected to the first scan line 151 that may be the same as the gate electrode of the second transistor T2 included in the same pixel PX but electrically connected to the first scan line 151 that may be the same as the gate electrode of the second transistor T2 of the previous pixel PX. In case that the seventh transistor T7 may be turned on by the negative polarity voltage of the first scan line 151, the second initialization voltage VAINT may be applied to the anode of the light emitting diode LED and initialized. Meanwhile, the gate electrode of the seventh transistor T7 may be electrically connected to a separate bypass control line through which a bypass signal GB may be transmitted, and may be controlled with a separate wire from the first scan line 151. Depending on embodiments, the second initialization voltage line 128 to which the second initialization voltage VAINT may be applied may be the same as the first initialization voltage line 127 to which the first initialization voltage VINT may be applied.

It has been described that a pixel PX includes seven transistors T1 to T7 and two capacitors (the storage capacitor Cst and the boost capacitor $C_{boost}$), but may not be limited thereto, and depending on embodiments, the boost capacitor $C_{boost}$ may instead be excluded. Depending on embodiments, an auxiliary boost capacitor may be formed between the gate electrode of the third transistor T3 and the gate electrode of the driving transistor T1. Although the third transistor and the fourth transistor may be formed of N-type transistors, only one of them may be formed of N-type transistors or other transistors (e.g., the seventh transistor, etc.) may be formed of N-type transistors.

As described above, the pixel of the light emitting display device includes two types of semiconductors (or active layers of thin film transistors) disposed on different layers, and the two types of semiconductors may be respectively polycrystalline semiconductor (also called a semiconductor layer ACT1) and oxide semiconductor (also called a semiconductor layer ACT2). Each of these may be included in a transistor. Hereinafter, a transistor including a polycrystalline semiconductor pattern may be referred to as a polycrystalline transistor, and a transistor including an oxide semiconductor pattern may be referred to as an oxide transistor.

As such, a pixel may include a polycrystalline transistor and an oxide transistor, and the driving transistor T1 providing a driving current to the light emitting diode LED may be a polycrystalline transistor. All other transistors except for the driving transistor T1 may also be called switching transistors, and switching transistors can be divided into polycrystalline switching transistors and oxide switching transistors.

Hereinafter, a schematic cross-sectional view of a light emitting display device according to an embodiment will be described with reference to FIG. 13. FIG. 13 is a schematic cross-sectional view of a part of a light emitting display device according to the embodiment.

Hereinafter, referring to FIG. 13, a cross-sectional view of a light emitting display device according to the embodiment will be described. Here, a polycrystalline switching transistor may be one of the second transistor T2, the fifth transistor T5, the sixth transistor T6, and the seventh transistor T7 of FIG. 12, and an oxide switching transistor may be one of the third transistor T3 and the fourth transistor T4 of FIG. 12. Depending on examples, the seventh transistor T7 may be an oxide switching transistor.

Referring to FIG. 13, a substrate 110, a barrier layer 110-1, and a buffer layer 111 may be sequentially formed. The substrate 110 may include a material that has a rigid characteristic such as glass and does not bend, or may include a flexible material that can bend, such as plastic or polyimide. The barrier layer 110-1 may be disposed on the substrate 110, and depending on embodiments, the barrier layer 110-1 may be omitted.

The buffer layer 111 covering the barrier layer 110-1 may be disposed on the barrier layer 110-1. The buffer layer 111 serves to block penetration of impurity elements into the first semiconductor layer ACT1 from substrate 110, and may be an inorganic insulation layer including a silicon oxide (SiOx), a silicon nitride (SiNx) a silicon oxynitride ($SiO_xN_y$), or a combination thereof. Depending on embodiments, a metal layer (refer to BML in FIG. 25) may be formed between the barrier layer 110-1 and the buffer layer 111.

A first semiconductor layer ACT1 formed of polycrystalline semiconductor (P-Si) may be disposed on the buffer layer 111. In FIG. 13, the first semiconductor layer ACT1 includes a semiconductor pattern of a driving transistor ACT1-1 (hereinafter referred to as a semiconductor pattern of a driving transistor) and a semiconductor pattern of a polycrystalline switching transistor ACT1-2 (a first semiconductor for a polycrystalline switching transistor). Here, the polycrystalline switching transistor may be one of the second transistor T2, the fifth transistor T5, the sixth transistor T6, and the seventh transistor T7 of FIG. 12. Each semiconductor pattern formed from first semiconductor layer ACT1 includes a first area and a second area disposed on both sides of a channel. The first area and second area each have a conductive electrical properties due to a plasma treatment or a doping process, and may serve as a first electrode and a second electrode of a polycrystalline transistor.

A first gate insulation layer 141 may be disposed on the first semiconductor layer ACT1. The first gate insulation layer 141 may be an inorganic insulation layer including a silicon oxide (SiOx), a silicon nitride (SiNx), a silicon oxynitride ($SiO_xN_y$), or a combination thereof.

A first gate conductive layer GAT1 including gate electrodes GE1 and GE2 of the polycrystalline transistors may be disposed on the first gate insulation layer 141. The first gate conductive layer GAT1 is divided into a gate electrode GE1 of driving transistor and a gate electrode GE2 of polycrystalline switching transistor.

Figure 16:
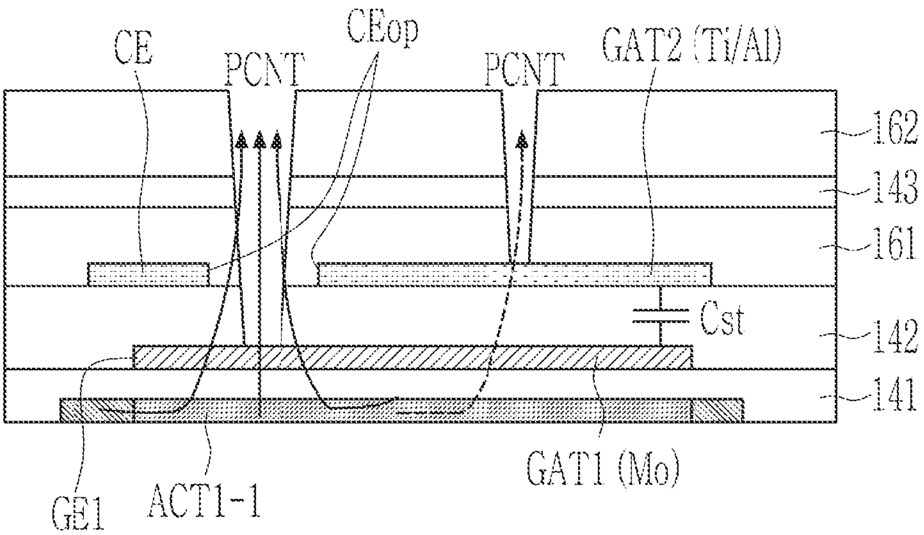
FIG. 16 and FIG. 17 show comparison of differences between a comparative example and an embodiment.

Unlike the embodiment of FIGS. 1-2, in the embodiment of FIG. 13, the gate electrode GE1 of the driving transistor and the gate electrode GE2 of the polycrystalline switching transistor may be comprised of a same material. More specifically, the gate electrode GE1 of the driving transistor and the gate electrode GE2 of the polycrystalline switching transistor may each be comprised of molybdenum (Mo) and each may be a single layer or multiple layers. In the arrangement of FIG. 13, the gate electrode GE1 of the driving transistor and the gate electrode GE2 of the polycrystalline switching transistor may each be a single layer comprised of molybdenum (Mo). Here, the molybdenum (Mo) gate electrodes GE1 and GE2 of the driving transistor have a feature that dehydrogenation occurs readily during the manufacturing process such that the properties of the driving transistor may be constant as shown in FIG. 16, and it may be possible to generate a constant output current by making the properties of the driving transistor constant.

After forming the first gate conductive layer GAT1, an exposed area of the first semiconductor layer ACT1 may be made conductive by performing a plasma treatment or doping process. For example, portions of the first semiconductor layer ACT1 covered by the first gate conductive layer GAT1 may remain non-conductive while portions of the first semiconductor layer ACT1 not covered by the first gate conductive layer GAT1 may have the same electrical characteristics as a conductive material.

A second gate insulation layer 142 may be disposed on the first gate conductive layer GAT1 and the first gate insulation layer 141. The second gate insulation layer 142 may be an inorganic insulation layer including a silicon oxide (SiOx), a silicon nitride (SiNx), a silicon oxynitride ($SiO_xN_y$), or a combination thereof.

A second gate conductive layer GAT2 including an upper (or second storage) electrode CE of the storage capacitor Cst may be disposed on the second gate insulation layer 142. Upper electrode CE of the storage capacitor Cst may overlap the gate electrode GE1 of the driving transistor to form the storage capacitor Cst, and an opening or through hole CEop may be disposed in upper electrode CE at a location that overlaps or corresponds to a portion of the gate electrode GE1 of the driving transistor T1. Depending on embodiments, the second gate conductive layer GAT2 may further include a scan line, a control line, or a voltage line. In the embodiment of FIG. 13, the second gate conductive layer GAT2 which may include the upper electrode CE of storage capacitor Cst may include a metal such as copper (Cu), molybdenum (Mo), aluminum (Al), or titanium (Ti), a metal alloy thereof, or a combination thereof, and may be a single layer or multiple layers. The second gate conductive layer GAT2 according to an embodiment of FIG. 13 may be a single layer comprised of molybdenum (Mo). Also unlike the embodiment of FIG. 2, the embodiment of FIG. 13 further includes an auxiliary second gate insulation layer 142-1 disposed on the second gate conductive layer GAT2. The auxiliary second gate insulation layer 142-1 may be an inorganic insulation layer including a silicon oxide (SiOx), a silicon nitride (SiNx), a silicon oxynitride ($SiO_xN_y$), or a combination thereof.

Unlike the embodiment of FIG. 2, the embodiment of FIG. 13 further includes an auxiliary conductive layer CMTL including an auxiliary signal line ASL1 disposed on the auxiliary second gate insulation layer 142-1. The auxiliary signal line ASL1 may be electrically connected to the gate electrode GE2 of the polycrystalline switching transistor through a contact hole disposed in the second gate insulation layer 142 and the auxiliary second gate insulation layer 142-1. The auxiliary signal line ASL1 includes a low-resistance material such as aluminum (Al), copper (Cu), or a combination thereof, and the auxiliary signal line ASL1 according to the embodiment may be a two-layered structure that includes a lower layer comprised of aluminum (Al) and an upper layer comprised of titanium (Ti). Referring to FIG. 18, in case that molybdenum (Mo) instead is used, there may be a disadvantage in that signal delay occurs when driven at about 240 Hz Therefore in FIG. 13, auxiliary signal line ASL1 comprised of a low-resistance conductor such as aluminum, copper, or a combination thereof that may be electrically connected to the gate electrode GE2 of the polycrystalline switching transistor such that a scan signal having a sufficient voltage value may be transmitted even in case that driving at a high speed of about 240 Hz, and a problem of delay due to resistance does not occur.

A first interlayer insulation layer 161 may be disposed on the auxiliary conductive layer. The first interlayer insulation layer 161 may include an inorganic insulation layer containing a silicon oxide (SiOx), a silicon nitride (SiNx), or a silicon oxynitride ($SiO_xN_y$), and depending on embodiments, an inorganic insulation material may be formed to be thick.

A second semiconductor layer ACT2 for an oxide transistor may be disposed on first interlayer insulating layer 161 and may include an oxide semiconductor pattern ACT2-1 that includes a first area disposed on an opposing side of a channel area from a second.

A third gate insulation layer 143 may be disposed on the second semiconductor layer ACT2. The third gate insulation layer 143 may be disposed on the entire surface of the second semiconductor layer ACT2 and on first interlayer insulation layer 161. The third gate insulation layer 143 may include an inorganic insulation layer including a silicon oxide (SiOx), a silicon nitride (SiNx), a silicon oxynitride ($SiO_xN_y$), or a combination thereof.

A third gate conductive layer GAT3 including a gate electrode GE3 of an oxide transistor (or oxide switching transistor) may be disposed on the third gate insulation layer 143. The gate electrode GE3 of the oxide transistor may overlap the channel of oxide semiconductor pattern ACT2-1. The third gate conductive layer may further include a scan line or a control line. The third gate conductive layer may include a metal such as copper (Cu), molybdenum (Mo), aluminum (Al), or titanium (Ti), a metal alloy thereof, or a combination thereof and may be formed of a single layer or multiple layers. The third gate conductive layer GAT3 according to an embodiment may be a single layer of molybdenum (Mo).

After forming the third gate conductive layer GAT3, an exposed portion of the second semiconductor pattern ACT2-1 may be made conductive by performing a plasma treatment or doping process. For example, portions of the semiconductor pattern ACT2-1 covered by the third gate conductive layer GAT3 is not conductive, and a portion of the semiconductor pattern ACT2-1 not covered by the third gate conductive layer GAT3 may have electrical properties similar to that of a conductive material.

A second interlayer insulation layer 162 may be disposed on the third gate conductive layer GAT3. The second interlayer insulation layer 162 may be either a single layer or multi-layer structure. The second interlayer insulation layer 162 may include an inorganic insulation material including a silicon oxide (SiOx), a silicon nitride (SiNx), a silicon oxynitride ($SiO_xN_y$), the like, or a combination thereof and may include an organic material depending on embodiments.

A first data conductive layer SD1 including a connection electrode that can be electrically connected to a first area and a second area of each of the polycrystalline transistor and the oxide transistor may be disposed on the second interlayer insulation layer 162.

In FIG. 13, the first data conductive layer SD1 includes a connection electrode SE1 electrically connected with the first area of the driving transistor T1, a connection electrode DE1 electrically connected to the second area of the driving transistor, a connection electrode (or second connection electrode) CM2 electrically connected to the gate electrode GE1 of the driving transistor, connection electrodes SE2 and DE2 respectively electrically connected with the first area and the second area of the polycrystalline switching transistor, and connection electrodes SE3 and DE3 respectively electrically connected to the first area and the second area of the oxide switching transistor, and the connection electrode SE3 electrically connected to the first area of the oxide switching transistor and the connection electrode DE1 electrically connected to the second area of the driving transistor may be integral with each other to form the connection electrode CM1. That is, the first semiconductor ACT1-1 for the driving transistor and the semiconductor pattern ACT2-1 for the oxide switching transistor may be electrically connected to each other by the connection electrode CM1.

The first data conductive layer may include a metal such as aluminum (Al), copper (Cu), molybdenum (Mo), or titanium (Ti), or a metal alloy thereof, and may be formed of a single layer or multiple layers.

An organic layer may be disposed on the first data conductive layer, and an anode can be disposed on the organic layer. The above-stated structure of the first data conductive layer will be described later with reference to FIG. 25.

Hereinabove, the cross-section structure was described, and hereinafter a schematic planar structure of the polycrystalline switching transistor will be described, focused on the auxiliary signal line ASL1 through FIG. 14.

Figure 14:
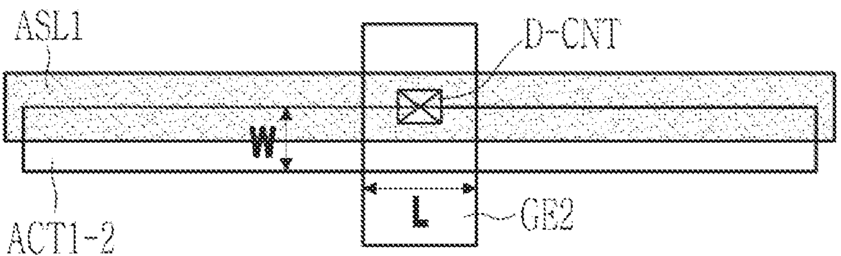
FIG. 14 is a plan view of a part of the light emitting display device according to the embodiment of FIG. 13.

FIG. 14 is a plan view of a part of the light emitting display device according to the embodiment of FIG. 13. Referring to FIG. 14, semiconductor pattern ACT1-2 of the polycrystalline switching transistor extends in one direction, the gate electrode GE2 of the polycrystalline switching transistor extends in a direction perpendicular thereto, and the auxiliary signal line ASL1 extends in a direction perpendicular to the gate electrode GE2 of the polycrystalline switching transistor. The auxiliary signal line ASL1 and the gate electrode GE2 of the polycrystalline switching transistor may be electrically connected through an opening D-CNT. The auxiliary signal line ASL1 extends into a non-display area of the light emitting display device and may receive a scan signal from a scan driver (not shown). On the contrary, the semiconductor pattern ACT1-2 and the gate electrode GE2 of the polycrystalline switching transistor may only be disposed in one pixel. Since the direction of each part (ASL1, GE2, ACT1_2) shown in FIG. 14 is an arrangement direction according to an embodiment, parts ASL1, GE2 and ACT1_2 may instead be arranged in a direction different from that shown in FIG. 14.

Figure 15:
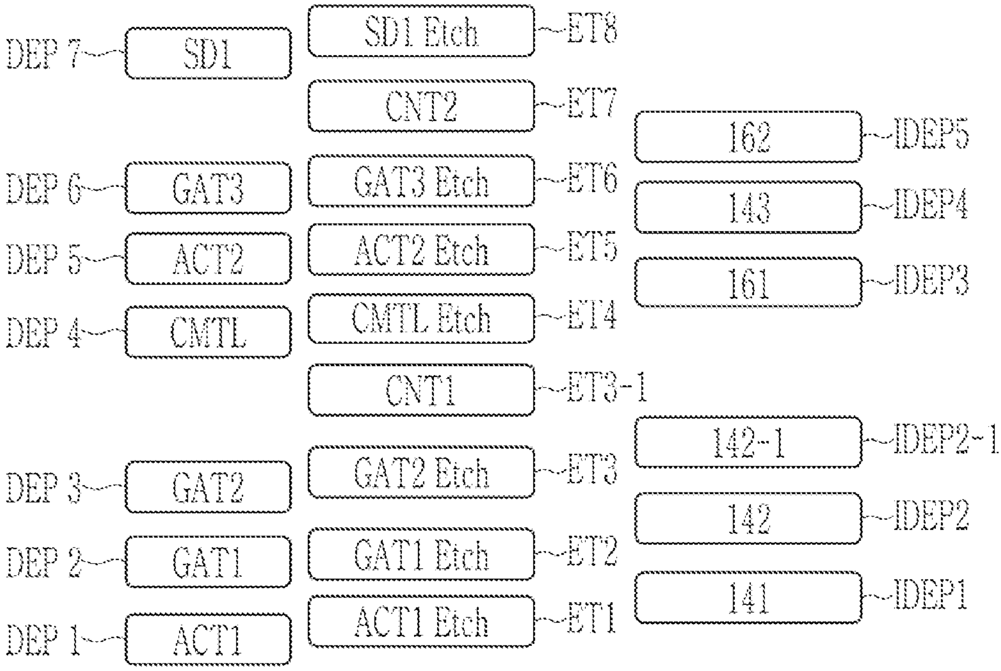
FIG. 15 is a schematic diagram illustrating a manufacturing method of the light emitting display device according to the embodiment of FIG. 13.

Such a structure of FIGS. 13-14 may be formed using a manufacturing method shown in FIG. 15. FIG. 15 is a schematic diagram illustrating a manufacturing method of the light emitting display device according to the embodiment of FIG. 13. In FIG. 15, semiconductor or conductor lamination DEP1 to DEPT steps, etching or patterning ET1 to ET8 steps, and insulating film lamination IDEP1 to IDEP5 steps may be shown, and the steps located at the lower portions of FIG. 15 occur first.

Specifically, according to the manufacturing method of FIG. 15, the first semiconductor layer ACT1 may be laminated (DEP1), the first semiconductor layer ACT1 may be etched (ET1), and the first gate insulation layer 141 may be laminated.

The first gate conductive layer GAT1 may be laminated (DEP2), the first gate conductive layer GAT1 may be etched (ET2), and the second gate insulation layer 142 may be laminated (IDEP2). Here, the gate electrode GE1 of the driving transistor and the gate electrode GE2 of the polycrystalline switching transistor included in the first gate conductive layer GAT1 may all be comprised of a same material and this material may be molybdenum (Mo).

The second gate conductive layer GAT2 may be laminated (DEP3), the second gate conductive layer GAT2 may be etched (ET3), and the auxiliary second gate insulation layer 142-1 may be laminated (DEP2-1). Here, the second gate conductive layer GAT2 may include various metals, and the second gate conductive layer GAT2 according to an embodiment may be comprised of molybdenum (Mo).

Next, an auxiliary contact hole CNT1 may be formed in the second gate insulation layer 142 and in the auxiliary second gate insulation layer 142-1 (ET3-1). The gate electrode GE2 of the polycrystalline switching transistor may be exposed by the auxiliary contact hole CNT1.

The auxiliary conductive layer CMTL may be laminated (DEP4), the auxiliary conductive layer CMTL may be etched (ET4), and the first interlayer insulation layer 161 may be laminated (IDEP3). Here, the auxiliary conductive layer CMTL may include a low-resistance metal, and may be a two-layered structure of which a lower layer may be comprised of aluminum (Al) and an upper layer may be comprised of titanium (Ti).

The second semiconductor layer ACT2 may be laminated (DEP5), the second semiconductor layer ACT2 may be etched (ET5), and the third gate insulation layer 143 may be laminated (IDEP4). The third gate conductive layer GAT3 may be laminated (DEP6), the third gate conductive layer GAT3 may be etched (ET6), and the second interlayer insulation layer 162 may be laminated (IDEP5). The third gate conductive layer GAT3 may include various metals, and may be a single layer comprised of molybdenum (Mo).

A contact hole CNT2 may be formed in at least one of the first gate insulation layer 141, the second gate insulation layer 142, the auxiliary second gate insulation layer 142-1, the first interlayer insulation layer 161, the third gate insulation layer 143, and the second interlayer insulation layer 162 (ET7). Here, the contact hole CNT2 may be divided into a first type of contact hole and a second type of contact hole. The first type of contact hole may expose first semiconductor layer ACT1, the first gate conductive layer GAT1, the second gate conductive layer GAT2, and the auxiliary conductive layer CMTL. The second type of contact hole may expose a portion of the second semiconductor layer ACT2 and the third gate conductive layer GAT3. Depending on embodiments, the first type of contact hole and the second type of contact hole may be formed in different processes.

The first data conductive layer SD1 may be laminated (DEPT), and the first data conductive layer SD1 may be etched (ET8). An upper structure of the first data conductive layer SD1 will later be described with reference to FIG. 25.

Figure 17:
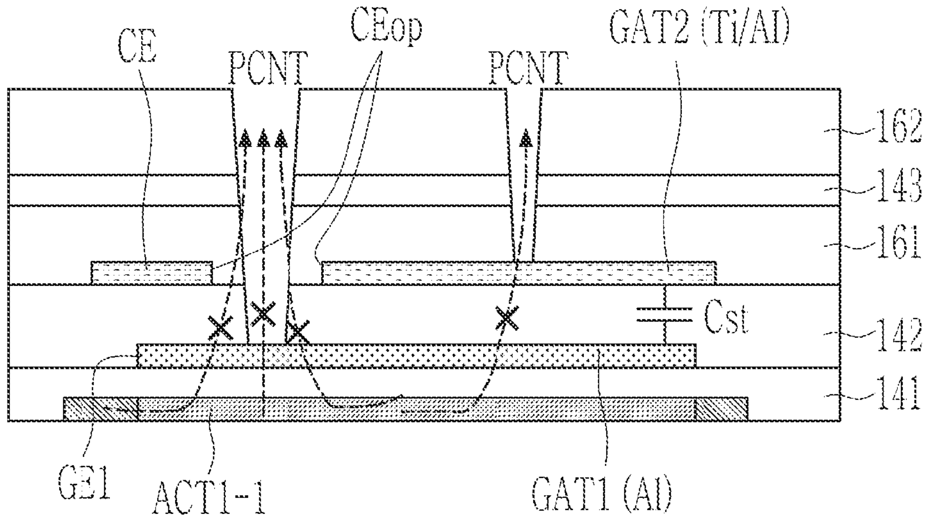

Hereinafter, referring to FIGS. 16 and 17, the features of the case where the gate electrode GE1 of the driving transistor may be comprised of molybdenum (Mo) will be compared to a comparative example respectively. FIGS. 16 and 17 show comparison of differences between a an embodiment and a comparative example respectively. FIG.

16 shows an embodiment in which a gate electrode GE1 of a driving transistor T1 may be comprised of molybdenum (Mo), and FIG. 17 is a comparative example in which a gate electrode of a driving transistor may be comprised of aluminum (Al), which may be a low-resistive metal.

According to the comparative example of FIG. 17, hydrogen existing inside a semiconductor pattern ACT1-1 cannot be removed to the outside through an opening (PCNT) formed in an insulation layers due to the gate electrode being comprised of aluminum (Al). On the contrary and according to the embodiment of FIG. 16, the gate electrode GE1 of the driving transistor T1 is comprised of molybdenum (Mo) that does not prevent the hydrogen existing inside semiconductor pattern ACTT-1 from being discharged to the outside through the opening PCNT. As a result, the dehydrogenation phenomenon of the semiconductor pattern ACT1-1 occurs sufficiently, and thus a driving range of the driving transistor T1 may be secured constantly, and the electrical properties of the driving transistor also has the properties of being constant.

Figure 18A:
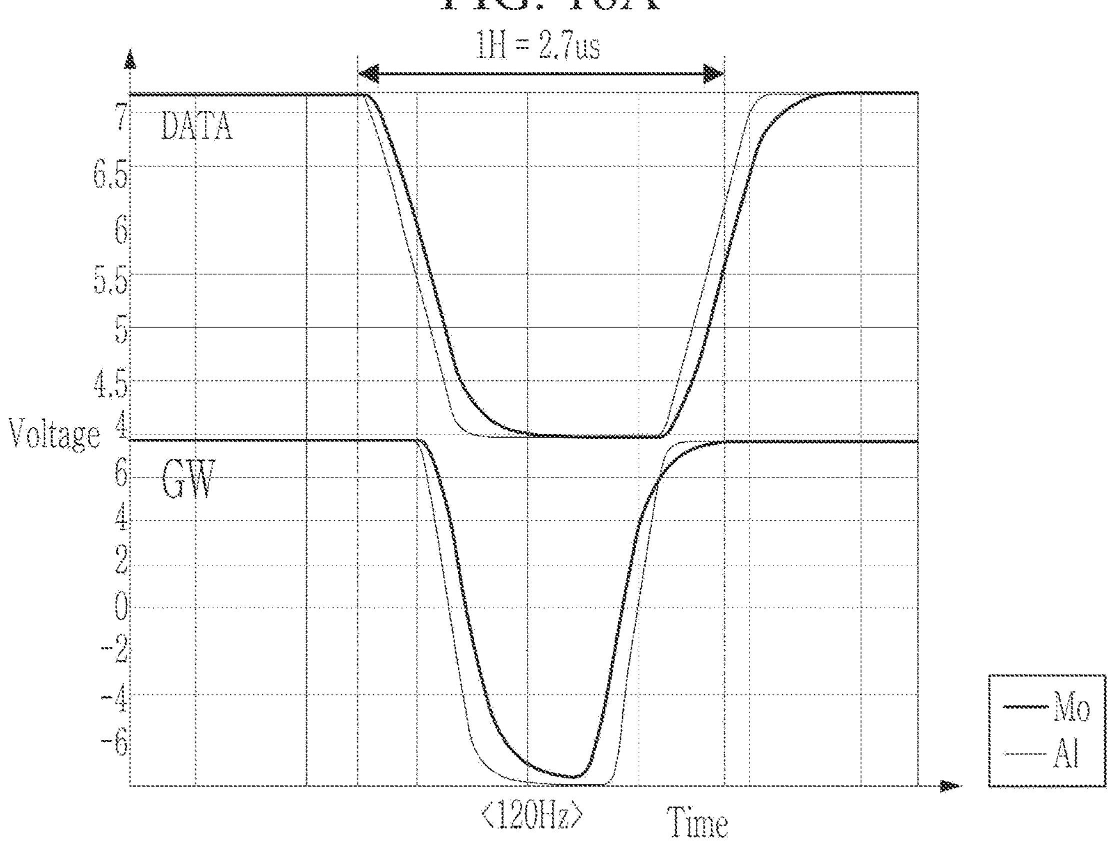
FIGS. 18A and 18B show a change in a scan voltage according to frequency in the light emitting display device according to the embodiment.
Figure 18B:
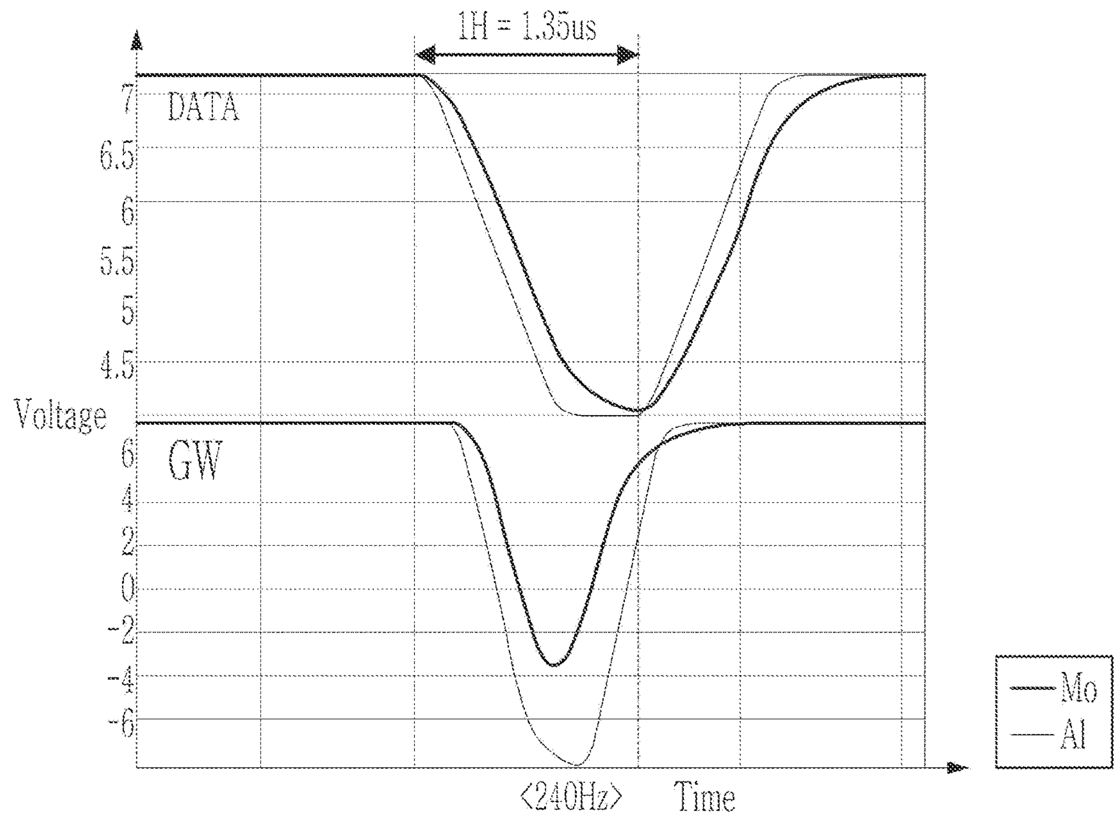

In case that the gate electrode may be comprised of molybdenum (Mo), there are drawbacks that can occur during high-speed driving, and this will be described with reference to FIGS. 18A and 18B. FIGS. 18A and 18B show a change in a scan voltage according to frequency in the light emitting display device according to the embodiment. In case that the gate electrode is comprised of molybdenum (Mo), there may be drawbacks that can occur during high-speed driving, and this will be described with reference to FIGS. 18A and 18B. FIG. 18A illustrates a case of driving at a driving frequency of about 120 Hz, and FIG. 18B illustrates a case of driving at a driving frequency of about 240 Hz.

Referring to FIG. 18A, it can be confirmed that at a driving frequency of about 120 Hz, whether the signal line is comprised of molybdenum (Mo) or aluminum (Al), both scan signals GW have a voltage below a certain level for a certain period of time and may be driven at about 120 Hz without any problem.

However, referring to FIG. 18B where the driving frequency is about 240 Hz, the scan signal GW transmitted to the signal line comprised of aluminum (Al) has a voltage below a certain level for a certain period of time, and thus there may be no problem in driving at about 240 Hz, but the voltage of the scan signal GW transmitted to the signal line comprised of molybdenum (Mo) may not be sufficiently low, and thus it may be difficult to operate as a scan signal, and in case that it is driven at about 240 Hz, a problem occurs in that the data voltage DATA may not be sufficiently charged. Therefore, in the embodiment in which the gate electrode GE2 of the polycrystalline switching transistor may be comprised of molybdenum (Mo) and the signal applied is about 240 Hz or equivalent high-speed driving, an auxiliary low-resistance signal line ASL1 may be additionally included such that the signal may not be delayed, thereby enabling high-speed driving at about 240 Hz. Here, the auxiliary signal line ASL1 includes a low-resistance material such as aluminum (Al) copper (Cu), or a combination thereof, and the auxiliary signal line ASL1 according to an embodiment may be a two-layered structure that includes a lower layer comprised of aluminum (Al) and an upper layer comprised of titanium (Ti).

Referring to FIGS. 16, 18A and 18B, the gate electrode GE1 of the driving transistor T1, which may be one of the polycrystalline transistors, may be comprised of molybdenum (Mo) to facilitate dehydrogenation, and the gate electrode GE2 of at least one of the polycrystalline switching transistors may also be comprised of molybdenum (Mo), but the auxiliary signal line ASL1 may also be included that is comprised of a low resistance material such as aluminum or copper that electrically connects to the gate electrode GE2 such that the problem of signal delay and charge rate degradation does not occur even at a high frequency of about 240 Hz.

Figure 19:
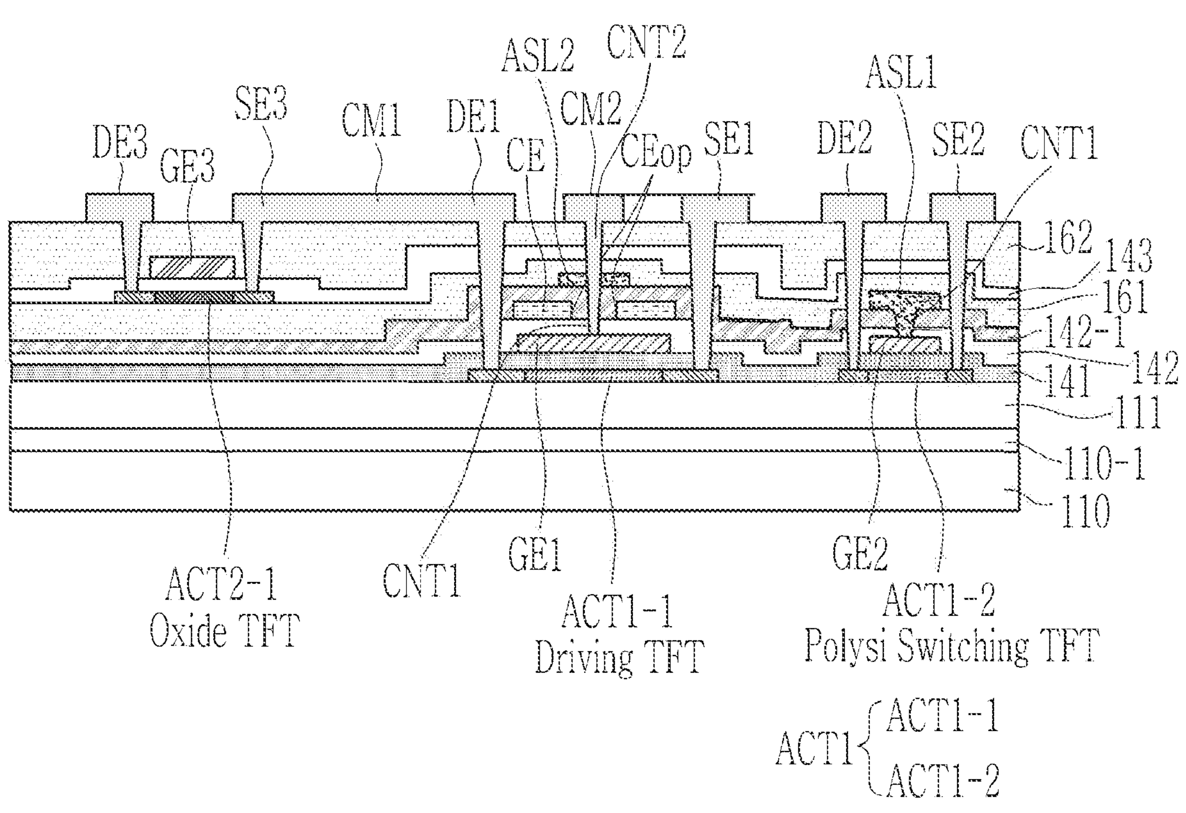
FIG. 19 is a schematic cross-sectional view of a part of a light emitting display device according to an embodiment.

Hereinafter, variations other than FIGS. 13 and 15 will be described with reference to FIGS. 19 to 24, and an embodiment of FIGS. 19 and 20 will be described first. FIG. 19 is a schematic cross-sectional view of a part of a light emitting display device according to an embodiment, and FIG. 20 schematically shows a manufacturing method of the light emitting display device according to the embodiment of FIG. 19.

Figure 20:
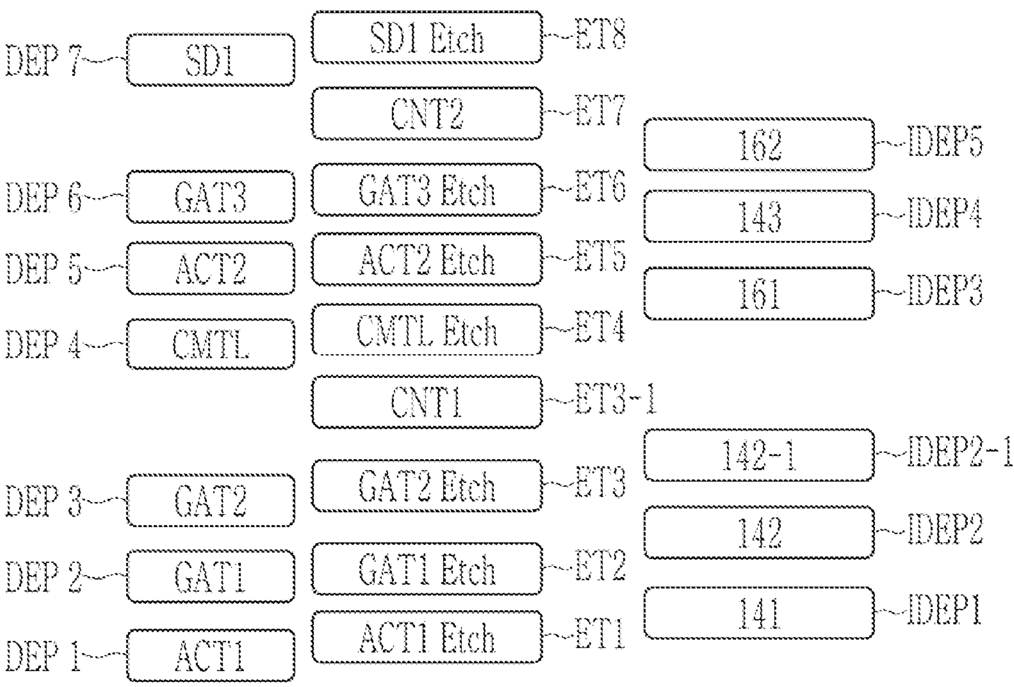
FIG. 20 schematically shows a manufacturing method of the light emitting display device according to the embodiment of FIG. 19.

Unlike the embodiment of FIGS. 13 and 15, in the embodiment of FIGS. 19 and 20, an auxiliary connection electrode ASL2 may be further included in the auxiliary conductive layer CMTL, and the gate electrode GE1 and the connection electrode CM2 of the driving transistor T1 may be electrically connected through the auxiliary connection electrode ASL2.

Referring to FIG. 19 and unlike the arrangement of FIG. 13, the auxiliary connection electrode ASL2 may be further included in addition to the auxiliary signal line ASL1 in the auxiliary conductive layer CMTL disposed on the auxiliary second gate insulation layer 142-1. The auxiliary connection electrode ASL2 may be electrically connected to the gate electrode GE1 of the driving transistor through a contact hole disposed in the second gate insulation layer 142 and the auxiliary second gate insulation layer 142-1. The auxiliary connection electrode ASL2, like the auxiliary signal line ASL1, includes a low-resistance material such as aluminum (Al) copper (Cu), or a combination thereof, and the auxiliary connection electrode ASL2 according to the embodiment may be a two-layered structure that includes a lower layer comprised of aluminum (Al) and an upper layer comprised of titanium (Ti).

The auxiliary connection electrode ASL2 may be covered by the first interlayer insulation layer 161, the third gate insulation layer 143, and the second interlayer insulation layer 162, and may be electrically connected to the second connection electrode CM2 that belongs to the first data conductive layer SD1 through a contact hole formed in first interlayer insulation layer 161, the third gate insulation layer 143, and the second interlayer insulation layer 162. As a result, the gate electrode GE1 of the driving transistor T1 and the second connection electrode CM2 may be electrically connected to the auxiliary connection electrode ASL2.

The embodiment of FIGS. 19-20 may be similar to the embodiment of FIGS. 13 and 15 in overall processes, and thus FIGS. 15 and 20 may be a same process. Differences between the embodiment of FIG. 20 as compared to FIG. 15 are as follows.

In forming the auxiliary contact hole CNT1 (ET3-1) of FIG. 20, the auxiliary contact hole CNT1 may be disposed in the second gate insulating film 142 and the auxiliary second gate insulating film 142-1 to connect to gate electrode GE1 of driving transistor T1, and thus not only the gate electrode GE2 of the polycrystalline switching transistor but also the gate electrode GE1 of the driving transistor may be exposed.

The auxiliary conductive layer CMTL may be laminated (DEP4), and not only the auxiliary signal line ASL1 but also the auxiliary connection electrode ASL2 may be formed in etching of the auxiliary conductive layer CMTL (ET4). The auxiliary connection electrode ASL2 may be electrically connected to the gate electrode GE1 of the driving transistor through auxiliary contact hole CNT1 in the second gate insulation layer 142 and in the auxiliary second gate insulation layer 142-1.

In forming the contact hole CNT2 (ET7), an upper surface of the auxiliary connection electrode ASL2 may be exposed by the contact hole CNT2 at a location where the connection electrode CM2 will be formed. The connection electrode CM2 may be formed from lamination of the first data conductive layer SD1 (DEPT) and by etching of the first data conductive layer SD1 (ET8). As a result, the connection electrode CM2 and the auxiliary connection electrode ASL2 may be electrically connected, and the auxiliary connection electrode ASL2 may be electrically connected to the gate electrode GE1 of the driving transistor such that the connection electrode CM2 can be electrically connected to the gate electrode GE1 of the driving transistor in a low resistive manner to allow for high frequency driving thereof.

All other steps may be a same as described in FIG. 15, and the embodiment of FIGS. 19-20 may have all the features of the embodiment of FIGS. 13-14.

Figure 21:
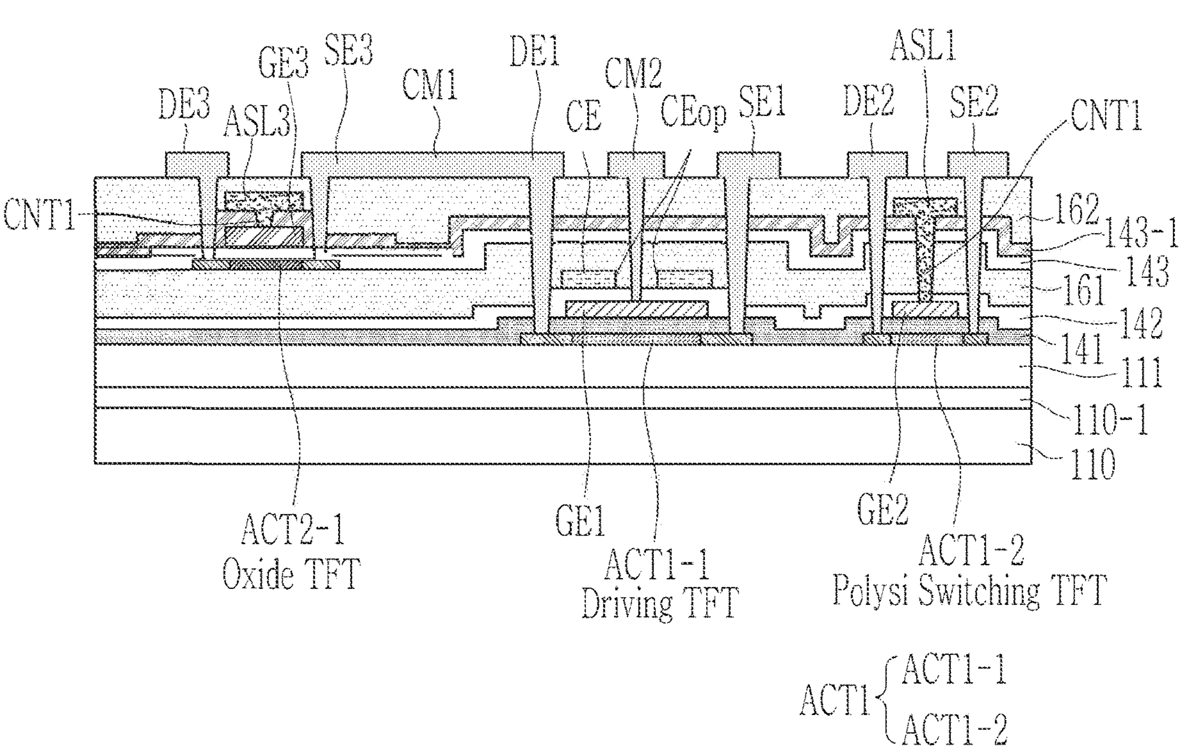
FIG. 21 is a schematic cross-sectional view of a part of a light emitting display device according to an embodiment.

Hereinafter, an embodiment of FIGS. 21-22 will be described in detail. FIG. 21 is a schematic cross-sectional view of a part of a light emitting display device according to an embodiment, and FIG. 22 schematically shows a manufacturing method of the light emitting display device according to the embodiment of FIG. 21.

Figure 22:
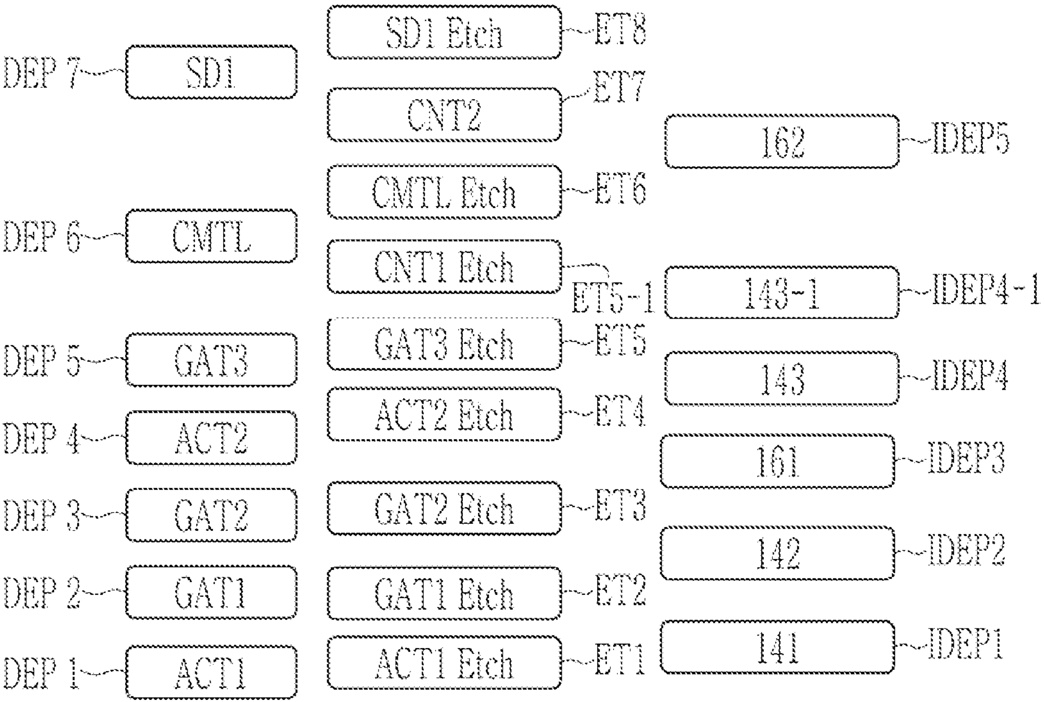
FIG. 22 schematically shows a manufacturing method of the light emitting display device according to the embodiment of FIG. 21.

Unlike the embodiment of FIG. 13, in an embodiment of FIGS. 21-22, an auxiliary conductive layer CMTL may be formed between a third gate conductive layer GAT3 and a first data conductive layer SD1, and two auxiliary signal lines ASL1 and ASL3 may be formed and respectively electrically connected to a gate electrode GE2 of a polycrystalline switching transistor and a gate electrode GE3 of an oxide switching transistor.

The embodiment of FIG. 21 will be described in detail, and some of the overlapping contents described in FIGS. 13 and 15 may be omitted. Referring to FIG. 21, a substrate 110, a barrier layer 110-1, and a buffer layer 111 may be sequentially formed. Depending on embodiments, the barrier layer 110-1 may be omitted. A buffer layer 111 may be disposed on the barrier layer 110-1. The buffer layer 111 may serve to block penetration of impurity elements into a first semiconductor layer ACT1. Depending on embodiments, a metal layer BML (refer to FIG. 25) may be formed between the barrier layer 110-1 and the buffer layer 111.

A first semiconductor layer ACT1 comprised of polycrystalline semiconductor (P-Si) may be disposed on the buffer layer 111. In FIG. 19, the first semiconductor layer ACT1 may be divided into a first semiconductor ACT1-1 of a driving transistor and a semiconductor pattern ACT1-2 of a polycrystalline switching transistor. Here, the polycrystalline switching transistor may be one of the second transistor T2, the fifth transistor T5, the sixth transistor T6, and the seventh transistor T7 of FIG. 12. Each semiconductor patterns ACT1-1 and ACT1-2 include a channel, and a first area and a second area disposed on both sides of the channel, the first area and the second area being conductive due to a plasma treatment or a doping process, and serves as a first electrode and a second electrode of a polycrystalline transistor respectively.

A first gate insulation layer 141 may be disposed on the first semiconductor layer ACT1. A first gate conductive layer GAT1 including gate electrodes GE1 and GE2 of the polycrystalline transistor may be disposed on the first gate insulation layer 141. The first gate conductive layer GAT1 may be divided into the gate electrode GE1 of driving transistor and the gate electrode GE2 of polycrystalline switching transistor. Here, the gate electrode GE1 of the driving transistor and the gate electrode GE2 of the polycrystalline switching transistor may be comprised of molybdenum (Mo) and may be a single layer or multiple layers. In an embodiment, the gate electrode GE1 of the driving transistor and the gate electrode GE2 of the polycrystalline switching transistor may be a single layer of comprised of molybdenum (Mo). Here, the molybdenum (Mo) gate electrodes GE1 and GE2 of the driving transistor and polycrystalline switching transistor respectively each have a feature that dehydrogenation occurs readily such that the characteristics of the driving transistor and the polycrystalline switching transistor may be constant as shown in FIG. 16, and it may be possible to generate a constant output current by making the characteristics of the driving transistor and polycrystalline switching transistor constant.

After forming the first gate conductive layer GAT1, an exposed area of the first semiconductor layer ACT1 may be made conductive by performing a plasma treatment or doping process. For example, portions of the first semiconductor layer ACT1 covered by the first gate conductive layer GAT1 may remain non-conductive, and portions of the first semiconductor layer ACT1 not covered by the first gate conductive layer GAT1 may have the same electrical properties as a conductor.

A second gate insulation layer 142 may be disposed on the first gate conductive layer GAT1 and the first gate insulation layer 141. A second gate conductive layer GAT2 including an upper electrode CE of the storage capacitor Cst may be disposed on the second gate insulation layer 142. The upper electrode CE of the storage capacitor Cst overlaps the gate electrode GE1 of the driving transistor to form a storage capacitor Cst. Also, an opening CEop is disposed in upper electrode CE at a location that overlaps a portion of the gate electrode GE1 of the driving transistor. Depending on embodiments, the second gate conductive layer GAT2 may further include a scan line, a control line, a voltage line, or a combination thereof. The second gate conductive layer GAT2 may include a metal such as copper (Cu), molybdenum (Mo), aluminum (Al), titanium (Ti), the like, a metal alloy thereof, or a combination thereof, and may be a single layer or multiple layers, and in an embodiment, the second gate conductive layer GAT2 may be a single layer comprised of molybdenum (Mo).

A first interlayer insulation layer 161 may be disposed on the second gate conductive layer GAT2. A second semiconductor layer (oxide semiconductor layer) ACT2 including an oxide semiconductor pattern ACT2-1 may include a channel, a first area, and a second area of an oxide transistor that may be disposed on the first interlayer insulation layer 161.

A third gate insulation layer 143 may be disposed on the oxide semiconductor pattern ACT2-1. The third gate insulation layer 143 may be disposed on the entire surface of the oxide semiconductor pattern ACT2-1 and the first interlayer insulation layer 161.

A third gate conductive layer GAT3 including a gate electrode GE3 of an oxide transistor may be disposed on the third gate insulation layer 143. The gate electrode GE3 of the oxide transistor may overlap the channel. The third gate conductive layer GAT3 may further include a scan line, a control line, or both. The third gate conductive layer GAT3 may include a metal such as copper (Cu), molybdenum (Mo), aluminum (Al), titanium (Ti), the like, a metal alloy thereof, or a combination thereof, and may be a single layer or multiple layers, and in an embodiment, the third gate conductive layer may be a single layer comprised of molybdenum (Mo).

After forming the third gate conductive layer GAT3, an exposed portion of the semiconductor pattern ACT2-1 may be made conductive by performing a plasma treatment or doping process. For example, portions of the semiconductor pattern ACT2-1 covered by the third gate conductive layer GAT3 may remain non-conductive, while portions of the semiconductor pattern ACT2-1 not covered by the third gate conductive layer GAT3 may have electrical properties similar to that of a conductor.

An auxiliary third gate insulation layer 143-1 may be disposed on the third gate conductive layer GAT3. The auxiliary third gate insulation layer 143-1 may include an inorganic insulation layer including a silicon oxide (SiOx), a silicon nitride (SiNx), a silicon oxynitride ($SiO_xN_y$), or a combination thereof.

An auxiliary conductive layer CMTL including two auxiliary signal lines ASL1 and ASL3 may be disposed on the auxiliary third gate insulation layer 143-1. The two auxiliary signal lines ASL1 and ASL3 may be electrically connected to the gate electrode GE2 of the polycrystalline switching transistor and the gate electrode GE3 of the oxide switching transistor, respectively. Specifically, the auxiliary signal line ASL1 may be electrically connected to the gate electrode GE2 of the polycrystalline switching transistor through a contact hole disposed in the second gate insulation layer 142, the first interlayer insulation layer 161, the third gate insulation layer 143, and the auxiliary third gate insulation layer 143-1. Auxiliary signal line ASL3 (hereinafter also referred to as an auxiliary signal line for oxide transistor) may be electrically connected to the gate electrode GE3 of the oxide switching transistor through the contact hole disposed on the auxiliary third gate insulation layer 143-1. The auxiliary signal lines ASL1 and ASL3 include a low-resistance material such as aluminum (Al), copper (Cu), or both, and the auxiliary signal lines ASL1 and ASL3 according to the embodiment may be a two-layered structure that includes a lower layer comprised of aluminum (Al) and an upper layer comprised of titanium (Ti). Referring to FIGS. 18A and 18B, in the case of molybdenum (Mo) being used as a gate electrode in a thin film transistor, there may be a disadvantage in that signal delay occurs in case that it is driven at about 240 Hz. Therefore in FIG. 21, auxiliary signal lines ASL1 and ASL3 comprised of a low-resistance material such as aluminum or copper may be electrically connected to the gate electrode GE2 of the polycrystalline switching transistor and the gate electrode GE3 of the oxide switching transistor, respectively such that a scan signal having a sufficient voltage value may be transmitted even when driving at a high speed of about 240 Hz, and a problem of delay due to resistance does not occur.

A second interlayer insulation layer 162 may be disposed on the auxiliary conductive layer CMTL. The second interlayer insulation layer 162 may have a single layer or multi-layer structure.

A first data conductive layer SD1 including a connection electrode that can be electrically connected to the first area and the second area of each polycrystalline transistor and the oxide transistor may be disposed on the second interlayer insulation layer 162. In FIG. 21, the first data conductive layer SD1 includes a connection electrode SE1 electrically connected to the first area of the driving transistor, a connection electrode DE1 electrically connected to the second area of the driving transistor, a connection electrode CM2 electrically connected to the gate electrode GE1 of the driving transistor, connection electrodes SE2 and DE2 electrically connected to the first and second areas respectively of the polycrystalline switching transistor, and connection electrodes SE3 and DE3 electrically connected to the first and second areas respectively of the oxide switching transistor, and the connection electrode SE3 electrically connected to the first area of the oxide switching transistor and the connection electrode DE1 electrically connected to the second area of the driving transistor may have a structure in which they may be integral with each other.

An organic layer may be disposed on the first data conductive layer SD1, and an anode may be disposed on the organic layer. A structure above the first data conductive layer SD1 will be described with reference to FIG. 25. Hereinabove, the cross-section structure was described, and a plan view may have a same structure as shown in FIG. 14.

The structure of FIG. 21 may be formed by a manufacturing method shown in FIG. 22. In FIG. 22, a manufacturing method may be divided into lamination of the semiconductor or the conductor steps (DEP1 to DEPT), etching steps (ET1 to ET8), and lamination of the insulation layer steps (IDEP1 to IDEP5) may be shown, and a step located in a lower position of FIG. 22 occurs first.

Specifically, in the manufacturing method of FIG. 22, the first semiconductor ACT1 may be laminated (DEP1), the first semiconductor ACT1 may be etched (ET1), and the first gate insulation layer 141 may be laminated (IDEP1).

A first gate conductive layer GAT1 may be laminated (DEP2), the first gate conductive layer GAT1 may be etched (ET2), and a second gate insulation layer 142 may be laminated (IDEP2). Here, the gate electrode GE1 of the driving transistor and the gate electrode GE2 of the polycrystalline switching transistor included in the first gate conductive layer GAT1 may be comprised of a same material which may be molybdenum (Mo).

The second gate conductive layer GAT2 may be laminated (DEP3), the second gate conductive layer GAT2 may be etched (ET3), and the first interlayer insulation layer 161 may be laminated (IDEP3). Here, the second gate conductive layer GAT2 may include various metals, and the second gate conductive layer GAT2 according to an embodiment may be comprised of molybdenum (Mo).

Thereafter, the second semiconductor ACT2 may be laminated (DEP4), the second semiconductor ACT2 may be etched (ET4), and the third gate insulation layer 143 may be laminated (IDEP4). The third gate conductive layer GAT3 may be laminated (DEP5), the third gate conductive layer GAT3 may be etched (ET5), and the auxiliary third gate insulation layer 143-1 may be laminated (IDEP4-1). Here, the third gate conductive layer GAT3 may include various metals and may be a single layer comprised of molybdenum (Mo).

A contact hole CNT1 disposed in at least some of the second gate insulation layer 142, the first interlayer insulation layer 161, the third gate insulation layer 143, and the auxiliary third gate insulation layer 143-1 may be formed (ET5-1). The gate electrode GE2 of the polycrystalline switching transistor and the gate electrode GE3 of the oxide switching transistor can be exposed by the contact hole CNT1, respectively.

The auxiliary conductive layer CMTL may be laminated (DEP6), the auxiliary conductive layer CMTL may be etched (ET6), and the second interlayer insulation layer 162 may be laminated (IDEP5). Here, the auxiliary conductive layer CMTL may include a low-resistance metal, and may be a two-layered structure where a lower layer may be comprised of aluminum (Al) and an upper layer may be comprised of titanium (Ti).

A contact hole CNT2 may be formed in at least one of the first gate insulation layer 141, the second gate insulation layer 142, the first interlayer insulation layer 161, the third gate insulation layer 143, the auxiliary third gate insulation layer 143-1, and the second interlayer insulation layer 162 (ET7). Here, the contact hole CNT2 may be divided into two types of contact holes. The first type of contact hole may be a contact hole that exposes the first semiconductor ACT1, the first gate conductive layer GAT1, and the second gate conductive layer GAT2, and the second type of contact hole may be a contact hole that exposes the second semiconductor ACT2, the third gate conductive layer GAT3, and the auxiliary conductive layer CMTL. Depending on embodiments, the first type of contact hole and the second type of contact hole may be formed in different processes. After that, the first data conductive layer SD1 may be laminated (DEPT) and the first data conductive layer SD1 may be etched (ET8).

A structure of an upper portion of the first data conductive layer SD1 will be described later with reference to FIG. 25. In the embodiment of FIGS. 21 and 22, the gate electrode GE1 of the driving transistor T1, which may be one of the polycrystalline transistors, may be comprised of molybdenum (Mo) to facilitate dehydrogenation, and the gate electrode of at least one of the switching transistors may also be comprised of molybdenum (Mo), and an auxiliary signal line ASL1 comprising a material having low resistance may be formed to thereby prevent a problem of signal delay and charge rate reduction from occurring even in the case where it is driven at high speed of about 240 Hz. In the embodiment, aluminum (Al), copper (Cu), or a combination thereof may be used as a material having low resistance.

Figure 23:
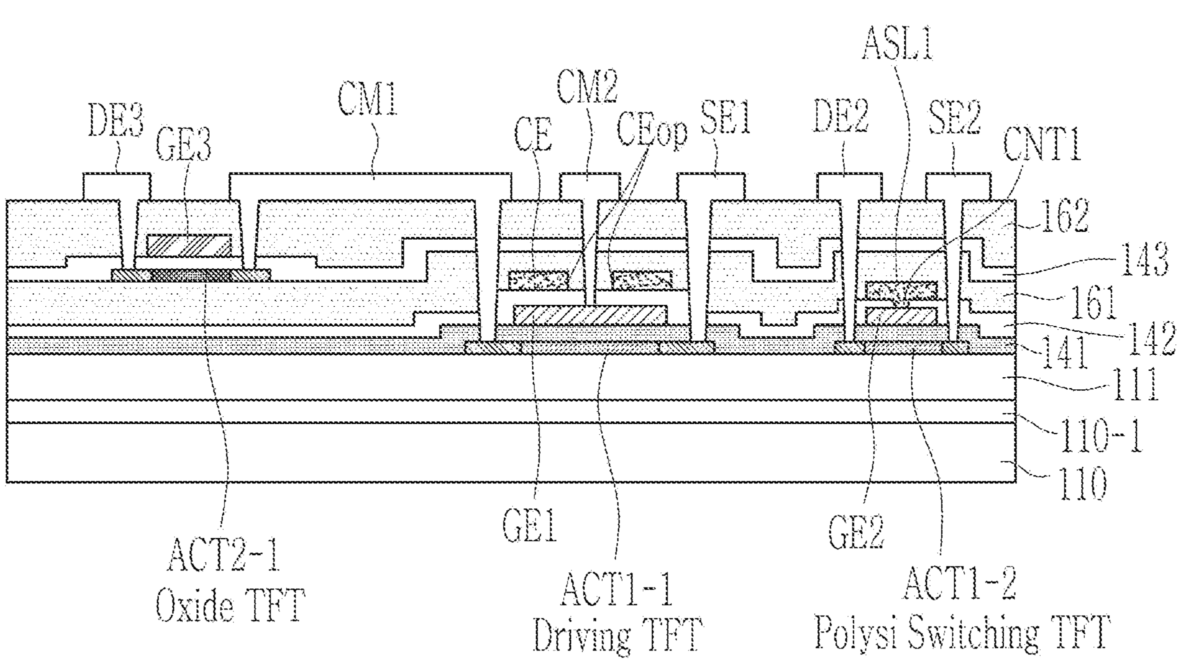
FIG. 23 is a schematic cross-sectional view of a part of a light emitting display device according to an embodiment.

Hereinafter, an embodiment of FIGS. 23 and 24 will be described in detail, and some of the overlapping contents described with reference to FIGS. 13 and 15 may be omitted. FIG. 23 is a schematic cross-sectional view of a part of a light emitting display device according to an embodiment, and FIG. 24 schematically shows a manufacturing method of the light emitting display device according to the embodiment of FIG. 23.

Figure 24:
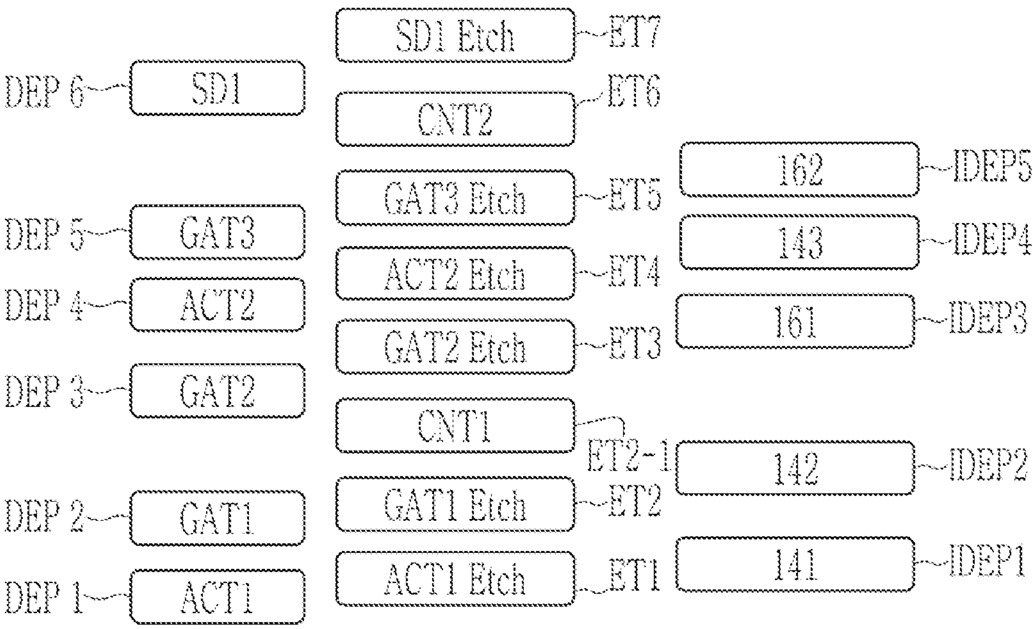
FIG. 24 schematically shows a manufacturing method of the light emitting display device according to the embodiment of FIG. 23.

Unlike the embodiment of FIG. 13, in the embodiment of FIGS. 23 and 24, an auxiliary conductive layer CMTL may not be formed, a second gate conductive layer GAT2 may be formed to contain a low-resistance material, and an auxiliary signal line ASL1 may be formed from the second gate conductive layer GAT2 and be electrically connected to a gate electrode GE2 of polycrystalline switching transistor. The embodiment of FIGS. 23 and 24 may be an embodiment where copper (Cu) is used as a low-resistance material.

Referring to FIG. 23, a substrate 110, a barrier layer 110-1, and a buffer layer 111 may be sequentially formed. Depending on embodiments, the barrier layer 110-1 may be omitted. Buffer layer 111 may be disposed on the barrier layer 110-1. The buffer layer 111 may serve to block penetration of impurity elements into a first semiconductor layer ACT. Depending on embodiments, a metal layer BML (refer to FIG. 25) may be formed between the barrier layer 110-1 and the buffer layer 111.

A first semiconductor layer ACT1 comprised of polycrystalline semiconductor (P-Si) may be disposed on the buffer layer 111. In FIG. 23, the first semiconductor layer ACT1 may be divided into a semiconductor pattern ACT1-1 of a driving transistor and a semiconductor pattern ACT1-2 of a polycrystalline switching transistor. Here, the polycrystalline switching transistor may be one of the second transistor T2, the fifth transistor T5, the sixth transistor T6, and the seventh transistor T7 of FIG. 12. Each of the patterns ACT1-1 and ACT1-2 includes a channel, and a first area and a second area disposed on both sides of the channel, and the first area and second area have a conductive electrical properties due to a plasma treatment or a doping treatment, and serves as a first electrode and a second electrode of a polycrystalline transistor.

A first gate insulation layer 141 may be disposed on the first semiconductor layer ACT1. A first gate conductive layer GAT1 including gate electrodes GE1 and GE2 of the driving transistor and the polycrystalline switching transistor respectively may be disposed on the first gate insulation layer 141. The first gate conductive layer GAT1 may be divided into the gate electrode GE1 of driving transistor and the gate electrode GE2 of polycrystalline switching transistor.

The gate electrode GE1 of the driving transistor and the gate electrode GE2 of the polycrystalline switching transistor according to the embodiment of FIG. 23 may be disposed on a same layer (first gate insulation layer 141) and comprised of a same material. For example, the gate electrode GE1 of the driving transistor and the gate electrode GE2 of the polycrystalline switching transistor may be comprised of molybdenum (Mo) and may be formed as a single layer or multiple layers. In the embodiment, the gate electrode GE1 of the driving transistor and the gate electrode GE2 of the polycrystalline switching transistor may be a single layer of comprised molybdenum (Mo). Here, the molybdenum (Mo) gate electrodes GE1 and GE2 of the driving transistor and polycrystalline switching transistor respectively have a feature that dehydrogenation occurs readily during manufacturing such that the characteristics of both driving transistors may be constant as shown in FIG. 4, and it may be possible to generate a constant output current by making the characteristics of the transistors constant.

After forming the first gate conductive layer GAT1, exposed portions of the first semiconductor layer ACT1 may be made conductive by performing a plasma treatment or a doping process. For example, portions of the first semiconductor layer ACT1 covered by the first gate conductive layer GAT1 may remain non-conductive, and portions of the first semiconductor layer ACT1 not covered by the first gate conductive layer GAT1 may have electrical properties similar to that of a conductor.

A second gate insulation layer 142 may be disposed on the first gate conductive layer GAT1 and on the first gate insulation layer 141. A second gate conductive layer GAT2 including an upper electrode CE of the storage capacitor Cst and an auxiliary signal line ASL1 may be disposed on the second gate insulation layer 142. Upper electrode CE of the storage capacitor Cst overlaps the gate electrode GE1 of the driving transistor to form a storage capacitor Cst, and an opening CEop may be disposed in upper electrode CE overlapping a portion of the gate electrode GE1 of the driving transistor. The auxiliary signal line ASL1 may be electrically connected to the gate electrode GE2 of the polycrystalline switching transistor through a contact hole disposed in the second gate insulation layer 142. Depending on embodiments, the second gate conductive layer GAT2 may further include a scan line, a control line, a voltage line, or a combination thereof. The second gate conductive layer GAT2 includes a low-resistance material such as aluminum (Al), copper (Cu), or both, the auxiliary signal line ASL1, upper electrode CE of storage capacitor Cst, and the second gate conductive layer GAT2 according to the embodiment may be a two-layered structure that includes a lower layer comprised of copper (Cu) and an upper layer comprised of titanium (Ti). Referring to FIGS. 18A and 18B, in the case of molybdenum (Mo) being used as an electrode, there may be a disadvantage that signal delay occurs when driven at about 240 Hz. Therefore in FIG. 23, auxiliary signal line ASL1 may be included, the auxiliary signal line ASL1 may be electrically connected to the gate electrode GE2 of the polycrystalline switching transistor the auxiliary signal line ASL1 comprising a metal having low resistance such that a scan signal having a sufficient voltage value may be transmitted even when driving at a high speed of about 240 Hz, and a problem of delay due to resistance does not occur.

A first interlayer insulation layer 161 may be disposed on the second conductive layer GAT2. A second semiconductor layer (oxide semiconductor layer) ACT2 including oxide semiconductor pattern ACT2-1 including a channel, a first area, and a second area may be disposed on the first interlayer insulation layer 161. A third gate insulation layer 143 may be disposed on the oxide semiconductor pattern ACT2-1. The third gate insulation layer 143 may be disposed on the entire surface of the oxide semiconductor pattern ACT2-1 and first interlayer insulation layer 161.

A third gate conductive layer GAT3 including a gate electrode GE3 of an oxide transistor may be disposed on the third gate insulation layer 143. The gate electrode GE3 of the oxide transistor may overlap the channel. The third gate conductive layer GAT3 may further include a scan line, a control line, or both. The third gate conductive layer GAT3 may include a metal such as copper (Cu), molybdenum (Mo), aluminum (Al), or titanium (Ti), a metal alloy thereof, or both, and may be a single layer or multiple layers. The third gate conductive layer GAT3 according to an embodiment may be a single layer comprised of molybdenum (Mo).

After forming the third gate conductive layer GAT3, an exposed area of the oxide semiconductor pattern ACT2-1 may be made conductive by performing a plasma treatment or a doping process. For example, portions of the oxide semiconductor pattern ACT2-1 covered by gate electrode GE3 may remain non-conductive, and portions of the oxide semiconductor pattern ACT2-1 not covered by gate electrode GE3 may have a same electrical properties as a conductor.

A second interlayer insulation layer 162 may be disposed on the gate electrode GE3. The second interlayer insulation layer 162 may be a single layer or a multi-layer structure. A first data conductive layer SD1 including a connection electrode that can be electrically connected to a first area and a second area of each of the polycrystalline transistors and the oxide transistor may be disposed on the second interlayer insulation layer 162. In FIG. 23, the first data conductive layer SD1 includes a connection electrode SE1 electrically connected to the first area of the driving transistor, a connection electrode DE1 electrically connected to the second area of the driving transistor, a connection electrode CM2 electrically connected to the gate electrode of the driving transistor, connection electrodes SE2 and DE2 respectively electrically connected to the first area and the second area of the polycrystalline switching transistor, and connection electrodes SE3 and DE3 respectively electrically connected to the first area and the second area of the oxide switching transistor, the connection electrode SE3 electrically connected to the first area of the oxide switching transistor and the connection electrode DE1 electrically connected to the second area of the driving transistor may be integral with each other to form the connection electrode CM1.

An organic layer may be disposed on the first data conductive layer SD1, and an anode can be disposed on the organic layer. The above-stated structure of the first data conductive layer SD1 will be described later with reference to FIG. 25.

Hereinabove, the cross-section structure has been described, and a plan view may have a same structure as shown in FIG. 14.

The structure of FIG. 23 may be formed using a manufacturing method of FIG. 24. In FIG. 24, semiconductor or conductor lamination steps DEP1 to DEP6, etching steps ET1 to ET7, and insulating film lamination steps IDEP1 to IDEP5 are shown, and the steps located at the lower portion of FIG. 24 occur first.

Specifically, according to the manufacturing method of FIG. 24, the first semiconductor layer ACT1 may be laminated (DEP1), the first semiconductor layer ACT1 may be etched (ET1), and the first gate insulation layer 141 may be laminated.

The first gate conductive layer GAT1 may be laminated (DEP2), the first gate conductive layer GAT1 may be etched (ET2), and the second gate insulation layer 142 may be laminated (IDEP2). Here, the gate electrode GE1 of the driving transistor and the gate electrode GE2 of the polycrystalline switching transistor may both be formed from first gate conductive layer GAT1, be both comprised of a same material and may both be comprised of molybdenum (Mo).

An auxiliary contact hole CNT1 may be formed in the second gate insulation layer 142 (ET2-1). The gate electrode GE2 of the polycrystalline switching transistor may be exposed by the auxiliary contact hole CNT1.

The second gate conductive layer GAT2 may be laminated (DEP3), the second gate conductive layer GAT2 may be etched (ET3), and the first interlayer insulation layer 161 may be laminated (IDEP3). Here, the second gate conductive layer GAT2 may include a low-resistance metal, and the second gate conductive layer GAT2 may be a two-layered structure that includes a lower layer comprised of copper (Cu) and an upper layer comprised of titanium (Ti).

The second semiconductor layer ACT2 may be laminated (DEP4), the second semiconductor layer ACT2 may be etched (ET4), and a third gate insulation layer 143 may be laminated (IDEP4). The third gate conductive layer GAT3 may be laminated (DEP5), the third gate conductive layer GAT3 may be etched (ET5), and the second interlayer insulation layer 162 may be laminated (IDEP5). Here, the third gate conductive layer GAT3 may include various metals. The third gate conductive layer GAT3 may be a single layer comprised of molybdenum (Mo).

A contact hole CNT2 may be formed in at least one of the first gate insulation layer 141, the second gate insulation layer 142, the first interlayer insulation layer 161, the third gate insulation layer 143, and the second interlayer insulation layer 162 (ET6). The contact hole CNT2 may be divided into a first type and a second type. The first type of contact hole may expose portions of the first semiconductor layer ACT1, and the first gate conductive layer GAT1, the second gate conductive layer GAT2. The second type of contact hole may expose the oxide semiconductor pattern ACT2-1 and the third gate conductive layer GAT3. Depending on embodiments, the first type of contact hole and the second type of contact hole may be formed in different processes.

The first data conductive layer SD1 may be laminated (DEP6) and the first data conductive layer SD1 may be etched (ET7). An upper structure of the first data conductive layer SD1 will be described later with reference to FIG. 25.

In the embodiment of FIGS. 23-24, the gate electrode GE1 of the driving transistor T1, which may be one of the polycrystalline transistors, may be comprised of molybdenum (Mo) to facilitate dehydrogenation, and the gate electrode of at least one of the switching transistors may also be comprised of molybdenum (Mo), but may be electrically connected to an auxiliary signal line ASL1 comprised of a material having low resistance to prevent signal delay and charge rate reduction from occurring even when being driven at a high speed of about 240 Hz. In the embodiment, aluminum (Al), copper (Cu), or a combination thereof may be used as a material for auxiliary signal line ASL1 to have a low resistance.

Hereinabove, various variations of the embodiment have been described. Hereinafter, the entire cross-sectional structure of the light emitting display device according to the embodiment will be described.

Figure 25:
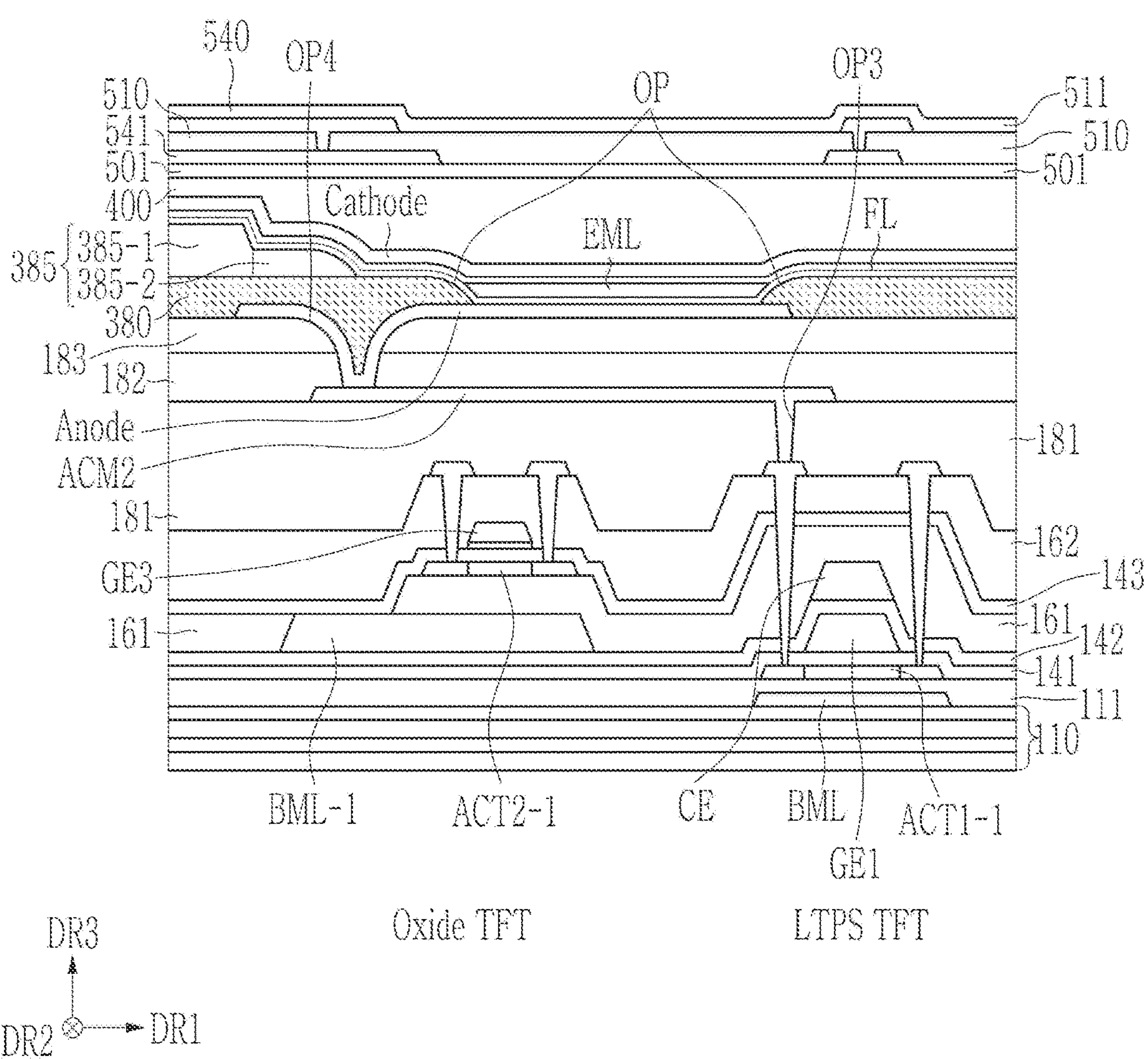
FIG. 25 is a schematic cross-sectional structure of the light emitting display device according to the embodiment.

FIG. 25 is a schematic cross-sectional structure of the light emitting display device according to the embodiment. In FIG. 25, only the polycrystalline transistor illustrated is driving transistor T1, and may be shown based on the embodiment of FIG. 13. However, embodiments of FIGS. 19, 21 and 23, and variations may also be applied in a same way. The overall structure of the light emitting display device will now be described.

The light emitting display device may be largely divided into a lower panel layer and an upper panel layer, and the lower panel layer may in turn be divided into the light emitting diode and the pixel circuit portion. The encapsulation layer 400 may separate the lower panel portion from the upper panel portion. Here, the pixel circuit portion includes the second organic layer 182 and the third organic layer 183, and denotes a lower configuration, and the light emitting diode denotes a configuration disposed above the third organic layer 183 and below the encapsulation layer 400. A structure disposed on the encapsulation layer 400 may correspond to the upper panel layer, and may further include a color filter or a color conversion layer depending on embodiments. Depending on embodiments, the third organic layer 183 may be omitted.

Referring to FIG. 25, the metal layer BML may be disposed on substrate 110. The substrate 110 may include a material that has rigid characteristics that does not bend such as glass or may include a flexible material that can bend, such as plastic, polyimide, or a combination thereof. In the case of the flexible substrate as shown in FIG. 25, the substrate 110 may have a two-layered structure of polyimide and a barrier layer comprised of an inorganic insulation material thereon.

The metal layer BML may be disposed to correspond to the channel of semiconductor pattern ACT1-1 of the driving transistor T1 in a plan view, and may also be referred to as a lower shielding layer. The metal layer BML may include a metal such as copper (Cu), molybdenum (Mo), aluminum (Al), titanium (Ti), a metal alloy thereof, or a combination thereof. Here, the driving transistor T1 may refer to a transistor that generates a current transmitted to the light emitting diode.

The buffer layer 111 may be disposed on the substrate 110 and the metal layer BML to cover them. The buffer layer 111 serves to block penetration of impurity elements into the semiconductor pattern ACT1-1, and may be an inorganic insulation layer including a silicon oxide (SiOx), a silicon nitride (SiNx), a silicon oxynitride ($SiO_xN_y$), or a combination thereof.

A semiconductor pattern ACT1-1 comprised of a silicon semiconductor (e.g., polycrystalline semiconductor (P-Si)) may be disposed on the buffer layer 111. The semiconductor pattern ACT1-1 is polycrystalline silicon and includes a channel, and a first area and a second area disposed on both sides of the channel.

Here, the polycrystalline transistor may include multiple polycrystalline switching transistors as well as a driving transistor. A region of semiconductor pattern ACT1-1 may have conductive electrical properties due to a plasma treatment or a doping process. The conductive regions may be disposed on both sides of the channel of semiconductor pattern ACTT-1 such that they may serve as a first electrode and a second electrode of the transistor.

A first gate insulation layer 141 may be disposed on the semiconductor pattern ACT1-1. The first gate insulation layer 141 may be an inorganic insulation layer including a silicon oxide (SiOx), a silicon nitride (SiNx), a silicon oxynitride ($SiO_xN_y$), or a combination thereof.

A first gate conductive layer GAT1 including a gate electrode GE1 of a polycrystalline transistor may be disposed on the first gate insulation layer 141. In the first gate conductive layer GAT1, a scan line or a light emission control line may be formed in addition to the gate electrode GE1 of the polycrystalline transistor. Here, the first gate conductive layer GAT1 may be comprised of molybdenum (Mo), and depending on embodiments may be a single layer comprised of molybdenum (Mo).

After forming the first gate conductive layer GAT1, an exposed portion of the semiconductor pattern ACT1-1 may be made conductive by performing a plasma treatment or a doping process. Meanwhile, portions of the semiconductor pattern ACT1-1 covered by the first gate conductive layer GAT1 may remain non-conductive, and portions of the semiconductor pattern ACT1-1 not covered by the first gate conductive layer GAT1 may have electrical properties similar to that of a conductor.

A second gate insulation layer 142 may be disposed on the first gate conductive layer GAT1 and the first gate insulation layer 141. The second gate insulation layer 142 may be an inorganic insulation layer including a silicon oxide (SiOx), a silicon nitride (SiNx), a silicon oxynitride ($SiO_xN_y$), or a combination thereof.

A second gate conductive layer GAT2 including an upper electrode CE of the storage capacitor Cst may be disposed on the second gate insulation layer 142. Upper electrode CE of the storage capacitor Cst overlaps the gate electrode GE1 of the driving transistor to form the storage capacitor Cst.

Depending on embodiments, the second gate conductive layer GAT2 may further include a lower shielding layer BML-1 at a location that corresponds to the oxide transistor. In case that the auxiliary conductive layer CMTL may be formed as in the embodiment of FIGS. 19-20, the lower shielding layer BML-1 of the oxide transistor may be formed from the auxiliary conductive layer CMLT. The lower shielding layer BML-1 of the oxide transistor may be disposed below the channel of the oxide transistor and may serve to shield the channel region of semiconductor pattern ACT2-1 from light or electromagnetic interference (EMI) from the lower side.

Depending on embodiments, the second gate conductive layer GAT2 may further include a scan line, a control line, a voltage line, or a combination thereof. The second gate conductive layer GAT2 may include a metal such as copper (Cu), molybdenum (Mo), aluminum (Al), titanium (Ti), a metal alloy thereof, or a combination thereof, and may be a single layer or multiple layers.

A first interlayer insulation layer 161 may be disposed on the second gate conductive layer GAT2. The first interlayer insulation layer 161 may include an inorganic insulation layer including a silicon oxide (SiOx), a silicon nitride (SiNx), a silicon oxynitride ($SiO_xN_y$), the like, or a combination thereof, and depending on embodiments, the inorganic insulation material may be formed to be thick.

A second semiconductor layer (oxide semiconductor layer) ACT2 including an oxide semiconductor pattern ACT2-1 including a channel, a first area, and a second area may be disposed on the first interlayer insulation layer 161. A third gate insulation layer 143 may be disposed on the oxide semiconductor pattern ACT2-1. The third gate insulation layer 143 may be disposed on the entire surface of the oxide semiconductor pattern ACT2-1 and the first interlayer insulation layer 161. The third gate insulation layer 143 may include an inorganic insulation layer including a silicon oxide (SiOx), a silicon nitride (SiNx), a silicon oxynitride ($SiO_xN_y$), or a combination thereof.

A third gate conductive layer GAT3 including the gate electrode GE3 of the oxide transistor may be disposed on the third gate insulation layer 143. The gate electrode GE3 of the oxide transistor may overlap the channel. The third gate conductive layer GAT3 may further include a scan line, a control line, or a combination thereof. The third gate conductive layer GAT3 may include a metal such as copper (Cu), molybdenum (Mo), aluminum (Al), titanium (Ti), a metal alloy thereof, or a combination thereof, and may be a single layer or multiple layers. Depending on embodiments, the third gate conductive layer GAT3 may be a single layer comprised of molybdenum (Mo).

A second interlayer insulation layer 162 may be disposed on the third gate conductive layer GAT3. The second interlayer insulation layer 162 may have a single layer or a multi-layer structure. The second interlayer insulation layer 162 may include an inorganic insulation material including a silicon oxide (SiOx), a silicon nitride (SiNx), a silicon oxynitride ($SiO_xN_y$), the like, or a combination thereof, and depending on embodiments, the second interlayer insulation layer 162 may include an organic material.

A first data conductive layer SD1, including a connection electrode that may be electrically connected to a first area and a second area of each of the polycrystalline transistor and the oxide transistor, may be disposed on the second interlayer insulation layer 162. The first data conductive layer SD1 may include a metal such as aluminum (Al), copper (Cu), molybdenum (Mo), titanium (Ti), a metal alloy thereof, or a combination thereof, and may be a single layer or multiple layers.

A first organic layer 181 may be disposed on the first data conductive layer SD1. The first organic layer 181 may be an organic insulator including an organic material, and the organic material may include at least one material selected from a group consisting of polyimide, polyamide, acryl resin, benzocyclobutene, phenol resin, and a combination thereof.

A second data conductive layer SD2 including an anode connection electrode ACM2 may be disposed on the first organic layer 181. The second data conductive layer may include a data line, a driving voltage line, or a combination thereof. The second data conductive layer may include a metal such as aluminum (Al), copper (Cu), molybdenum (Mo), titanium (Ti), a metal alloy thereof, or a combination thereof, and may be a single layer or multiple layers. The anode connection electrode ACM2 may be electrically connected to the first data conductive layer SD1 through the opening OP3 disposed on the first organic layer 181.

The second organic layer 182 and third organic layer 183 may be disposed on the second data conductive layer, and an opening OP4 for anode connection may be formed in the second organic layer 182 and the third organic layer 183. The anode connection electrode ACM2 may be electrically connected to the anode Anode through the opening OP4 for anode connection. The second organic layer 182 and the third organic layer 183 may be organic insulators and may include at least one material selected from a group consisting of polyimide, polyamide, acryl resin, benzocyclobutene, phenol resin, and a combination thereof. Depending on embodiments, the third organic layer 183 may be omitted.

A pixel definition layer 380 may be disposed on the anode Anode and may cover at least a part of the anode Anode while having an opening OP exposing other portions of the anode Anode. The pixel definition layer 380 may be a black pixel definition layer formed of a black organic material to prevent externally applied light from being reflected back to the outside, or may be comprised of a transparent organic material, depending on embodiments.

A spacer 385 may be disposed on the pixel definition layer 380. The spacer 385 may be comprised of a transparent organic insulation material. Depending on embodiments, the spacer 385 may be comprised of a positive type of transparent organic material. The spacer 385 may include two portions 385-1 and 385-2 with different heights. The higher portion 385-1 serves as a spacer, and the lower portion 385-2 may improve the adhesion characteristic between the spacer and the pixel definition layer 380.

The functional layers FL and the cathode Cathode may be sequentially formed on the anode Anode, the spacer 385, and the pixel definition layer 380. The functional layers FL and the cathode Cathode may be disposed throughout the entire region. The emission layer EML may be disposed between ones of the functional layers FL, and the emission layer EML may only be disposed within the opening OP of the pixel definition layer 380. Hereinafter, the combination of the functional layers FL and the emission layer EML may be referred to as an intermediate layer. The functional layers FL may include at least one auxiliary layer such as an electron injection layer, an electron transport layer, a hole transport layer, and a hole injection layer, or a combination thereof, and the hole injection layer and the hole transport layer may be disposed below the emission layer EML, and the electron transport layer and the electron injection layer may be disposed on the emission layer in a plan view.

The encapsulation layer 400 may be disposed on the cathode Cathode. The encapsulation layer 400 includes at least one inorganic layer and at least one organic layer, and may have a three-layer structure including a first inorganic encapsulation layer, an organic encapsulation layer, and a second inorganic encapsulation layer. The encapsulation layer 400 may be for protecting the emission layer EML from moisture or oxygen that may inflow from the outside. Depending on embodiments, the encapsulation layer 400 may include a structure in which an inorganic layer and an organic layer may be sequentially stacked on each other.

Sensing insulation layers 501, 510, and 511 and sensing electrodes 540 and 541 may be disposed on the encapsulation layer 400 for touch sensing. In the embodiment of FIG. 25, a touch may be sensed in a capacitive type touch sensor using two sensing electrodes 540 and 541.

Specifically, a first sensing insulation layer 501 may be formed on the encapsulation layer 400, and sensing electrodes 540 and 541 may be formed thereon. The sensing electrodes 540 and 541 may be insulated from each other by a second sensing insulation layer 510 interposed therebetween, and the sensing electrodes may be electrically connected through an opening disposed in the sensing insulation layer 510. Here, the sensing electrodes 540 and 541 may be comprised of metals or metal alloys such as aluminum (Al), copper (Cu), silver (Ag), gold (Au), molybdenum (Mo), titanium (Ti), tantalum (Ta), or a combination thereof, and may be a single layer or multiple layers. A third sensing insulation layer 511 may be formed on the sensing electrode 540.

Although no configuration may be shown on the third sensing insulation layer 511 in FIG. 25, a film including a polarizing plate may be attached thereon to reduce reflection of external light, or a color filter or color conversion layer may be further attached thereon to improve color quality. A light blocking layer may be disposed between the color filter and the color conversion layer. Depending on embodiments, a material that can absorb some wavelengths of external light (hereinafter referred to as a reflection control material) may be further included thereon. Depending on embodiments, the entire surface of the light emitting display device may be flattened by covering with an auxiliary organic layer (also referred to as a planarization layer).

In FIG. 25, an embodiment in which three organic layers 181, 182, and 183 may be formed, and openings for anode connection may be formed in the second organic layer and the third organic layer has been described. However, at least 13 organic layers may be formed, and an opening for anode connection may be disposed in an upper organic layer disposed away from the substrate, and a lower organic layer opening may be disposed in a lower organic layer.

Such a structure of FIG. 25 corresponds to the embodiment of FIGS. 13-14, but may be equally applied to FIGS. 19-24, which may be the variation examples, except for a modified portion.

While this disclosure has been described in connection with what is presently considered to be practical embodiments, it is to be understood that the invention may not be limited to the disclosed embodiments. On the contrary, it is intended to cover various modifications and equivalent arrangements included within the spirit and scope of the appended claims.

What is claimed is:

1. A light emitting display device comprising:

a first semiconductor layer that includes a semiconductor pattern of a driving transistor and a semiconductor pattern of a polycrystalline switching transistor;

a first gate conductive layer that includes a gate electrode of the driving transistor and a gate electrode of the polycrystalline switching transistor, the gate electrode of the driving transistor being disposed on a part of the semiconductor pattern of the driving transistor, the gate electrode of the polycrystalline switching transistor being disposed on a part of the semiconductor pattern of the polycrystalline switching transistor;

a second gate conductive layer disposed on a part of the gate electrode of the driving transistor, the second gate conductive layer includes an upper electrode of a storage capacitor, wherein an opening is disposed in the upper electrode of the storage capacitor;

a second semiconductor layer that includes an oxide semiconductor pattern of an oxide switching transistor; and a third gate conductive layer that includes a gate electrode of the oxide switching transistor disposed on a part of the oxide semiconductor pattern, wherein the gate electrode of the driving transistor and the gate electrode of the polycrystalline switching transistor are disposed on a same layer and are comprised of different materials.

2. The light emitting display device of claim 1, wherein the gate electrode of the driving transistor comprises molybdenum.

3. The light emitting display device of claim 2, wherein the gate electrode of the polycrystalline switching transistor comprises a low-resistive material.

4. The light emitting display device of claim 3, wherein:

the gate electrode of the polycrystalline switching transistor comprises:

a first layer that comprises aluminum; and a second layer disposed on the first layer, and the second layer comprises titanium.

5. The light emitting display device of claim 3, wherein:

the upper electrode of the storage capacitor comprises a first layer that comprises aluminum and a second layer disposed on the first layer that comprises titanium, and the upper electrode of the storage capacitor is disposed on the gate electrode of the driving transistor, the gate electrode of the driving transistor being a lower and opposite electrode of the storage capacitor.

6. The light emitting display device of claim 3, wherein the gate electrode of the oxide switching transistor comprises molybdenum.

7. The light emitting display device of claim 1, further comprising:

a first connection electrode electrically connecting the semiconductor pattern of the driving transistor to the oxide semiconductor pattern.

8. The light emitting display device of claim 7, further comprising:

a second connection electrode electrically connected to the gate electrode of the driving transistor.

* * * * *